US007911516B2

(12) United States Patent
Iijima et al.

(10) Patent No.: US 7,911,516 B2
(45) Date of Patent: Mar. 22, 2011

(54) CAMERA MODULE AND ELECTRONIC APPARATUS PROVIDED WITH IT

(75) Inventors: Tomokuni Iijima, Osaka (JP); Takashi Ishikawa, Osaka (JP); Ikuo Numai, Osaka (JP); Masahito Hayakawa, Osaka (JP); Aki Takai, Osaka (JP)

(73) Assignee: Panasonic Corporation, Osaka (JP)

( * ) Notice: Subject to any disclaimer, the term of this patent is extended or adjusted under 35 U.S.C. 154(b) by 797 days.

(21) Appl. No.: 11/576,119

(22) PCT Filed: Sep. 27, 2005

(86) PCT No.: PCT/JP2005/017762
§ 371 (c)(1),
(2), (4) Date: Aug. 24, 2007

(87) PCT Pub. No.: WO2006/035778
PCT Pub. Date: Apr. 6, 2006

(65) Prior Publication Data
US 2008/0259201 A1    Oct. 23, 2008

(30) Foreign Application Priority Data

Sep. 27, 2004  (JP) ................................ 2004-279794
Dec. 22, 2004  (JP) ................................ 2004-371849

(51) Int. Cl.
*H04N 5/247* (2006.01)
(52) U.S. Cl. .................... 348/264; 348/265; 359/618
(58) Field of Classification Search ........................ None
See application file for complete search history.

(56) References Cited

U.S. PATENT DOCUMENTS

| 5,220,441 | A  | * | 6/1993 | Gerstenberger | ............... | 358/487 |
| 6,519,358 | B1 | * | 2/2003 | Yokoyama et al. | ........... | 382/154 |
| 6,859,229 | B1 |   | 2/2005 | Suda | | |
| 2002/0122124 | A1 |   | 9/2002 | Suda | | |
| 2003/0071905 | A1 | * | 4/2003 | Yamasaki | ...................... | 348/239 |
| 2003/0086013 | A1 |   | 5/2003 | Aratani | | |
| 2004/0101162 | A1 | * | 5/2004 | Higaki et al. | .................. | 382/103 |
| 2005/0134712 | A1 | * | 6/2005 | Gruhlke et al. | ............... | 348/272 |

FOREIGN PATENT DOCUMENTS

| JP | 4-330411 | 11/1992 |
| JP | 7-220113 | 8/1995 |

(Continued)

*Primary Examiner* — Lin Ye
*Assistant Examiner* — Dennis Hogue
(74) *Attorney, Agent, or Firm* — Hamre, Schumann, Mueller & Larson, P.C.

(57) ABSTRACT

A camera module that can be made thinner and achieves a beautiful image over an entire image region regardless of a subject distance is provided. The camera module includes a plurality of lens portions, each including at least one lens, a plurality of imaging regions, provided in one-to-one correspondence with the plurality of lens portions, each including a light-receiving surface that is substantially orthogonal to an optical axis direction of its corresponding lens portion, an imaging signal input portion to which a plurality of imaging signals outputted respectively from the plurality of imaging regions are inputted, a block division portion for dividing at least one imaging signal of the plurality of imaging signals into a plurality of blocks, a parallax computing portion for computing for each of the blocks a parallax between images formed respectively by the plurality of lens portions using the imaging signal, and a parallax correcting portion for correcting the plurality of imaging signals based on the parallax and performing an image synthesis.

13 Claims, 47 Drawing Sheets

FOREIGN PATENT DOCUMENTS

| | | |
|---|---|---|
| JP | 2001-78213 | 3/2001 |
| JP | 2001-116513 | 4/2001 |
| JP | 2001-175863 | 6/2001 |
| JP | 2002-204462 | 7/2002 |
| JP | 2002-320133 | 10/2002 |
| JP | 2002-330332 | 11/2002 |
| JP | 2003-67782 | 3/2003 |
| JP | 2003-143459 | 5/2003 |

* cited by examiner

FIG. 31A

| $B_0$ $F_0=1$ | $B_1$ $F_1=2$ |
|---|---|
| $B_2$ $F_2=3$ | $B_3$ $F_3=1$ |

FIG. 31B

| $B_0$ | | $B_1$ |
| --- | --- | --- |
| $B_2$ | $B_4$ | $B_3$ |
| $B_5$ | $B_6$ | |

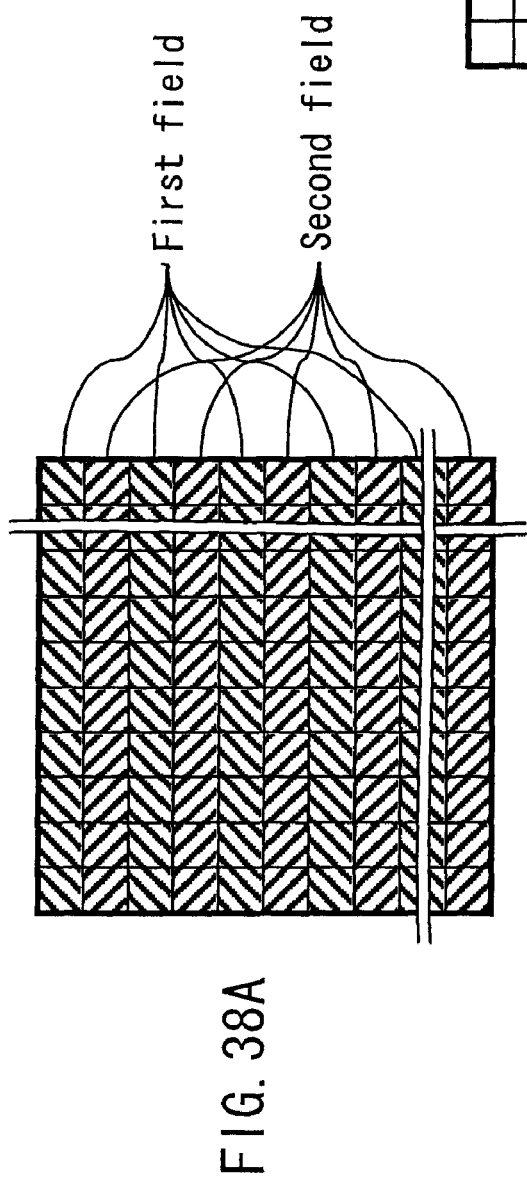
FIG. 38A
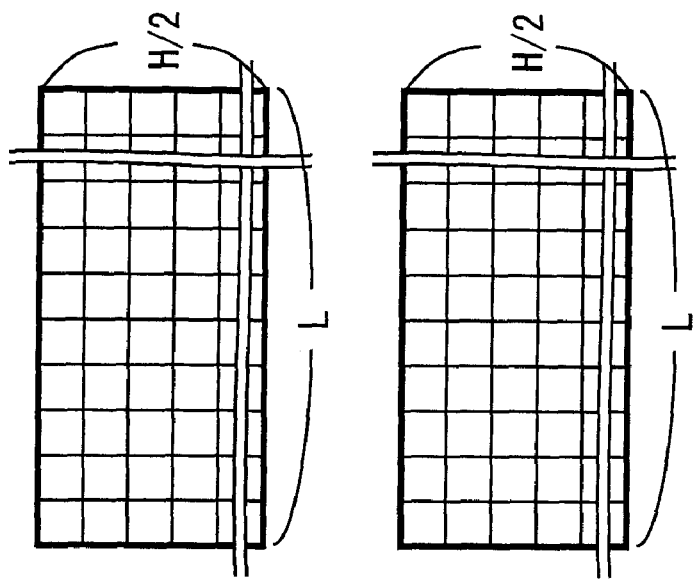
FIG. 38C
FIG. 38D
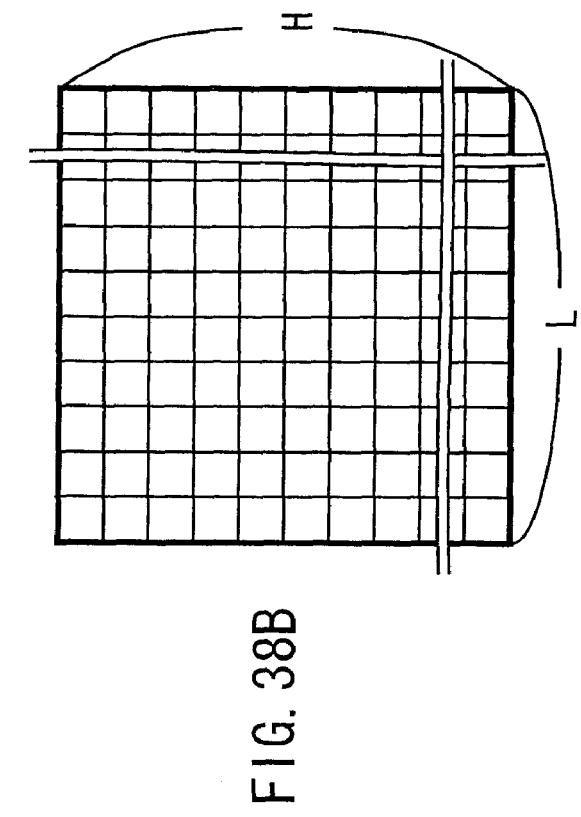
FIG. 38B

CAMERA MODULE AND ELECTRONIC APPARATUS PROVIDED WITH IT

TECHNICAL FIELD

The present invention relates to a camera module that is small and thin and has an automatic focusing control function, and an electronic apparatus including this camera module.

BACKGROUND ART

As a conventional camera module, a camera module is described in JP 2001-78213 A. FIG. 47 is a sectional view showing a configuration of the camera module described in JP 2001-78213 A.

In FIG. 47, an imaging system 9010 is an optical processing system that directs light from an object through a diaphragm 9110 and an imaging lens 9100 and forms an image on an imaging surface of an imaging device 9120. The diaphragm 9110 has three circular apertures 9110a, 9110b and 9110c. Light from the object that has left the apertures 9110a, 9110b and 9110c respectively and entered an incident surface 9100e of the imaging lens 9100 leaves three lens portions 9100a, 9100b and 9100c of the imaging lens 9100 and then forms three object images on the imaging surface of the imaging device 9120.

A shielding film is formed on a flat portion 9100d of an outgoing surface of the imaging lens 9100. On the incident surface 9100e of the imaging lens 9100, three optical filters 9052a, 9052b and 9052c transmitting light in different wavelength ranges are formed. Further, in the imaging device 9120, three optical filters 9053a, 9053b and 9053c transmitting light in different wavelength ranges also are formed on three imaging regions 9120a, 9120b and 9120c corresponding to the three lens portions 9100a, 9100b and 9100c of the imaging lens 9100, respectively.

The optical filter 9052a and the optical filter 9053a have spectral transmittance characteristics mainly transmitting green (indicated by G), the optical filter 9052b and the optical filter 9053b have spectral transmittance characteristics mainly transmitting red (indicated by R), and further the optical filter 9052c and the optical filter 9053c have spectral transmittance characteristics mainly transmitting blue (indicated by B). Accordingly, the imaging region 9120a is sensitive to green light (G), the imaging region 9120b is sensitive to red light (R), and the imaging region 9120c is sensitive to blue light (B).

In such a camera module with a plurality of imaging lenses, when the distance from the camera module to an object (a subject) varies, the space between a plurality of object images that are formed on the imaging surface of the imaging device 9120 respectively by the plurality of imaging lenses also varies.

In the camera module described in JP 2001-78213 A, the space between optical axes of a plurality of image forming systems is set such that the difference between the space between a plurality of object images when the object is present at a virtual subject distance D [m] and the space between a plurality of object images when the object is present at an infinite distance is smaller than twice the pixel pitch of a reference image signal, where the virtual subject distance D [m] is defined as $D=1.4/(\tan(\theta/2))$ as a function of shooting angles of view $\theta$ [°] of the plurality of image forming systems. In other words, in the camera module described in JP 2001-78213 A, since the space between the optical axes is set such that the difference between both the spaces between the respective object images on the imaging surface is smaller than twice the pixel pitch of the reference signal even when the same image processing as that optimized for shooting an object present at the virtual subject distance D [m] is performed for the shooting of an object present at an infinite distance, it is possible to suppress a color shifting of the image of the object at an infinite distance to an allowable level.

In recent years, portable equipment such as camera-equipped mobile phones has become widespread. Accompanying the reduction in size and thickness and the improvement in performance of such portable equipment, there has been a demand for smaller and thinner camera modules with a higher performance. For example, these camera modules are required to have an automatic focusing control function and be capable of not only a landscape shot (shooting an object at a substantially infinite distance) and a portrait shot (shooting an object usually at a distance of several meters) but also a macro shot (shooting an object at a distance of several centimeters to several tens of centimeters).

In the camera module described in JP 2001-78213 A, the thickness is reduced by providing a plurality of the lens portions 9100a, 9100b and 9100c. However, this conventional camera module has no automatic focusing control function. Also, the virtual subject distance D [m] is set with portrait shots in mind. Therefore, although this conventional camera module can deal with landscape shots and portrait shots, it cannot deal with macro shots.

As another conventional camera module for solving the problem that has not been solved by the camera module described in JP 2001-78213 A, a camera module is described in JP 2002-330332 A. FIG. 48 shows an exemplary image taken by the camera module described in JP 2002-330332 A and its divided sub-regions. In the taken image, a central portion k0 and detection regions k1, k2, k3 and k4 surrounding the central portion k0 are formed. Then, parallaxes p0, p1, p2, p3 and p4 of the respective detection regions are calculated. From these parallaxes, the one in a predetermined range is extracted. If there are a plurality of parallaxes to be selected, the one in the region closer to the center is selected. Furthermore, using the selected parallax, the entire taken image is corrected.

In the conventional camera module described in JP 2002-330332 A, the taken image partially is formed into a plurality of sub-regions, the parallaxes of these sub-regions are calculated, one parallax is selected from them, and the entire taken image is corrected based on this selected parallax. For example, in the case where there are both a person M at a distance of about 2 m from the camera at the center and a person N at a distance of about 10 m on the edge of the taken image as shown in FIG. 48, the person M located at the center of the taken image is considered as a subject, and the entire taken image is corrected based on the parallax p0 in this region k0. At this time, since the parallax of the person M is the same as the selected parallax p0, the parallactic influence can be corrected, resulting in a beautiful image in the region of the person M. However, since the parallax of the person N is different from the selected parallax p0, the parallactic influence cannot be corrected. Therefore, color irregularities are generated in the region of the person N, so that a beautiful image cannot be obtained.

DISCLOSURE OF INVENTION

Problem to be Solved by the Invention

The present invention was made with the foregoing problems in mind, and the object of the present invention is to provide a camera module that can be made smaller and thinner and achieves a beautiful image over an entire image region regardless of a subject distance.

A camera module according to the present invention includes a plurality of lens portions, each including at least one lens, a plurality of imaging regions, provided in one-to-one correspondence with the plurality of lens portions, each including a light-receiving surface that is substantially orthogonal to an optical axis direction of its corresponding lens portion, an imaging signal input portion to which a plurality of imaging signals outputted respectively from the plurality of imaging regions are inputted, a block division portion for dividing at least one imaging signal of the plurality of imaging signals into a plurality of blocks, a parallax computing portion for computing for each of the blocks a parallax between images formed respectively by the plurality of lens portions using the imaging signal, and a parallax correcting portion for correcting the plurality of imaging signals based on the parallax and performing an image synthesis.

A program according to the present invention is a program for controlling an operation of an image processing portion in a camera module including a plurality of lens portions, each including at least one lens, a plurality of imaging regions, provided in one-to-one correspondence with the plurality of lens portions, each including a light-receiving surface that is substantially orthogonal to an optical axis direction of its corresponding lens portion, an imaging signal input portion to which a plurality of imaging signals outputted respectively from the plurality of imaging regions are inputted, and the image processing portion for performing an image processing of the inputted imaging signal. The program causes the image processing portion to execute a block division process of dividing at least one imaging signal of the plurality of imaging signals into a plurality of blocks, a parallax computing process of computing for each of the blocks a parallax between images formed respectively by the plurality of lens portions using the imaging signal, and a parallax correcting process of correcting the plurality of imaging signals based on the parallax and performing an image synthesis.

A program recording medium according to the present invention is a computer-readable recording medium storing the above-described program.

EFFECTS OF THE INVENTION

The present invention was made with the foregoing problems in mind and can provide a camera module that can be made smaller and thinner and achieves a beautiful image over an entire image region regardless of a subject distance.

BRIEF DESCRIPTION OF DRAWINGS

FIG. 31A is a drawing for describing the state before block re-division in the camera module according to Embodiment 3 of the present invention, and FIG. 31B is a drawing for describing the state after the block re-division in the camera module according to Embodiment 3 of the present invention.

FIGS. 38A to 38D are drawings for describing field images of the camera module according to Embodiment 4 of the present invention.

DESCRIPTION OF THE INVENTION

Figure 1:
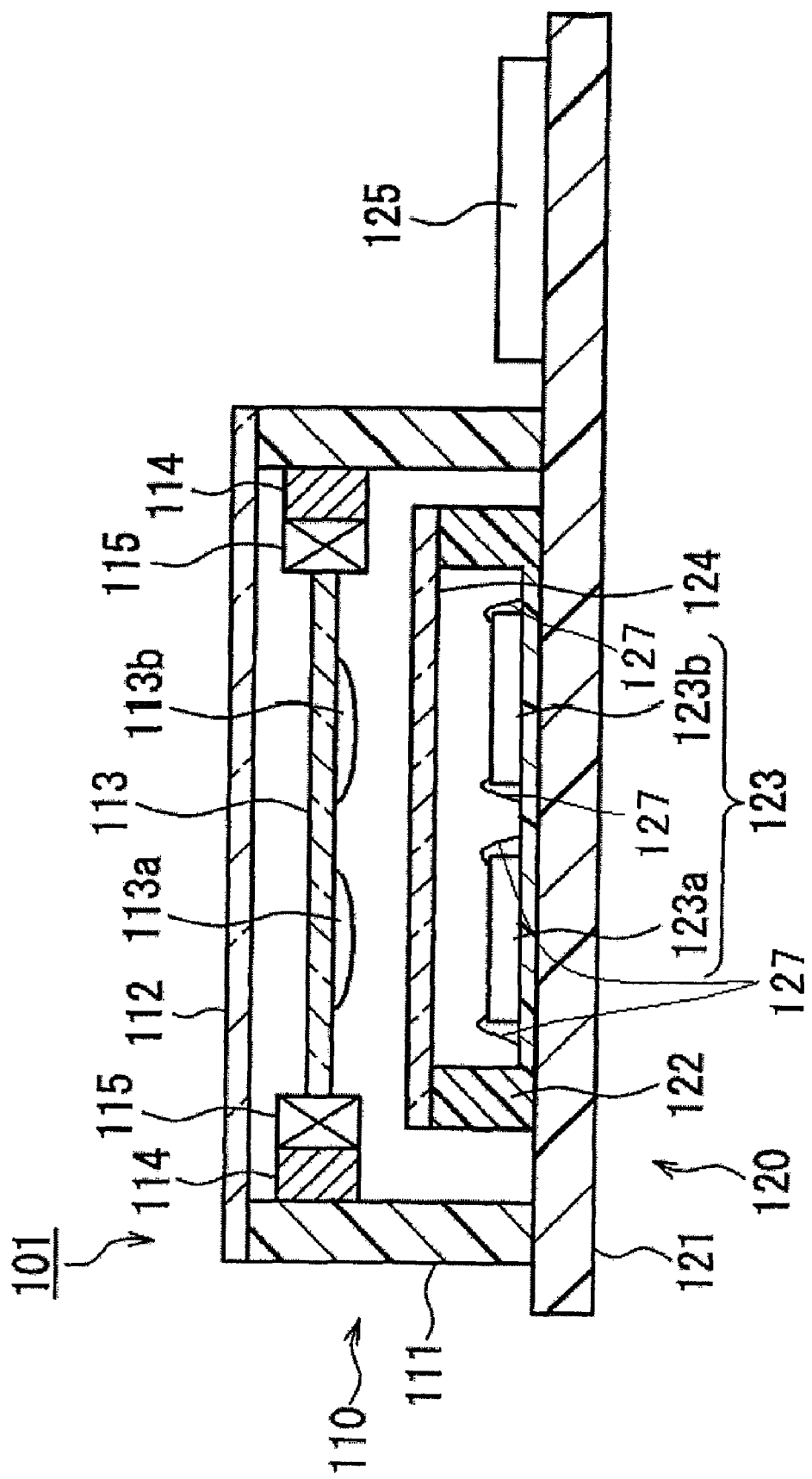
FIG. 1 is a sectional view showing a configuration of a camera module according to Embodiment 1 of the present invention.

A camera module according to the present invention includes a plurality of lens portions, each including at least one lens, a plurality of imaging regions, provided in one-to-one correspondence with the plurality of lens portions, each including a light-receiving surface that is substantially orthogonal to an optical axis direction of its corresponding lens portion, an imaging signal input portion to which a plurality of imaging signals outputted respectively from the plurality of imaging regions are inputted, a block division portion for dividing at least one imaging signal of the plurality of imaging signals into a plurality of blocks, a parallax computing portion for computing for each of the blocks a parallax between images formed respectively by the plurality of lens portions using the imaging signal, and a parallax correcting portion for correcting the plurality of imaging signals based on the parallax and performing an image synthesis.

The position of an object image varies relative to a subject distance. In other words, a parallax increases with decreasing subject distance. Thus, when a plurality of subjects at different distances are shot at the same time, the parallaxes for the individual subjects are different. According to the camera module of the present invention, the parallax is computed for each block, an imaging signal is corrected based on this parallax for each block so as to reduce a parallactic influence, and then an image synthesis is performed. In this manner, even when a plurality of subjects at different distances are shot at the same time, it is possible to correct the parallaxes of the individual subjects suitably, thereby achieving a beautiful image with reduced parallactic influence over an entire image region.

It is preferable that the above-described camera module according to the present invention further includes an actuator for changing a relative distance between the plurality of lens portions and the plurality of imaging regions, and a focusing control portion for controlling the actuator based on the parallax.

With this preferable configuration, the actuator is operated based on the parallax so as to carry out an automatic focusing control, so that a focus can be achieved with a single actuator operation. Therefore, it is possible to perform an automatic focusing control at a high speed.

It is preferable that the above-described camera module according to the present invention further includes a contrast computing portion for computing a contrast based on at least one imaging signal of the plurality of imaging signals and that the focusing control portion controls the actuator based on the parallax and the contrast.

With this preferable configuration, since a high-speed automatic focusing control based on the parallax and a highly-accurate automatic focusing control based on the contrast are combined, it is possible to carry out a highly-accurate automatic focusing control at a high speed.

In the above-described camera module according to the present invention, it is preferable that the focusing control portion controls the actuator plural times, and the actuator is controlled based on the parallax first and based on the contrast thereafter.

With this preferable configuration, first, the actuator is operated based on the parallax so as to carry out an automatic focusing control. Subsequently, the actuator is operated based on the contrast so as to carry out an automatic focusing control. The automatic focusing control based on the parallax is performed at a high speed, because the focus is achieved by a single actuator operation. On the other hand, the automatic focusing control based on the contrast is not susceptible to variations of the actuator and thus is highly accurate, because the focus achievement is judged directly from the image. Consequently, since a coarse adjustment first is made at a high speed by the automatic focusing control based on the parallax and then a fine adjustment is made with high accuracy by the automatic focusing control based on the contrast, it is possible to achieve a high-speed and highly-accurate automatic focusing control.

In the above-described camera module according to the present invention, it is preferable that the focusing control portion learns an operation amount with respect to the actuator when the actuator is controlled based on the contrast.

With this preferable configuration, learning is conducted so as to correct the operation amount function based on the actuator operation amount executed in the contrast-based automatic focusing control. This makes it possible to correct the operation amount function in a more accurate manner even when there are variations in the actuator, achieve the first more accurate parallax-based automatic focusing control and reduce the number of the fine adjustments thereafter by the contrast-based automatic focusing control, so that a higher-speed automatic focusing control can be achieved.

In the above-described camera module according to the present invention, it is preferable that the block division portion divides the at least one imaging signal into the plurality of blocks by detecting outlines of a plurality of image regions from the at least one imaging signal and dividing the at least one imaging signal into the plurality of image regions by the outlines.

With this preferable configuration, the outlines are detected, the division into blocks is carried out, the imaging signal is corrected so as to reduce a parallactic influence based on the parallax for each block, and then the image synthesis is performed. This allows a suitable division into blocks, making it possible to achieve a beautiful image with reduced parallactic influence over the entire image region.

In the above-described camera module according to the present invention, it is preferable that an outline parallax computing portion is added for computing an outline parallax, which is a parallax between the outlines, based on the imaging signal, and the parallax computing portion computes for each of the blocks the parallax between the images formed respectively by the plurality of lens portions based on the outline parallax.

With this preferable configuration, the parallax of the outlines is detected. Based on this parallax, a parallax is computed for each block. Based on this parallax, the imaging signal is corrected so as to reduce the parallactic influence, and then the image synthesis is performed. Thus, it is possible to achieve a beautiful image with reduced parallactic influence over the entire image region.

In the above-described camera module according to the present invention, it is preferable that the block division portion divides the at least one imaging signal into a plurality of rectangular blocks.

With this preferable configuration, a parallax of a parallax is computed for each block. Based on this parallax, the imaging signal is corrected so as to reduce the parallactic influence, and then the image synthesis is performed. Thus, it is possible to achieve a beautiful image with reduced parallactic influence over the entire image region.

It is preferable that the above-described camera module according to the present invention further includes a parallax evaluation value computing portion for computing for each of the plurality of blocks at least one parallax accuracy evaluation value indicating an accuracy of the parallax based on the imaging signal, and that the parallax correcting portion corrects for each of the plurality of blocks the plurality of imaging signals based on the parallax and the parallax accuracy evaluation value and performs the image synthesis.

A divided block sometimes contains a plurality of objects at different subject distances. In this case, the parallaxes for the individual objects are different. With this preferable configuration, the accuracy of the parallax computed for each block is judged, and the method for correcting the imaging signal is modified based on this accuracy. In this manner, it is possible to correct an image by an optimal correction method for each block, thereby achieving a beautiful image with further reduced parallactic influence over the entire image region.

In the above-described camera module according to the present invention, it is preferable that the parallax correcting portion determines for each of the plurality of blocks whether or not this block is to be divided into at least two based on the parallax accuracy evaluation value and performs the image synthesis based on a parallax between divided blocks in the block determined to be divided.

With this preferable configuration, the accuracy of the parallax computed for each block is judged, and the block with little accuracy is considered to have mixed parallaxes and divided into at least two blocks. In this manner, it always is possible to correct an image by an optimal block size, thereby achieving a beautiful image with further reduced parallactic influence over the entire image region.

In the above-described camera module according to the present invention, it is preferable that the parallax evaluation value computing portion computes a first parallax accuracy evaluation value indicating how high a contrast is for each of the plurality of blocks based on at least one imaging signal of the plurality of imaging signals.

With this preferable configuration, the accuracy of the parallax computed for each block is computed and evaluated based on the contrast, and the method for correcting the imaging signal is modified based on this contrast. In this manner, it is possible to correct an image by an optimal correction method for each block, thereby achieving a beautiful image with further reduced parallactic influence over the entire image region.

In the above-described camera module according to the present invention, it is preferable that the parallax evaluation value computing portion computes a second parallax accuracy evaluation value indicating how much images formed respectively by at least two of the lens portions and images shifted therefrom by the parallax are correlated for each of the plurality of blocks using the imaging signal divided into the plurality of blocks.

With this preferable configuration, the accuracy of the parallax computed for each block is computed and evaluated using the second parallax accuracy evaluation value indicating how much an image shifted by the parallax is correlated with the original image, and the method for correcting the imaging signal is modified based on the correlation. In this manner, it is possible to correct an image by an optimal correction method for each block, thereby achieving a beautiful image with further reduced parallactic influence over the entire image region.

In the above-described camera module according to the present invention, it is preferable that, for each of the plurality of blocks, the parallax correcting portion divides this block into at least two when the second parallax accuracy evaluation value is small, and performs the image synthesis based on the parallax between the divided blocks in the block that has been divided.

With this preferable configuration, the accuracy of the parallax computed for each block is evaluated using the second parallax accuracy evaluation value indicating how much an image shifted by the parallax is correlated with the original image. Then, the block that is judged to have a small second parallax accuracy evaluation value, namely, a low correlation is divided into at least two blocks. In this manner, it always is possible to correct an image by an optimal block size, thereby achieving a beautiful image with further reduced parallactic influence over the entire image region.

In the above-described camera module according to the present invention, it is preferable that the parallax evaluation value computing portion computes a first parallax accuracy evaluation value indicating how high a contrast is for each of the plurality of blocks based on at least one imaging signal of the plurality of imaging signals, and a second parallax accuracy evaluation value indicating how much images formed respectively by at least two of the lens portions and images shifted therefrom by the parallax are correlated for each of the plurality of blocks using the imaging signal divided into the plurality of blocks, and for each of the plurality of blocks, the parallax correcting portion divides this block into at least two when the first parallax accuracy evaluation value is large and the second parallax accuracy evaluation value is small, and performs the image synthesis based on the parallax between the divided blocks in the block that has been divided.

With this preferable configuration, the accuracy of the computed parallax is evaluated using the first parallax accuracy evaluation value indicating how high a contrast is for each block and the second parallax accuracy evaluation value indicating how much an image shifted by the parallax is correlated with the original image. Then, the block that is judged to have a large first parallax accuracy evaluation value, namely, a high contrast and a small second parallax accuracy evaluation value, namely, a low correlation is divided into at least two blocks. In this manner, it always is possible to correct an image by an optimal block size, thereby achieving a beautiful image with further reduced parallactic influence over the entire image region.

In the above-described camera module according to the present invention, it is preferable that the imaging signal input portion inputs the plurality of imaging signals for each of a plurality of fields, and the parallax computing portion computes the parallax for each of the blocks in each of the plurality of fields.

With this preferable configuration, by computing the parallaxes for individual fields, even in the case where the images of the individual fields are different because shooting times for the individual fields are different when shooting a moving subject, it is possible to compute the parallaxes for the individual fields properly. This allows the image synthesis using these parallaxes, so that a beautiful image with further reduced parallactic influence can be achieved over the entire image region.

Also, it is preferable further that the above-described preferable configuration further includes color filters that are provided in one-to-one correspondence with the plurality of lens portions and have filters of plural colors, and that the filters of the same color are provided so as to correspond to at least two of the plurality of lens portions arranged in parallel with a scanning direction of the fields.

With this further preferable configuration, even in the case where the images of the individual fields are different because shooting times for the individual fields are different when shooting a moving subject, it is possible to compute the parallaxes for the individual fields more accurately.

It is preferable that the above-described camera module according to the present invention further includes another image storing portion for storing another image different from a taken image, and that the parallax correcting portion combines the another image and an image obtained by correcting the imaging signal based on the parallax.

With this preferable configuration, by combining the image corrected based on the parallax and another image, it becomes possible to extract an image properly from the corrected image, so that these images can be combined beautifully.

In the above-described camera module according to the present invention, it is preferable that the parallax correcting portion performs combining so that a ratio of the image obtained by correcting the imaging signal increases and that of the another image decreases with an increase in the parallax.

With this preferable configuration, by combining the image corrected based on the parallax and another image, it becomes possible to extract an image in a part with a large parallax properly from the corrected image, so that these images can be combined beautifully.

Further, an electronic apparatus according to the present invention includes the above-described camera module of the present invention.

Also, a program according to the present invention is a program for controlling an operation of an image processing portion in a camera module including a plurality of lens portions, each including at least one lens, a plurality of imaging regions, provided in one-to-one correspondence with the plurality of lens portions, each including a light-receiving surface that is substantially orthogonal to an optical axis direction of its corresponding lens portion, an imaging signal input portion to which a plurality of imaging signals outputted respectively from the plurality of imaging regions are inputted, and the image processing portion for performing an image processing of the inputted imaging signal. The program causes the image processing portion to execute a block division process of dividing at least one imaging signal of the plurality of imaging signals into a plurality of blocks, a parallax computing process of computing for each of the blocks a parallax between images formed respectively by the plurality of lens portions using the imaging signal, and a parallax correcting process of correcting the plurality of imaging signals based on the parallax and performing an image synthesis.

Moreover, a program recording medium according to the present invention is a computer-readable program recording medium storing the above-described program.

According to the program or the program recording medium of the present invention, the parallax is computed for each block, an imaging signal is corrected based on this parallax for each block so as to reduce a parallactic influence, and then an image synthesis is performed. In this manner, even when a plurality of subjects at different distances are shot at the same time, it is possible to correct the parallaxes of the individual subjects suitably, thereby achieving a beautiful image with reduced parallactic influence over an entire image region.

The following is a description of specific embodiments of the present invention, with reference to the accompanying drawings.

Embodiment 1

A camera module according to Embodiment 1 of the present invention achieves a beautiful image over an entire image region by detecting edges, performing a division into blocks and performing a parallax correction based on the parallax for each block. Also, by making a coarse adjustment by an automatic focusing control based on the parallax and a fine adjustment by an automatic focusing control based on a highly accurate contrast, it is possible to carry out a highly accurate automatic focusing control at a high speed. Furthermore, an amount of the fine adjustment is learned so as to improve the accuracy of the next coarse adjustment.

The camera module according to Embodiment 1 of the present invention will be described, with reference to the accompanying drawings.

FIG. 1 is a sectional view showing a configuration of the camera module according to Embodiment 1 of the present invention. In FIG. 1, a camera module 101 includes a lens module portion 110 and a circuit portion 120.

The lens module portion 110 includes a barrel 111, an upper cover glass 112, a lens 113, an actuator fixing portion 114 and an actuator movable portion 115. The circuit portion 120 includes a substrate 121, a package 122, an imaging device 123, a package cover glass 124 and a system LSI (hereinafter, referred to as an SLSI) 125.

The barrel 111 has a cylindrical shape with its inner wall surface being matte black for preventing light diffusion, and is formed by injection molding of a resin. The upper cover glass 112 has a disc shape, is formed of a transparent resin and fixed firmly to an upper surface of the barrel 111 with an adhesive or the like. The surface of the upper cover glass 112 is provided with a protective film for preventing damage due to friction or the like and an antireflection film for preventing reflection of incident light.

Figure 2:
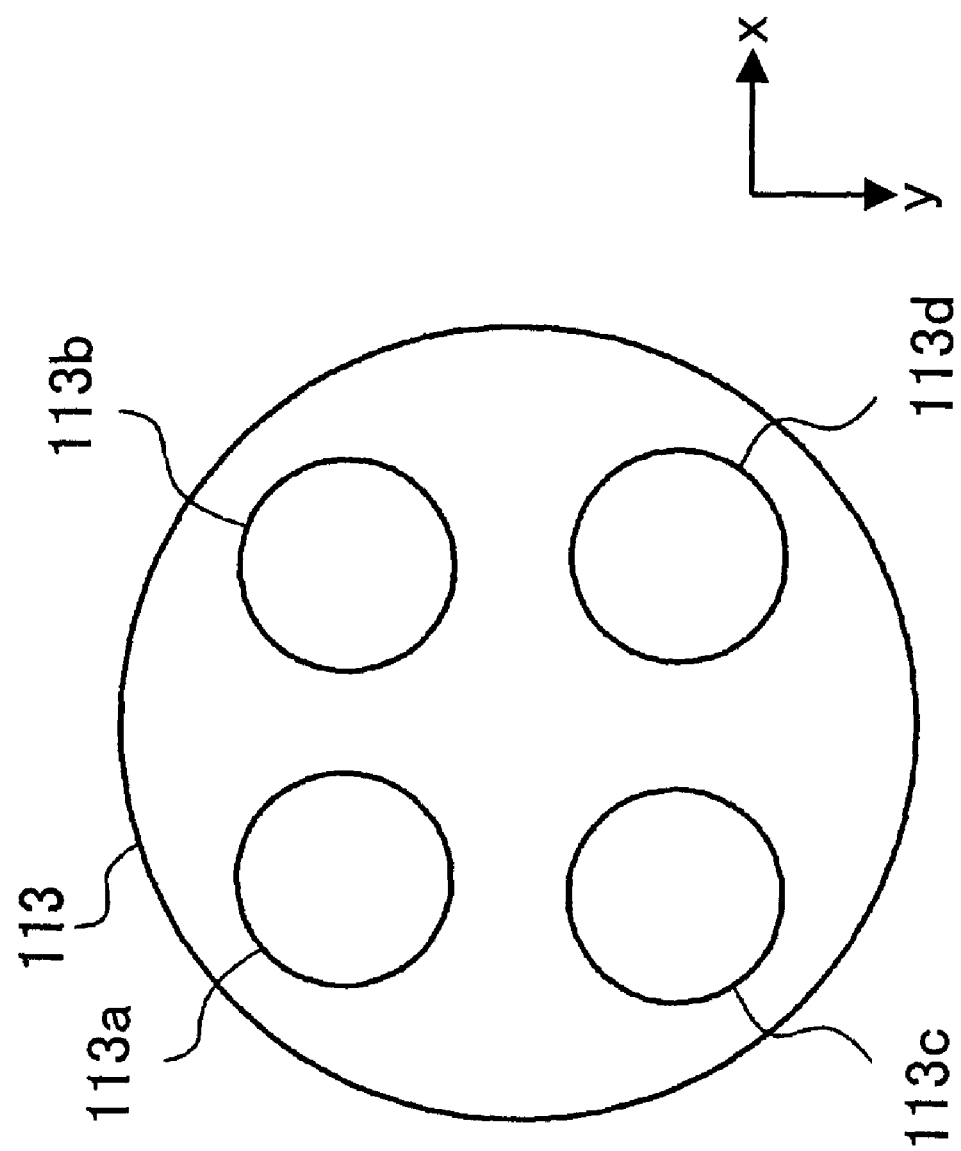
FIG. 2 is a top view showing a lens of the camera module according to Embodiment 1 of the present invention.

FIG. 2 is a top view showing the lens 113 of the camera module according to Embodiment 1 of the present invention. The lens 113 has a substantially disc shape, is formed of glass or a transparent resin and provided with a first lens portion 113a, a second lens portion 113b, a third lens portion 113c and a fourth lens portion 113d that are arranged in a lattice pattern. As shown in FIG. 2, an X axis and a Y axis are set along the arrangement directions of the first to fourth lens portions 113a to 113d. In the first lens portion 113a, the second lens portion 113b, the third lens portion 113c and the fourth lens portion 113d, light entering from a subject side leaves for a side of the imaging device 123 and forms four images on the imaging device 123.

The actuator fixing portion 114 is fixed firmly to the inner wall surface of the barrel 111 with an adhesive or the like. The actuator movable portion 115 is fixed firmly to an outer peripheral edge of the lens 113 with an adhesive or the like. The actuator fixing portion 114 and the actuator movable portion 115 constitute a voice coil motor. The actuator fixing portion 114 has a permanent magnet (not shown) and a ferromagnetic yoke (not shown), and the actuator movable portion 115 has a coil (not shown). The actuator movable portion 115 is supported elastically by an elastic member (not shown) with respect to the actuator fixing portion 114. By passing an electric current through the coil of the actuator movable portion 115, the actuator movable portion 115 moves relatively to the actuator fixing portion 114, so that the relative distance between the lens 113 and the imaging device 123 along an optical axis varies.

The substrate 121 is made of a resin substrate, and the barrel 111 is fixed firmly to an upper surface of the substrate 121 with an adhesive or the like such that a bottom surface of the barrel 111 contacts the upper surface of the substrate 121. In this way, the lens module portion 110 and the circuit portion 120 are fixed to each other, thus forming the camera module 101.

The package 122 is formed of a resin having metal terminals. Inside the barrel 111, the package 122 is fixed firmly to the upper surface of the substrate 121 with its metal terminal portion being fixed by soldering or the like. The imaging device 123 is constituted by a first imaging device 123a, a second imaging device 123b, a third imaging device 123c and a fourth imaging device 123d. Each of the first imaging device 123a, the second imaging device 123b, the third imaging device 123c and the fourth imaging device 123d is a solid-state imaging device such as a CCD sensor or a CMOS sensor. They are arranged such that centers of their light-receiving surfaces substantially match respective centers of optical axes of the first lens portion 113a, the second lens portion 113b, the third lens portion 113c and the fourth lens portion 113d and such that their light-receiving surfaces are substantially orthogonal to the optical axes of their corresponding lens portions.

Individual terminals of the first imaging device 123a, the second imaging device 123b, the third imaging device 123c and the fourth imaging device 123d are connected to the metal terminals in the bottom portion inside the package 122 with metal wires 127 by wire bonding and connected electrically to the SLSI 125 via the substrate 121. Light that has left the first lens portion 113a, light that has left the second lens portion 113b, light that has left the third lens portion 113c and light that has left the fourth lens portion 113d respectively form images on the light-receiving surfaces of the first imaging device 123a, the second imaging device 123b, the third imaging device 123c and the fourth imaging device 123d. Electric information converted from optical information by photodiodes is outputted to the SLSI 125.

Figure 3:
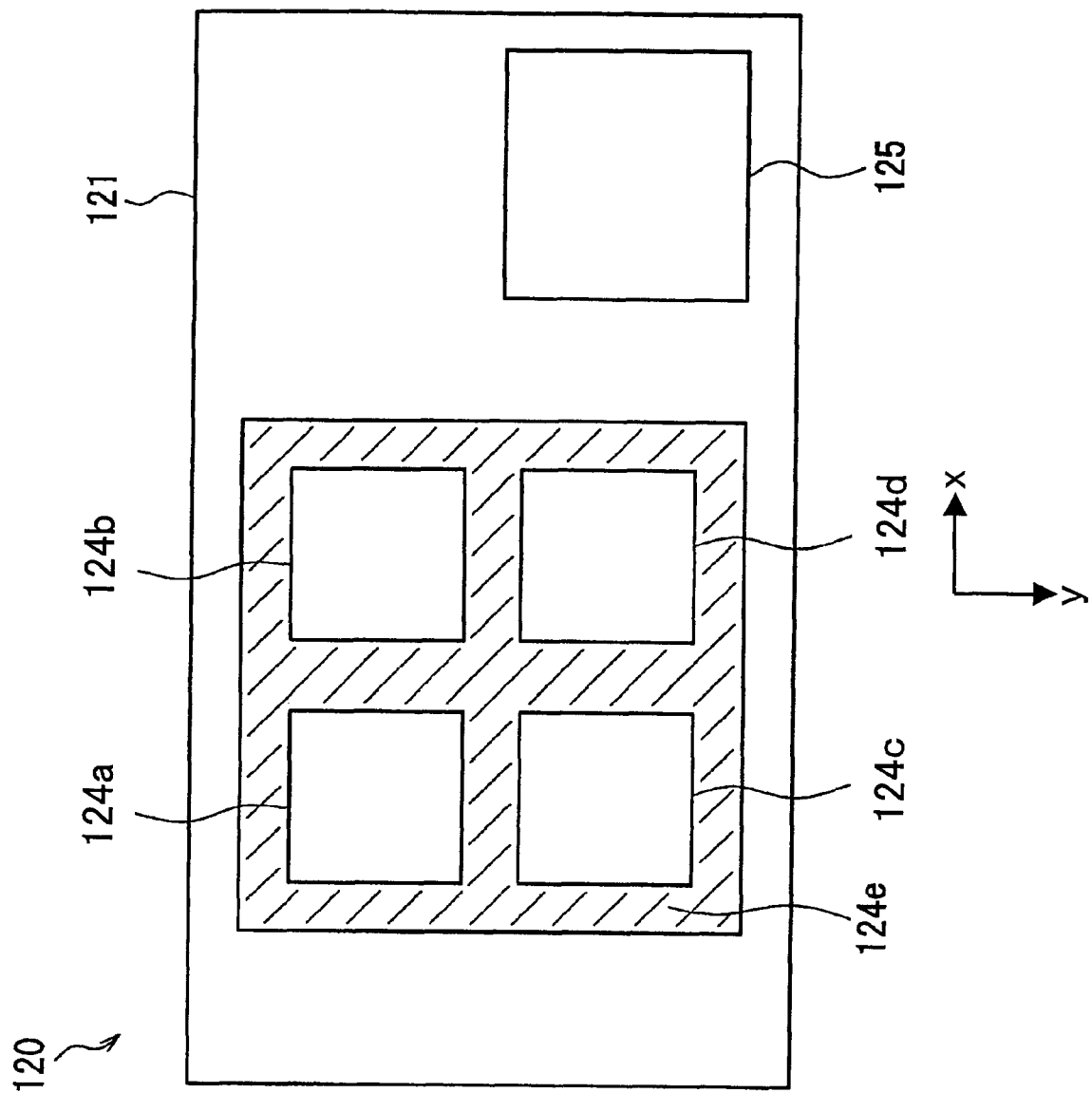
FIG. 3 is a top view showing a circuit portion of the camera module according to Embodiment 1 of the present invention.

FIG. 3 is a top view showing the circuit portion 120 of the camera module according to Embodiment 1 of the present invention. The package cover glass 124 has a flat shape, is formed of a transparent resin and fixed firmly to the upper surface of the package 122 by adhesion or the like. An upper surface of the package cover glass 124 is provided with a first color filter 124a, a second color filter 124b, a third color filter 124c, a fourth color filter 124d and a shielding portion 124e by deposition or the like. Also, a lower surface of the package cover glass 124 is provided with an infrared ray shielding filter (not shown; hereinafter, referred to as an IR filter) by deposition or the like.

Figure 4:
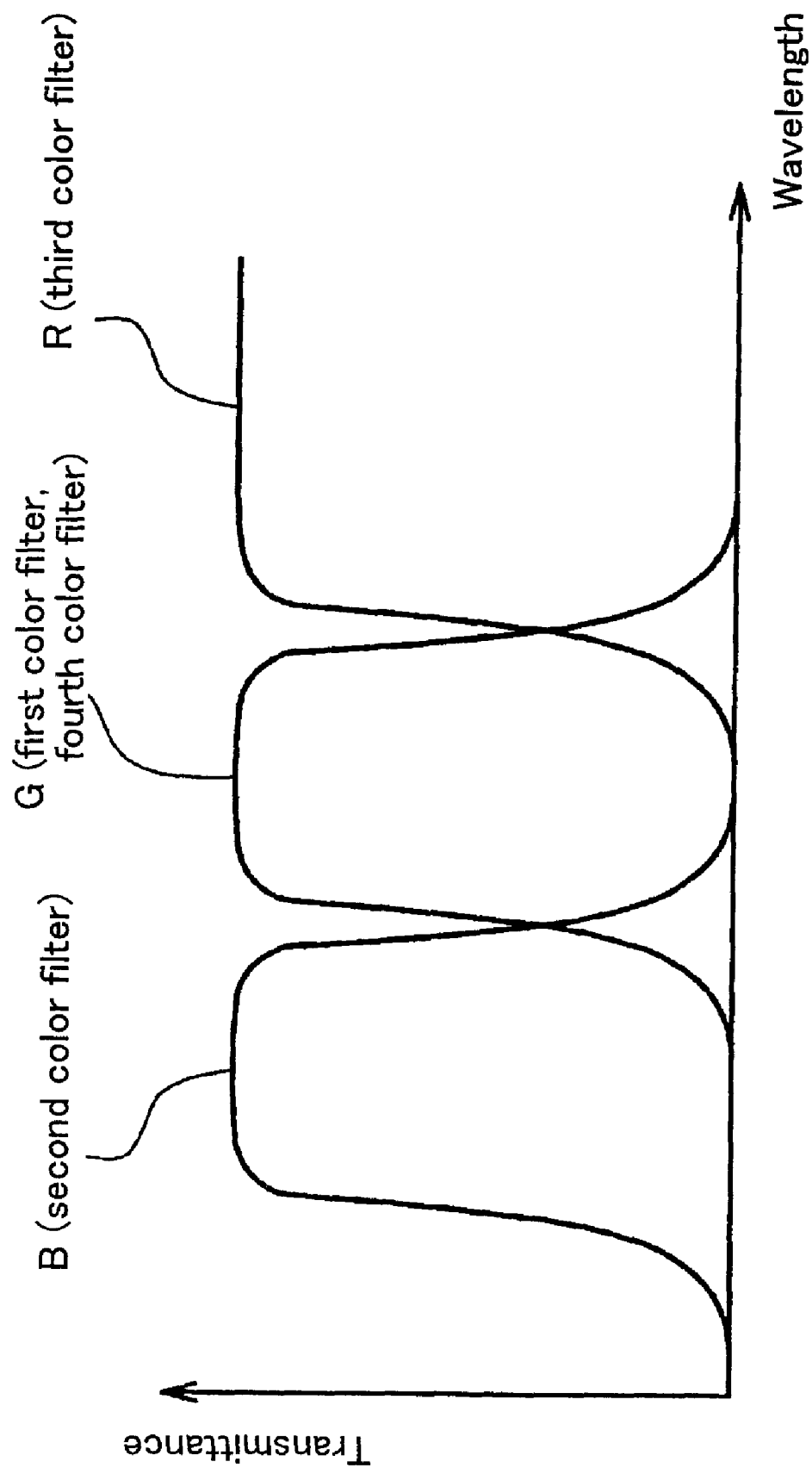
FIG. 4 shows characteristics of color filters of the camera module according to Embodiment 1 of the present invention.
Figure 5:
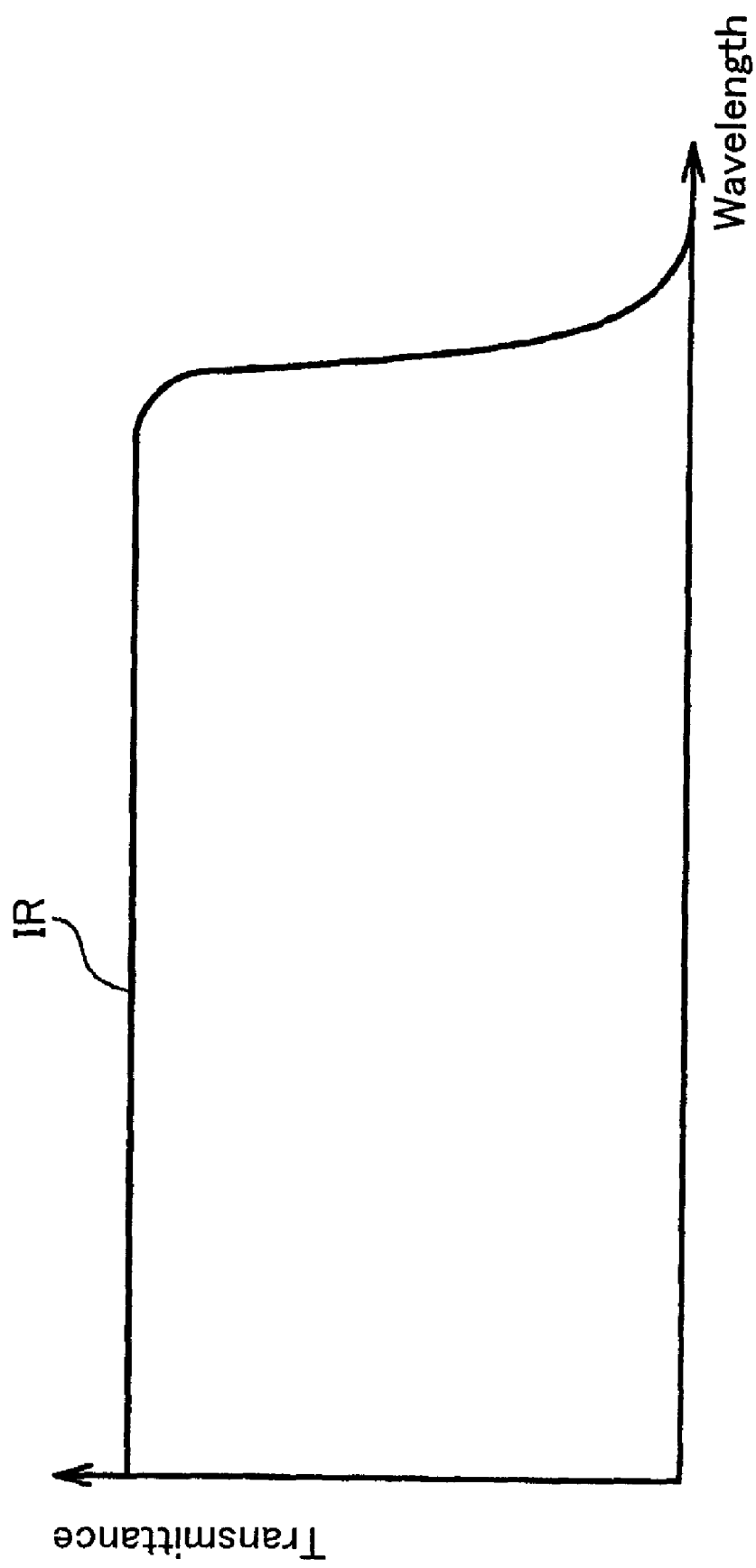
FIG. 5 shows characteristics of an IR filter of the camera module according to Embodiment 1 of the present invention.

FIG. 4 shows characteristics of the color filters of the camera module according to Embodiment 1 of the present invention, and FIG. 5 shows characteristics of the IR filter of the camera module according to Embodiment 1 of the present invention. The first color filter 124a has spectral transmittance characteristics mainly transmitting green indicated by G in FIG. 4, the second color filter 124b has spectral transmittance characteristics mainly transmitting blue indicated by B in FIG. 4, the third color filter 124c has spectral transmittance characteristics mainly transmitting red indicated by R in FIG. 4, and the fourth color filter has spectral transmittance characteristics mainly transmitting green indicated by G in FIG. 4. Further, the IR filter has spectral transmittance characteristics blocking infrared rays indicated by IR in FIG. 5.

Thus, object light that has entered from an upper portion of the first lens portion 113a leaves a lower portion of the first lens portion 113a, and its green component mainly is transmitted by the first color filter 124a and the IR filter so as to form an image on the light-receiving portion of the first imaging device 123a, and therefore, the first imaging device 123a receives the green component of the object light. Object light that has entered from an upper portion of the second lens portion 113b leaves a lower portion of the second lens portion 113b, and its blue component mainly is transmitted by the second color filter 124b and the IR filter so as to form an image on the light-receiving portion of the second imaging device 123b, and therefore, the second imaging device 123b receives the blue component of the object light. Object light that has entered from an upper portion of the third lens portion 113c leaves a lower portion of the third lens portion 113c, and its red component mainly is transmitted by the third color filter 124c and the IR filter so as to form an image on the light-receiving portion of the third imaging device 123c, and therefore, the third imaging device 123c receives the red component of the object light. Further, object light that has entered from an upper portion of the fourth lens portion 113d leaves a lower portion of the fourth lens portion 113d, and its green component mainly is transmitted by the fourth color filter 124d and the IR filter so as to form an image on the light-receiving portion of the fourth imaging device 123d, and therefore, the fourth imaging device 123d receives the green component of the object light.

The SLSI 125 controls the passage of an electric current through the coil of the actuator movable portion 115, drives the imaging device 123, inputs the electric information from the imaging device 123, carries out various image processings, communicates with a main CPU and outputs an image to an external part, by a method described later.

Now, the relationship between the subject distance and the parallax will be described. Since the camera module according to Embodiment 1 of the present invention has four lens portions (the first lens portion 113a, the second lens portion 113b, the third lens portion 113c and the fourth lens portion 113d), the relative positions of the four object images formed respectively by these four lens portions vary according to the subject distance.

Figure 6:
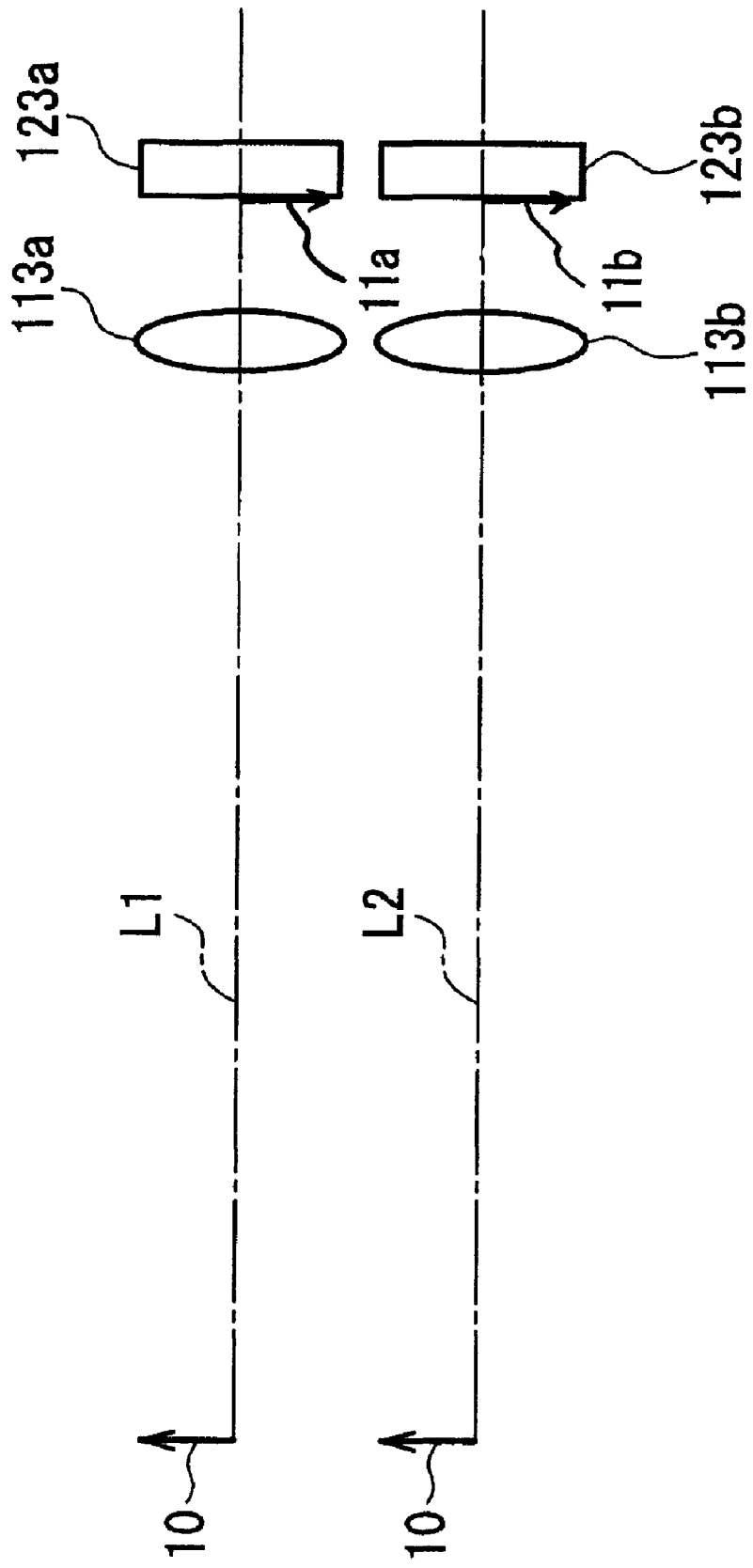
FIG. 6 is a drawing for describing positions of images of an object at an infinite distance in the camera module according to Embodiment 1 of the present invention.

FIG. 6 is a drawing for describing positions of images of an object at an infinite distance in the camera module according to Embodiment 1 of the present invention. For the sake of simplicity, FIG. 6 shows only the first lens portion 113a, the first imaging device 123a, the second lens portion 113b and the second imaging device 123b. Incident light L1 into the first lens portion 113a from an object 10 at an infinite distance and incident light L2 into the second lens portion 113b therefrom are in parallel. Accordingly, the distance between the first lens portion 113a and the second lens portion 113b and that between an object image 11a on the first imaging device 123a and an object image 11b on the second imaging device 123b are equal.

Here, the optical axes of the first lens portion 113a, the second lens portion 113b, the third lens portion 113c and the fourth lens portion 113d substantially match the centers of the light-receiving surfaces of the first imaging device 123a, the second imaging device 123b, the third imaging device 123c and the fourth imaging device 123d, respectively. Thus, the relative positional relationships between the centers of the respective light-receiving surfaces of the first imaging device 123a, the second imaging device 123b, the third imaging device 123c and the fourth imaging device 123d and respective images of the object at an infinite distance formed on these light-receiving surfaces are the same for all the imaging devices. In other words, there is no parallax.

Figure 7:
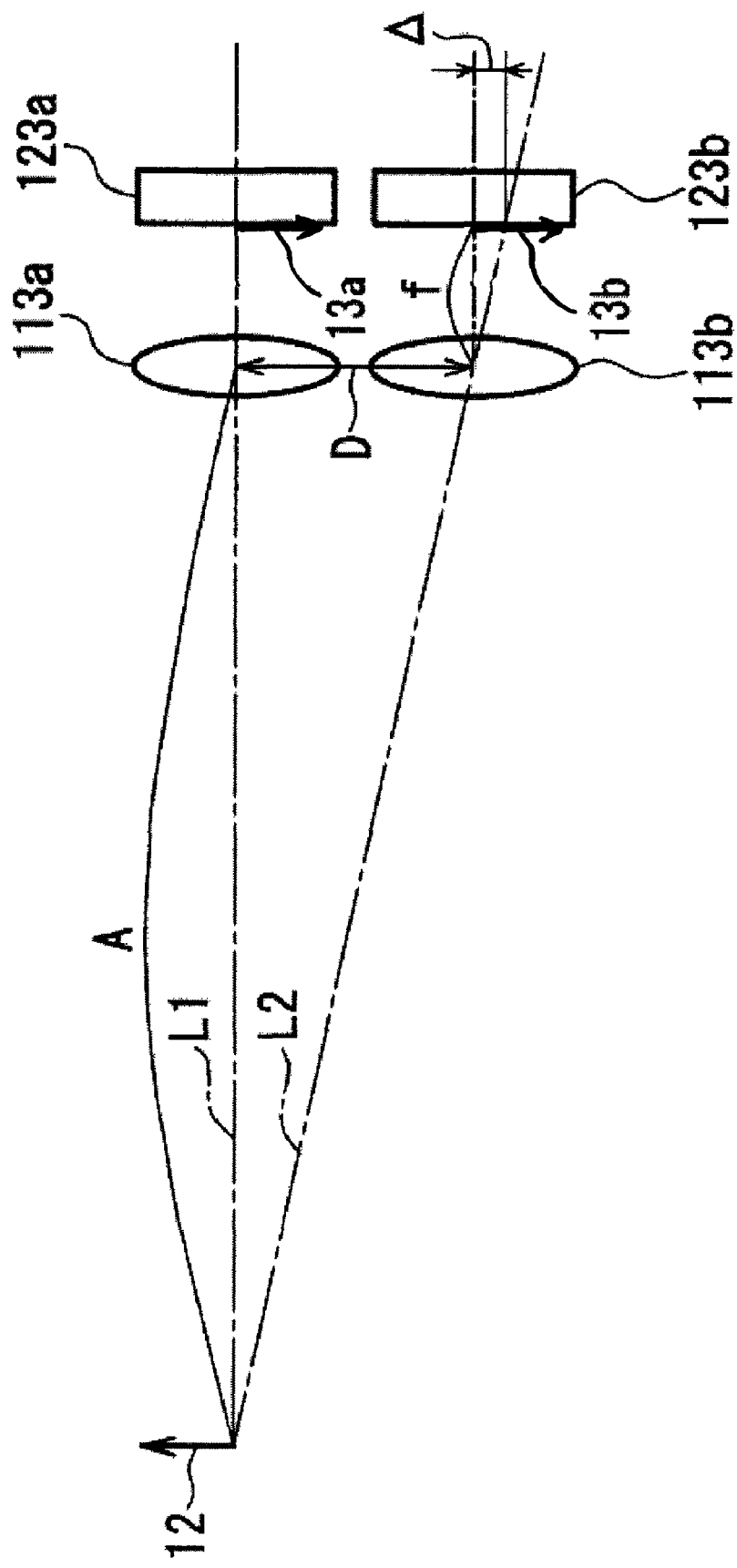
FIG. 7 is a drawing for describing positions of images of an object at a finite distance in the camera module according to Embodiment 1 of the present invention.

FIG. 7 is a drawing for describing positions of images of an object at a finite distance in the camera module according to Embodiment 1 of the present invention. For the sake of simplicity, FIG. 7 shows only the first lens portion 113a, the first imaging device 123a, the second lens portion 113b and the second imaging device 123b. Incident light L1 into the first lens portion 113a from an object 12 at a finite distance and incident light L2 into the second lens portion 113b therefrom are not in parallel. Accordingly, the distance between an object image 13a on the first imaging device 123a and an object image 13b on the second imaging device 123b is greater than that between the first lens portion 113a and the second lens portion 113b. Thus, the relative positional relationships between the centers of the respective light-receiving surfaces of the first imaging device 123a, the second imaging device 123b, the third imaging device 123c and the fourth imaging device 123d and respective images of the object at a finite distance formed on these light-receiving surfaces are different from one imaging device to another. In other words, there is a parallax.

When A represents the distance to the object image 12 (the subject distance), D represents the distance between the first lens portion 113a and the second lens portion 113b and $f$ represents a focal length of the lens portions 113a and 113b, since a right triangle whose two sides forming a right angle have lengths A and D and that whose two sides forming a right angle have lengths f and $\Delta$ in FIG. 7 are similar to each other, the parallax $\Delta$ is expressed by Equation (1) below. The same relationship holds true for the other lens portions. In this manner, the relative positions of the four object images formed respectively by the four lens portions 113a, 113b, 113c and 113d vary according to the subject distance. For example, when the subject distance A decreases, the parallax $\Delta$ increases.

$$\Delta = f \cdot D / A \qquad (1)$$

Now, the relationship between a contrast and the focal length will be described.

Figure 8A:
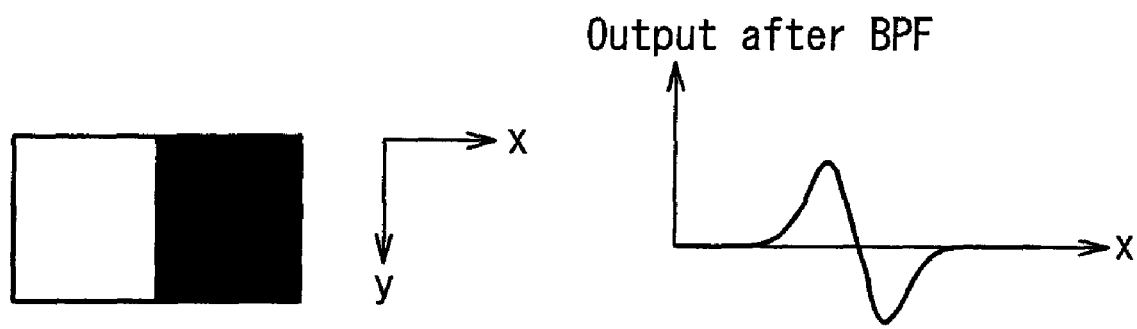
FIG. 8A is a drawing for describing the relationship between an image when a focus is achieved and a contrast evaluation value in the camera module according to Embodiment 1 of the present invention.
Figure 8B:
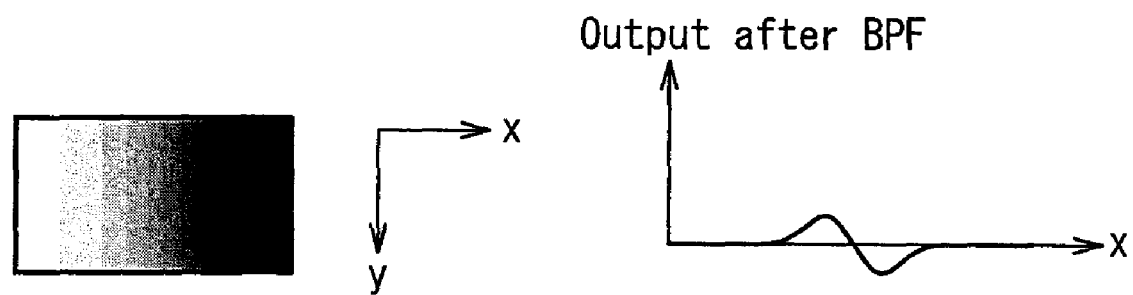
FIG. 8B is a drawing for describing the relationship between the image when the focus is not achieved and the contrast evaluation value in the camera module according to Embodiment 1 of the present invention.

FIG. 8A is a drawing for describing the relationship between an image when a focus is achieved (a focus is adjusted) and a contrast evaluation value in the camera module according to Embodiment 1 of the present invention, and FIG. 8B is a drawing for describing the relationship between the image when the focus is not achieved (the focus is not adjusted) and the contrast evaluation value in the camera module according to Embodiment 1 of the present invention.

The drawings on the left in FIGS. 8A and 8B show images when shooting a rectangle whose left half is white and right half is black. As in the drawing on the left in FIG. 8A, when the focus is achieved, an outline of the image is clear, resulting in a high contrast. On the other hand, as in the drawing on the left in FIG. 8B, when the focus is not achieved, the outline of the image is blurred, resulting in a low contrast.

The drawings on the right in FIGS. 8A and 8B show results of subjecting information signals of the left-hand drawings to a band-pass filter (BPF). The horizontal axis indicates a position in an X-axis direction, and the vertical axis indicates an output value after BPF. As in the drawing on the right in FIG. 8A, a signal amplitude after BPF is large when the focus is achieved. On the other hand, as in the drawing on the right in FIG. 8B, the signal amplitude after BPF is small when the focus is not achieved. Here, the signal amplitude after BPF is defined as a contrast evaluation value indicating how high the contrast is. Then, the contrast evaluation value is large when the focus is achieved as shown in the drawing on the right in FIG. 8A, whereas the contrast evaluation value is small when the focus is not achieved as shown in the drawing on the right in FIG. 8B.

Figure 9:
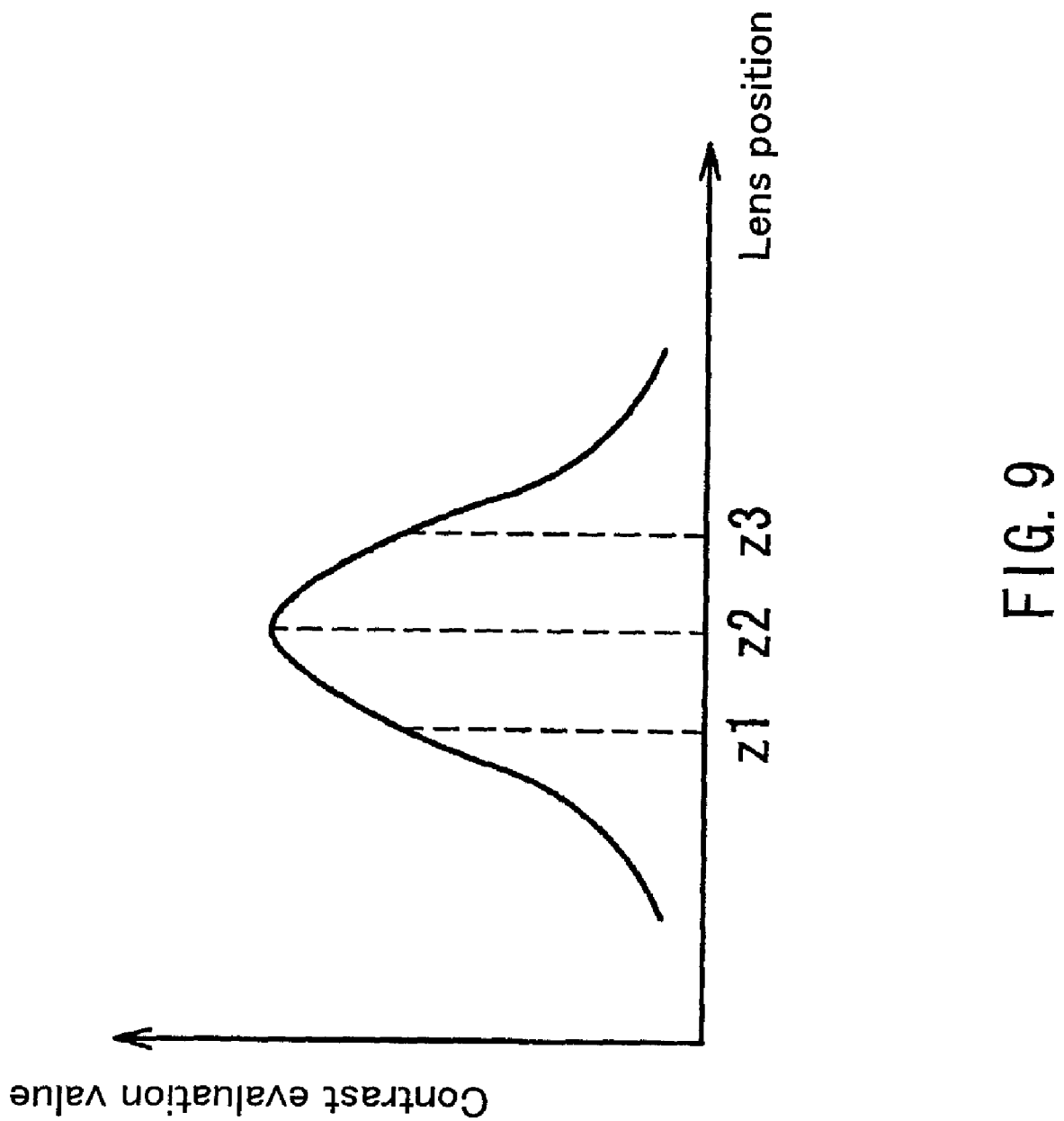
FIG. 9 is a drawing for describing the relationship between a lens position and the contrast evaluation value in the camera module according to Embodiment 1 of the present invention.

FIG. 9 is a drawing for describing the relationship between a lens position and the contrast evaluation value in the camera module according to Embodiment 1 of the present invention. At the time of shooting an object, when the distance between the lens 113 and the imaging device 123 is small (at z1), the focus is not achieved, so that the contrast evaluation value is small. As the distance between the lens 113 and the imaging device 123 is extended gradually, the contrast evaluation value increases gradually. When the focus is achieved (at z2), the contrast evaluation value is at a maximum. Further, as the distance between the lens 113 and the imaging device 123 is extended gradually (at z3), the focus is no longer achieved, so that the contrast evaluation value decreases. As described above, when the focus is achieved, the contrast evaluation value becomes maximal.

Figure 10:
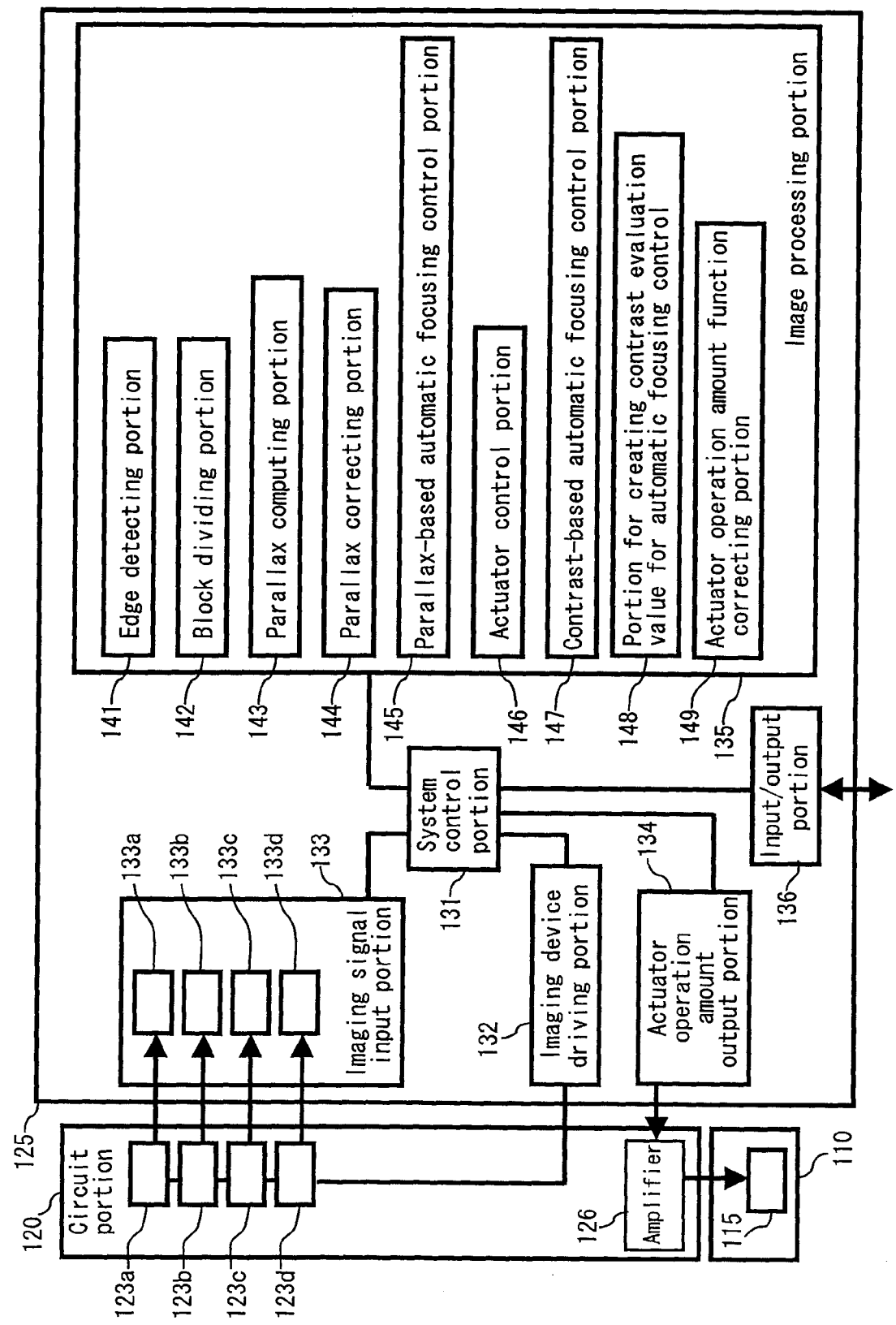
FIG. 10 is a block diagram showing the camera module according to Embodiment 1 of the present invention.

Now, an operation of the camera module according to Embodiment 1 of the present invention will be described. FIG. 10 is a block diagram showing the camera module according to Embodiment 1 of the present invention. The SLSI 125 includes a system control portion 131, an imaging device driving portion 132, an imaging signal input portion 133, an actuator operation amount output portion 134, an image processing portion 135 and an input/output portion 136. Also, the circuit portion 120 includes an amplifier 126 in addition to the configuration described above.

The amplifier 126 applies a voltage according to an output from the actuator operation amount output portion 134 to the coil of the actuator movable portion 115.

The system control portion 131 is configured by a CPU (central processing unit), a memory, etc. and controls the entire SLSI 125. The imaging device driving portion 132 is configured by a logic circuit, etc., generates a signal for driving the imaging device 123 and applies a voltage according to this signal to the imaging device 123.

The imaging signal input portion 133 includes a first imaging signal input portion 133a, a second imaging signal input portion 133b, a third imaging signal input portion 133c and a fourth imaging signal input portion 133d. The first imaging signal input portion 133a, the second imaging signal input portion 133b, the third imaging signal input portion 133c and the fourth imaging signal input portion 133d are each configured by connecting a CDS circuit (correlated double sampling circuit), an AGC (automatic gain controller) and an ADC (analog digital converter) in series. They are connected to the first imaging device 123a, the second imaging device 123b, the third imaging device 123c and the fourth imaging device 123d, respectively, supplied with electric signals from them, remove fixed noises with the CDS circuit, adjust gains with the AGC, convert analog signals into digital values with the ADC and write them into the memory in the system control portion 131.

The actuator operation amount output portion 134 is configured by a DAC (digital analog converter) and outputs a voltage signal according to a voltage to be applied to the coil of the actuator movable portion 115.

The image processing portion 135 is configured so as to include a logic circuit, a DSP or both of the logic circuit and the DSP and carries out various image processings utilizing memory information in the system control portion 131 according to a predetermined program control. The image processing portion 135 includes an edge detecting portion 141, a block division portion 142, a parallax computing portion 143, a parallax correcting portion 144, a parallax-based automatic focusing control portion 145, an actuator control portion 146, a contrast-based automatic focusing control portion 147, a portion 148 for computing a contrast evaluation value for automatic focusing control and an actuator operation amount function correcting portion 149.

The input/output portion 136 communicates with the main CPU (not shown) and outputs an image signal to the main CPU, an external memory (not shown) and an external display (not shown) such as a liquid crystal display.

Figure 11:
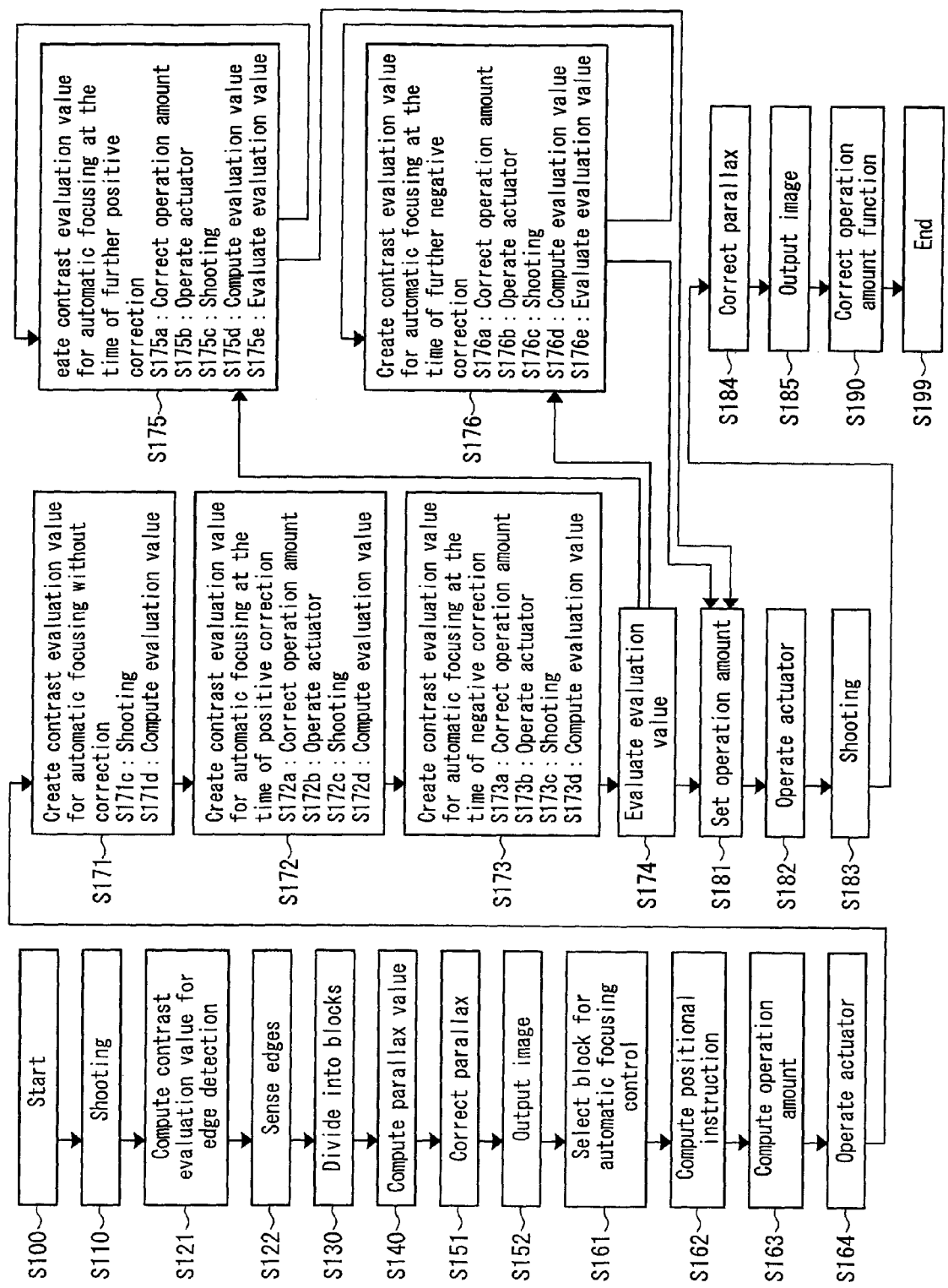
FIG. 11 is a flowchart showing an operation of the camera module according to Embodiment 1 of the present invention.

FIG. 11 is a flowchart showing the operation of the camera module according to Embodiment 1 of the present invention. The camera module 101 is operated as per this flowchart by the system control portion 131 of the SLSI 125.

In Step S100, the operation starts. For example, the main CPU (not shown) senses that a shutter button or the like is pressed down, and instructs the camera module to start operating via the input/output portion 136, whereby the camera module 101 starts operating. Next, Step S110 is executed.

Figure 12:
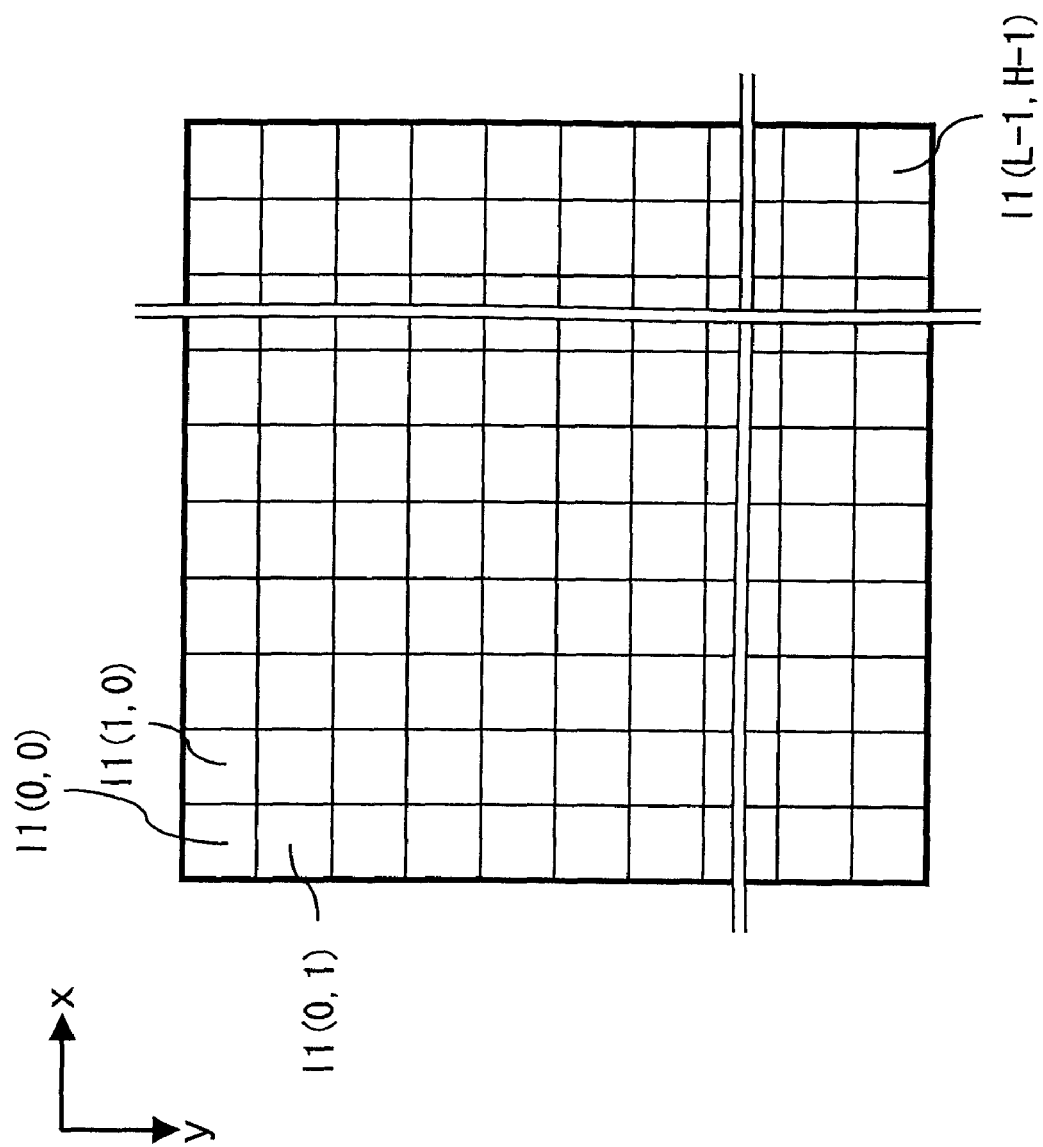
FIG. 12 is a drawing for describing coordinates of an imaging signal of the camera module according to Embodiment 1 of the present invention.

In Step S110, shooting is executed. On the instruction of the system control portion 131, the imaging device driving portion 132 outputs signals for an electronic shutter and transferring as necessary. The first imaging signal input portion 133a, the second imaging signal input portion 133b, the third imaging signal input portion 133c and the fourth imaging signal input portion 133d input imaging signals, which are analog signals of the images outputted respectively by the first imaging device 123a, the second imaging device 123b, the third imaging device 123c and the fourth imaging device 123d, in synchronization with the signals generated by the imaging device driving portion 132, remove fixed noises with the CDS, adjust input gains automatically with the AGC, convert the analog signals into digital values with the ADC, and write the digital values into the memory at a predetermined address in the system control portion 131 as a first imaging signal $I1(x,y)$, a second imaging signal $I2(x,y)$, a third imaging signal $I3(x,y)$ and a fourth imaging signal $I4(x,y)$. FIG. 12 is a drawing for describing coordinates of the imaging signal of the camera module according to Embodiment 1 of the present invention. $I1(x,y)$ indicates the first imaging signal, which is the x-th signal in a horizontal direction and the y-th signal in a vertical direction. In an image to be inputted, the number of pixels in the vertical direction is H, the number of pixels in the horizontal direction is L, and the total number of pixels is H×L. x varies from 0 to L−1, and y varies from 0 to H−1. This also holds true for the second imaging signal I2(x,y), the third imaging signal I3(x,y) and the fourth imaging signal I4(x,y). In other words, I2(x,y), I3(x,y) and I4(x,y) respectively indicate the second imaging signal, the third imaging signal and the fourth imaging signal, each of which is the x-th signal in the horizontal direction and the y-th signal in the vertical direction. In an image to be inputted, the number of pixels in the vertical direction is H, the number of pixels in the horizontal direction is L, and the total number of pixels is H×L. x varies from 0 to L−1, and y varies from 0 to H−1. Next, Step S121 is executed.

In Step S121 and Step S122, the edge detecting portion 141 utilizes data in the memory in the system control portion 131 and detects edges. Then, the edge detecting portion 141 writes the result into the memory in the system control portion 131. A detail will be described in the following.

Figure 13A:
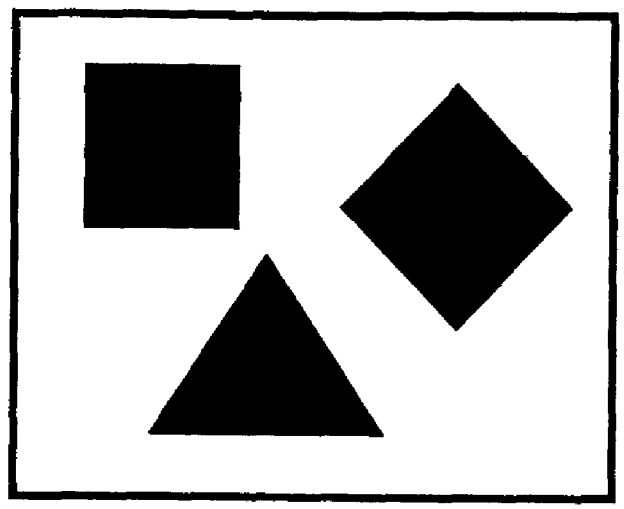
FIG. 13A shows an original image for describing an edge detection of the camera module according to Embodiment 1 of the present invention.
Figure 13B:
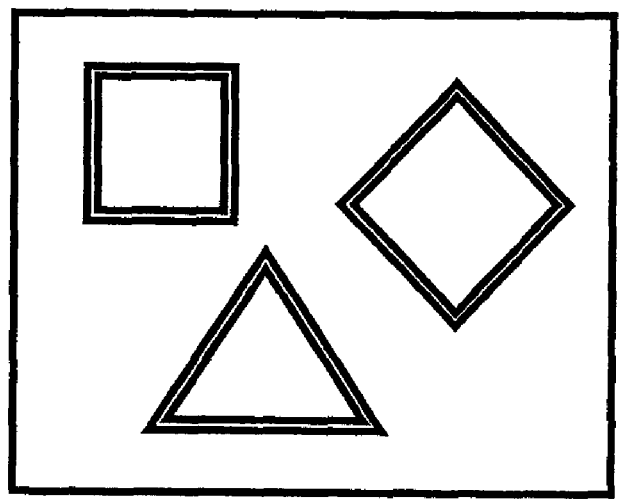
FIG. 13B shows an image of a contrast evaluation value for edge detection for describing the edge detection of the camera module according to Embodiment 1 of the present invention.

In Step S121, a contrast evaluation value for edge detection is computed. This computation is performed only for the first imaging signal. Laplacian is computed as per Equation (2) below and further is subjected spatially to a LPF (low-pass filter) as per Equation (3) below, and the result is given as a contrast evaluation value for edge detection C2(x,y). FIG. 13A shows an original image for describing the edge detection of the camera module according to Embodiment 1 of the present invention, and FIG. 13B shows an image of the contrast evaluation value for edge detection for describing the edge detection of the camera module according to Embodiment 1 of the present invention. From Equations (2) and (3), the contrast evaluation value for edge detection C2(x,y) of the original image in FIG. 13A is calculated, which is shown in FIG. 13B. It should be noted that black indicates where an absolute value of Equation (3) is large in FIG. 13B. Next, Step S122 is executed.

$$C1(x,y) = I1(x-1,y) + I1(x+1,y) + I1(x,y-1) + I1(x,y+1) - 4I1(x,y) \quad (2)$$

$$C2(x, y) = C1(x-1, y-1) + C1(x, y-1) + \\ C1(x+1, y-1) + C1(x-1, y) + C1(x, y) + C1(x+1, y) + \\ C1(x-1, y+1) + C1(x, y+1) + C1(x+1, y+1) \quad (3)$$

Figure 13C:
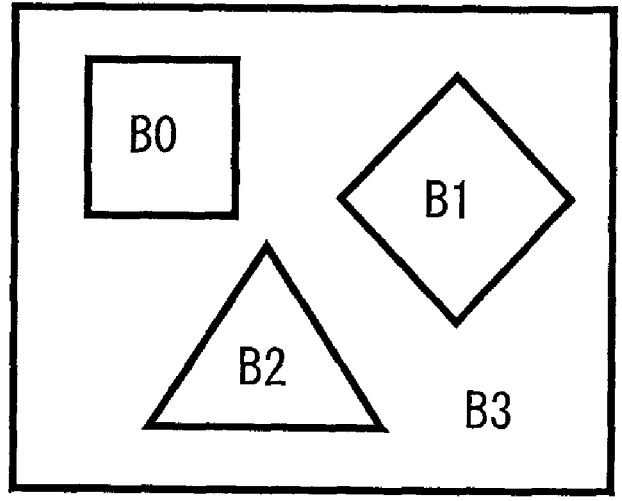
FIG. 13C shows an image of edges for describing the edge detection of the camera module according to Embodiment 1 of the present invention.

In Step S122, the edges are detected. FIG. 13C shows an image of the edges for describing the edge detection of the camera module according to Embodiment 1 of the present invention. By sensing a zero crossing (a point at which a value changes from positive to negative and a point at which a value changes from negative to positive) of the contrast evaluation value for edge detection C2(x,y) in FIG. 13B, it is possible to detect the edges as shown in FIG. 13C. Next, Step S130 is executed.

In Step S130, the block division portion 142 utilizes data in the memory in the system control portion 131 and carries out a division into blocks. Then, the block division portion 142 writes the result into the memory in the system control portion 131. As shown in FIG. 13C, numbers such as B0, B1, . . . , Bi, . . . , Bn are given to regions surrounded by the edges. Incidentally, in order to prevent erroneous detection and loss of the edges due to noise or the like, the edges also may be corrected using a dilation algorithm or an erosion algorithm. Next, Step S140 is executed.

Figure 14:
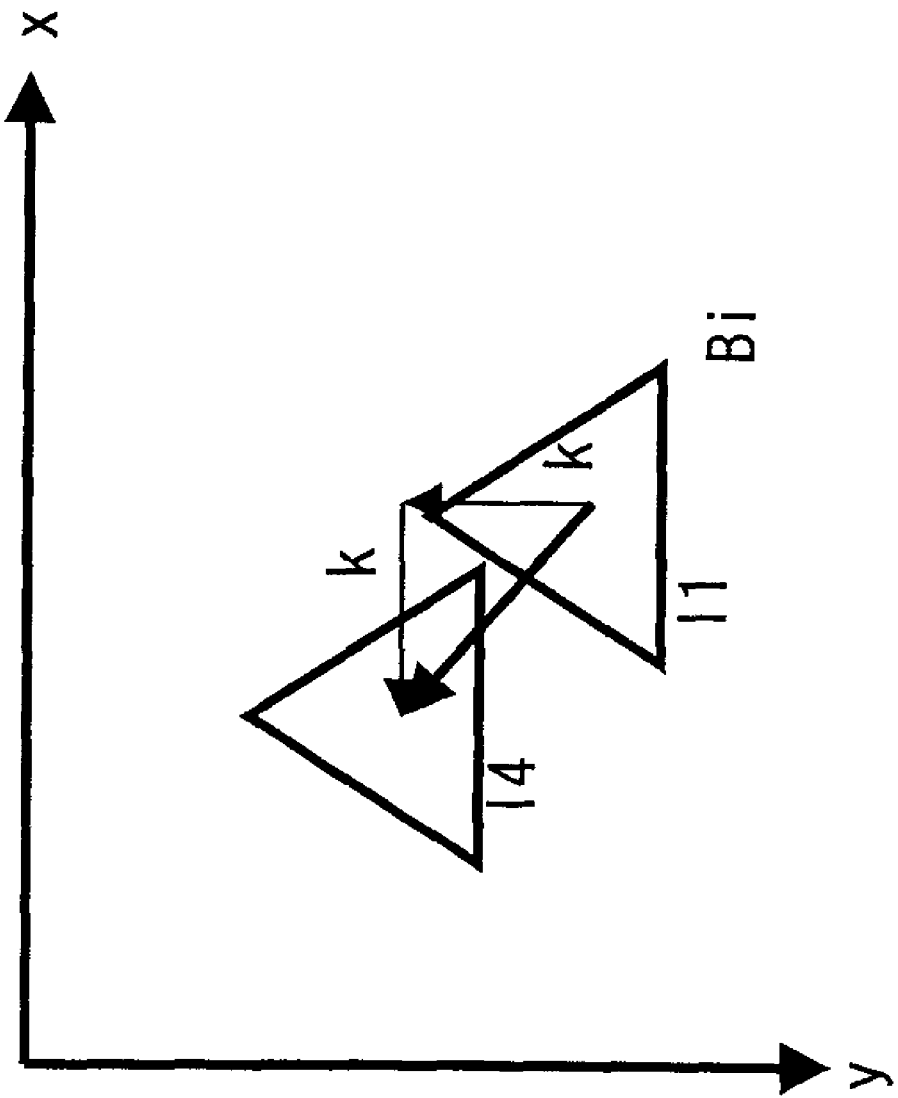
FIG. 14 is a drawing for describing computation regions of a parallax evaluation value in the camera module according to Embodiment 1 of the present invention.

In Step S140, the parallax computing portion 143 utilizes data in the memory in the system control portion 131 and computes a parallax value for each block. Then, the parallax computing portion 143 writes the parallax value into the memory in the system control portion 131. First, for each block (B0, B1, . . . , Bi, . . . , Bn), a parallax evaluation value (R0(k), R1(k), . . . , Ri(k), . . . , Rn(k); k=0, 1, . . . , m) is computed. FIG. 14 is a drawing for describing computation regions of the parallax evaluation value in the camera module according to Embodiment 1 of the present invention. A region indicated by Bi (also indicated by I1) is the i-th block obtained from the first imaging signal I1 in Step S130. A region indicated by I4 is a region obtained by moving Bi by k in an x direction and k in a y direction. Then, for all image signals I1(x,y) and I4(x,y) in these regions, the sum of absolute difference expressed by Equation (4) below is computed as a parallax evaluation value Ri(k).

$$Ri(k) = \Sigma\Sigma |I1(x,y) - I4(x-k,y-k)| \quad (4)$$

Figure 15:
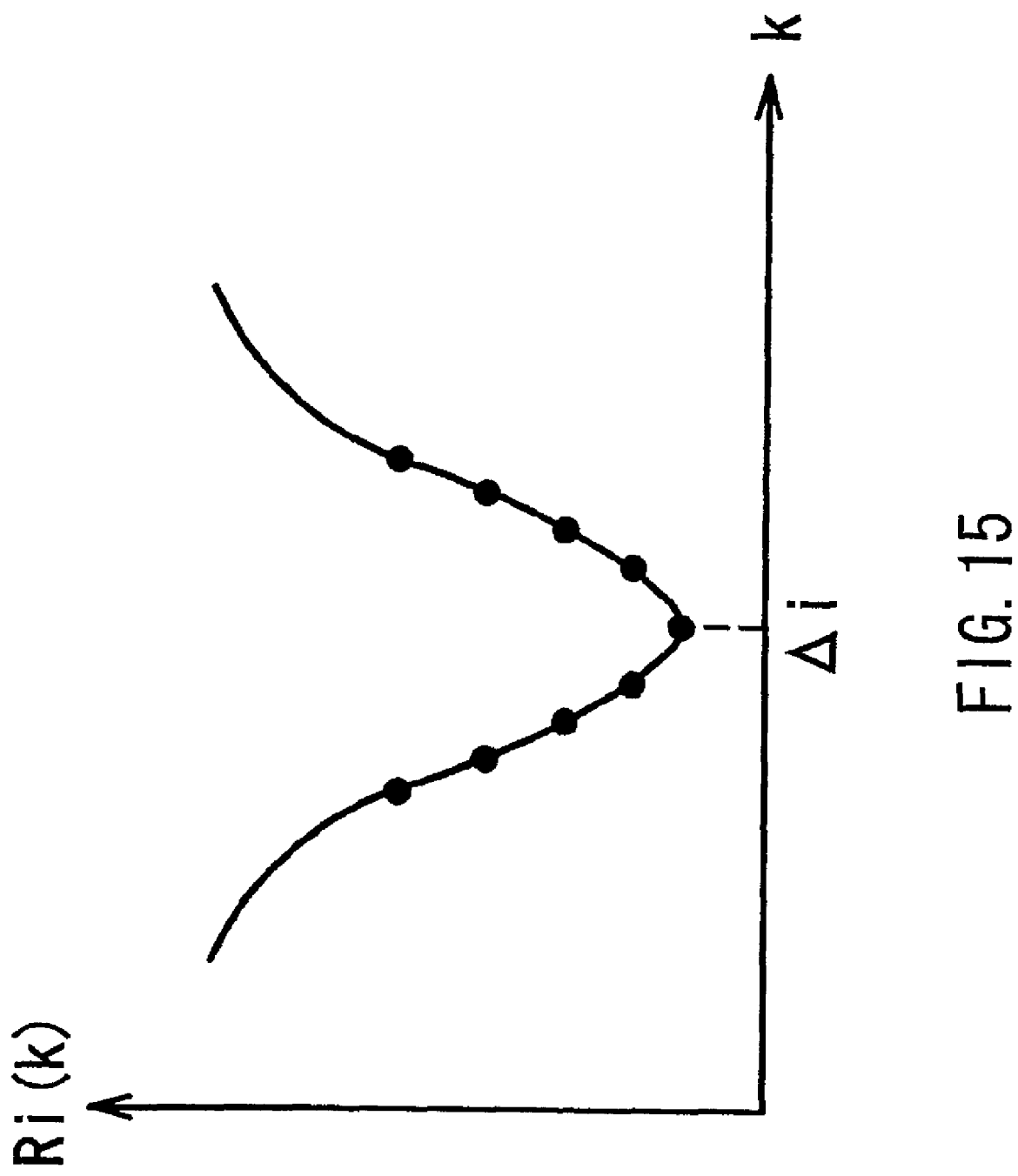
FIG. 15 is a drawing for describing the relationship between a parallax and a parallax evaluation value in the camera module according to Embodiment 1 of the present invention.

This parallax evaluation value Ri(k) indicates how the first image signal I1 of the i-th block B1 and the fourth image signal I4 in the region shifted therefrom by (k, k) respectively in the x and y directions are correlated. The smaller the parallax evaluation value Ri(k) is, the higher the correlation is (the higher the degree of similarity is). FIG. 15 is a drawing for describing the relationship between the parallax and the parallax evaluation value in the camera module according to Embodiment 1 of the present invention. As shown in FIG. 15, the parallax evaluation value Ri(k) varies with the value of k and is at a minimum when k=Δi. This indicates that an image signal of a block obtained by moving the i-th block Bi of the fourth image signal I4 by (−Δi, −Δi) respectively in the x and y directions has the highest correlation with (the highest degree of similarity to) the first image signal I1. Accordingly, it is understood that the parallax in the x and y directions between the first imaging signal I1 and the fourth imaging signal I4 for the i-th block is (Δi, Δi). In the following, this Δi is referred to as a parallax value Δi of the i-th block Bi. In this manner, the parallax values Δi of all the blocks Bi from i=0 to i=n are obtained. Next, Step S151 is executed.

In Step S151 and Step S152, a preview image is outputted.

In Step S151, the parallax correcting portion 144 utilizes data in the memory in the system control portion 131, carries out a parallax correction for each block using the parallax value corresponding to this block, and then performs an image synthesis. Then, the parallax correcting portion 144 writes the result into the memory in the system control portion 131. Since the first imaging device 123a and the fourth imaging device 123d mainly receive the green component of the object light, the first imaging signal I1 and the fourth imaging signal I4 are information signals of the green component of the object light. Also, since the second imaging device 123b mainly receives the blue component of the object light, the second imaging signal I2 is an information signal of the blue component of the object light. Further, since the third imaging signal 123c mainly receives the red component of the object light, the third imaging signal I3 is an information signal of the red component of the object light. Since the parallax between the first imaging device 123a and the fourth imaging device 123d is calculated to be (Δi, Δi), G(x,y) indicating the intensity of green at the pixel coordinates (x,y) is given by an average of the first imaging signal I1(x,y) and the fourth imaging signal I4(x−Δi,y−Δi) as in Equation (5) below. Also, since the parallax between the first imaging device 123a and the second imaging device 123b is calculated to be (Δi, 0), B(x,y) indicating the intensity of blue at the pixel coordinates (x,y) is given by the second imaging signal I2(x−Δi,y) as in Equation (6) below. Further, since the parallax between the first imaging device 123a and the third imaging device 123c is calculated to be (0,Δi), R(x,y) indicating the intensity of red at (x,y) is given by the third imaging signal I3(x,y−Δi) as in Equation (7) below. Incidentally, the parallax value Δi of the block Bi including the pixel coordinates (x,y) is used as the parallax value Δi. Next, Step S152 is executed.

$$G(x,y) = [I1(x,y) + I4(x - \Delta i, y - \Delta i)]/2 \quad (5)$$

$$B(x,y) = I2(x - \Delta i, y) \quad (6)$$

$$R(x,y) = I3(x, y - \Delta i) \quad (7)$$

In Step S152, an image is outputted. The input/output portion 136 outputs G(x,y), B(x,y) and R(x,y), which are data in the memory in the system control portion 131, to the main CPU (not shown) and the external display (not shown). It should be noted that a luminance signal or a color difference signal, for example, may be outputted instead of G(x,y), B(x,y) and R(x,y). Also, values after the image processings such as a white-balance correction and a γ correction may be outputted. Next, S161 is executed.

In Steps S161, S162 and S163, and S164 an automatic focusing control is carried out using the parallax value.

In Step 161, the parallax-based automatic focusing control portion 145 selects a block for automatic focusing control based on the data in the memory in the system control portion 131. Then, the parallax-based automatic focusing control portion 145 writes the result into the memory in the system control portion 131. For example, at least one block (for example, three blocks Bj1, Bj2 and Bj3) near the center of the image region is selected. Incidentally, these blocks do not have to be the ones near the center but may be the ones selected by reflecting an intention of a user operating the camera (for example, by detecting a viewpoint direction with a sensor). Next, Step S162 is executed.

In Step S162, a positional instruction of the actuator is computed. In the example described above, an average of the parallax values Δj1, Δj2 and Δj3 of the blocks Bj1, Bj2 and Bj3 serves as a parallax value for automatic focusing control Δaf as in Equation (8) below. It should be noted that weights may be assigned suitably by information such as how large the areas of the blocks are or whether the blocks are close to the center. Further, as in Equation (9) below, a positional instruction Xact of the actuator is computed. Incidentally, the positional instruction Xact indicates an instruction of a position in a direction toward the subject with respect to the position at which an infinity object is focused. Next, Step S163 is executed.

$$\Delta af = (\Delta j1 + \Delta j2 + \Delta j3)/3 \quad (8)$$

$$X\text{act} = kx \cdot \Delta af \quad (9)$$

In Step S163, the actuator control portion 146 computes an actuator operation amount (a voltage to be applied to the coil of the actuator movable portion 115) Vact using an operation amount function expressed by Equation (10) below. Also, the actuator control portion 146 stores the actuator operation amount as Vact0 for learning an operation amount function as described later. Next, Step S164 is executed.

$$V\text{act} = ka \cdot X\text{act} + kb \quad (10)$$

$$V\text{act0} = V\text{act} \quad (10')$$

In Step S164, the actuator is operated. The actuator operation amount output portion 134 changes a voltage signal to be outputted so that a voltage applied to the coil (not shown) of the actuator movable portion 115 via the amplifier 126 is Vact. Next, Step S171 is executed.

In Steps S171, S172, S173, S174, S175 and S176, the contrast-based automatic focusing control portion 147 carries out an automatic focusing control using the contrast. As shown in FIG. 9 described earlier, the contrast evaluation value is at a maximum at the position where the focus is achieved. Using this principle, a search is made for an actuator operation amount with which the contrast evaluation value becomes maximal.

In Step S171, a contrast evaluation value for automatic focusing control without a correction of the actuator operation amount is created. Step S171 includes Step S171c and Step S171d. First, Step S171c is executed.

In Step S171c, shooting is executed. This operation is similar to that in Step S110. However, it may be possible to transfer only the imaging signal I1 of the block for automatic focusing control selected in S161 out of the imaging signals I1 from the first imaging device 123a. In this case, a transfer time can be shortened compared with the case of transferring all the imaging signals. Next, Step S171d is executed.

In Step S171d, the portion 148 for computing a contrast evaluation value for automatic focusing control creates a contrast evaluation value for automatic focusing control using the data in the memory in the system control portion 131. This computation is performed only for the first imaging signal I1 of the block for automatic focusing control. An absolute value of Laplacian is computed as per Equation (11) below and further is subjected spatially to a LPF (low-pass filter) as per Equation (12) below, and the result is averaged in the block for automatic focusing control as per Equation (13) below, thereby obtaining a contrast evaluation value for automatic focusing C5. Here, N represents the number of C4(x,y) in the block for automatic focusing control. Then, as per Equation (14) below, the contrast evaluation value C5 at this time is given as C50 and written into the memory in the system control portion 131. Next, Step S172 is executed.

$$C3(x, y) = \quad (11)$$
$$|I1(x-1, y) + I1(x+1, y) + I1(x, y-1) + I1(x, y+1) - 4I1(x, y)|$$

$$C4(x, y) = C3(x-1, y-1) + C3(x, y-1) + \quad (12)$$
$$C3(x+1, y-1) + C3(x-1, y) + C3(x, y) + C3(x+1, y) +$$
$$C3(x-1, y+1) + C3(x, y+1) + C3(x+1, y+1)$$

$$C5 = \Sigma C4(x, y)/N \quad (13)$$

$$C50 = C5 \quad (14)$$

In Step 172, the contrast evaluation value for automatic focusing control at the time of positive correction of the actuator operation amount is created. Step S172 includes Step S172a, Step S172b, Step S172c and Step S172d. First, Step S172a is executed.

In Step S172a, an actuator operation amount at the time of positive correction Vact is obtained by adding dVact to the actuator operation amount (the voltage to be applied to the coil of the actuator fixing portion 114) without a correction Vact0 as per Equation (15) below and stored in the memory as Vactp as per Equation (16) below. Next, Steps S172b, S172c and S172d are executed.

$$V\text{act} = V\text{act0} + dV\text{act} \quad (15)$$

$$V\text{actp} = V\text{act} \quad (16)$$

In Step S172b, the actuator is operated. In Step S172c, shooting is executed. In Step S172d, the contrast evaluation value for automatic focusing control is created. The operation in Step S172b is similar to that in Step S164. Also, the operations in Steps S172c and S172d are similar to those in Steps S171c and S171d. The contrast evaluation value C5 is given as a contrast evaluation value for automatic focusing after positive correction C5p as per Equation (17) below and written into the memory in the system control portion 131. Next, Step S173 is executed.

$$C5p = C5 \quad (17)$$

In Step 173, the contrast evaluation value for automatic focusing control at the time of negative correction of the actuator operation amount is created. Step S173 includes Step S173a, Step S173b, Step S173c and Step S173d. First, Step S173a is executed.

In Step S173a, an actuator operation amount at the time of negative correction Vact is obtained by subtracting dVact from the actuator operation amount (the voltage to be applied to the coil of the actuator fixing portion 114) without a correction Vact0 as per Equation (18) below and stored in the memory as Vactn as per Equation (19) below. Next, Steps S173b, S173c and S173d are executed.

$$Vact = Vact0 - dVact \quad (18)$$

$$Vactn = Vact \quad (19)$$

In Step S173b, the actuator is operated. In Step S173c, shooting is executed. In Step S173d, the contrast evaluation value for automatic focusing control is created. The operations similar to those in Step S172b, Step S172c and Step S172d are carried out. The contrast evaluation value C5 is given as a contrast evaluation value for automatic focusing after negative correction C5n as per Equation (20) below and written into the memory in the system control portion 131. Next, Step S174 is executed.

$$C5n = C5 \quad (20)$$

In Step S174, the contrast evaluation values for focusing control are evaluated. C50, C5p and C5n are compared, and the operation is branched according to which has the maximum value.

Figure 16A:
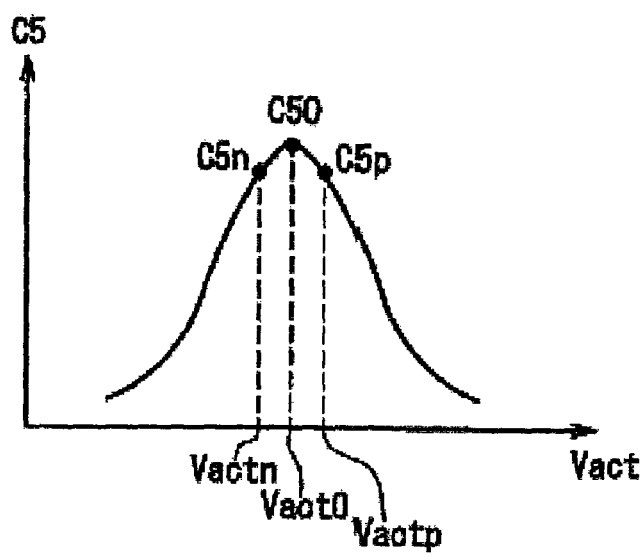
FIG. 16A is a drawing for describing the relationship between an actuator operation amount and a contrast evaluation value when the contrast evaluation value is at a maximum without correction in the camera module according to Embodiment 1 of the present invention.

When C50 is the maximum value, the following operation is carried out, and then Step S181 is executed. FIG. 16A is a drawing for describing the relationship between the actuator operation amount and the contrast evaluation value when the contrast evaluation value is at a maximum without correction in the camera module according to Embodiment 1 of the present invention. As shown in FIG. 16A, the actuator operation amount without correction Vact0 gives substantially the maximum value of the contrast evaluation value for automatic focusing control C5. Therefore, as in Equation (21) below, Vact0 serves as a final actuator operation amount Vactf.

$$Vactf = Vact0 \text{(when C50 is the maximum value)} \quad (21)$$

Figure 16B:
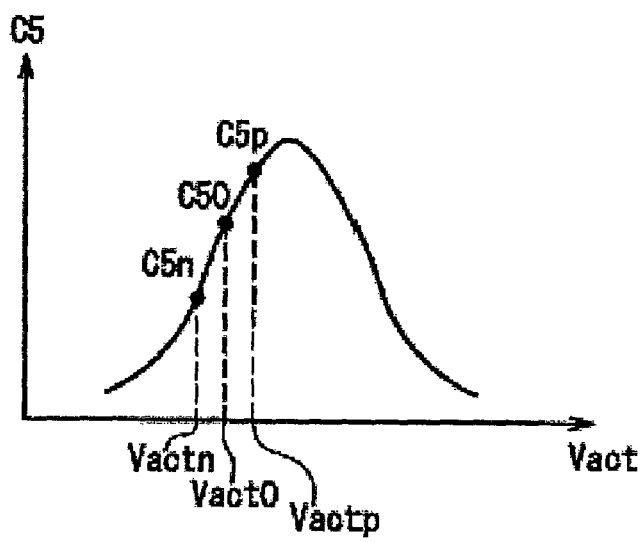
FIG. 16B is a drawing for describing the relationship between the actuator operation amount and the contrast evaluation value when the contrast evaluation value after positive correction is at a maximum.

When C5p is the maximum value, the following operation is carried out, and then Step S175 is executed. FIG. 16B is a drawing for describing the relationship between the actuator operation amount and the contrast evaluation value when the contrast evaluation value after positive correction is at a maximum in the camera module according to Embodiment 1 of the present invention. As shown in FIG. 16B, the actuator operation amount after positive correction Vactp or the actuator operation amount after a further positive correction Vact gives substantially the maximum value of the contrast evaluation value for automatic focusing control C5. Therefore, the actuator operation amount is corrected further toward the positive side, and a search is made for the maximum value. Incidentally, as in Equation (22) below, C5p serves as a previous value and is stored as C5pp.

$$C5pp = C5p \quad (22)$$

Figure 16C:
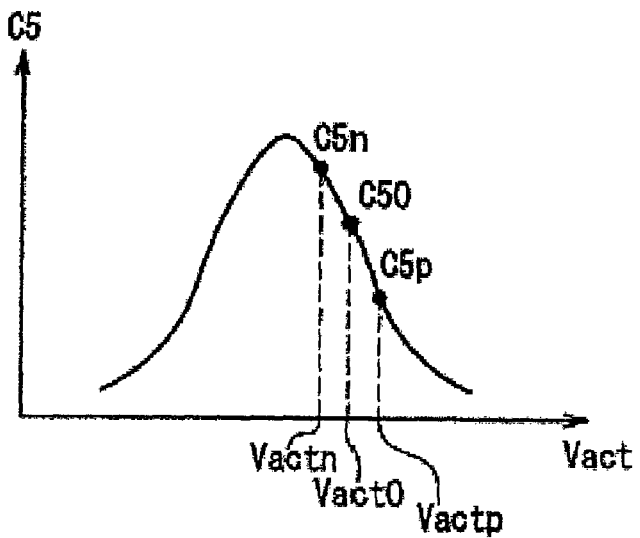
FIG. 16C is a drawing for describing the relationship between the actuator operation amount and the contrast evaluation value when the contrast evaluation value after negative correction is at a maximum.

When C5n is the maximum value, the following operation is carried out, and then Step S176 is executed. FIG. 16C is a drawing for describing the relationship between the actuator operation amount and the contrast evaluation value when the contrast evaluation value after negative correction is at a maximum in the camera module according to Embodiment 1 of the present invention. As shown in FIG. 16C, the actuator operation amount after negative correction Vactn or the actuator operation amount after a further negative correction Vact gives substantially the maximum value of the contrast evaluation value for automatic focusing control C5. Therefore, the actuator operation amount is corrected further toward the negative side, and a search is made for the maximum value. Incidentally, as in Equation (23) below, C5n serves as a previous value and is stored as C5np.

$$C5np = C5n \quad (23)$$

In Step S175, the contrast evaluation value for automatic focusing at the time of the further positive correction is created and evaluated. Step S175 includes Step S175a, Step S175b, Step S175c, Step S175d and Step S175e. First, Step S175a is executed.

In Step S175a, an actuator operation amount at the time of positive correction Vact is obtained by adding dVact to the actuator operation amount (the voltage to be applied to the coil of the actuator fixing portion 114) after the previous positive correction Vactp as per Equation (24) below and stored in the memory as Vactp as per Equation (25) below. Next, Steps S175b, S175c and S175d are executed.

$$Vact = Vactp + dVact \quad (24)$$

$$Vactp = Vact \quad (25)$$

In Step S175b, the actuator is operated. In Step S175c, shooting is executed. In Step S175d, the contrast evaluation value for automatic focusing control is created. The operations similar to those in Step 172b, Step S172c and Step S172d are carried out. The contrast evaluation value C5 is given as a contrast evaluation value for automatic focusing after positive correction C5p as per Equation (26) below and written into the memory in the system control portion 131. Next, Step S175e is executed.

$$C5p = C5 \quad (26)$$

In Step S175e, the contrast evaluation values for focusing control are evaluated. C5pp and C5p are compared, and the operation is branched according to which has the maximum value.

Figure 17A:
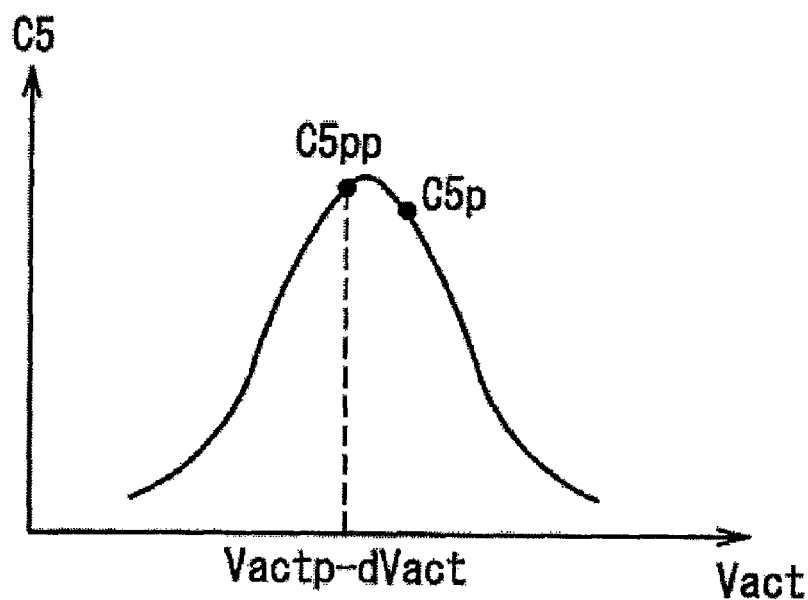
FIG. 17A is a drawing for describing the relationship between the actuator operation amount and the contrast evaluation value when the contrast evaluation value before a further positive correction is at a maximum in the case where this further positive correction is performed in the camera module according to Embodiment 1 of the present invention.

When C5pp is the maximum value, the following operation is carried out, and then Step S181 is executed. FIG. 17A is a drawing for describing the relationship between the actuator operation amount and the contrast evaluation value when the contrast evaluation value before the further positive correction is at a maximum in the case where this further positive correction is performed in the camera module according to Embodiment 1 of the present invention. As shown in FIG. 17A, the actuator operation amount after the previous positive correction Vactp−dVact gives substantially the maximum value of the contrast value for automatic focusing control C5. Therefore, as in Equation (27) below, Vactp−dVact serves as the final actuator operation amount Vactf.

$$Vactf = Vactp - dVact \text{(when C5pp is the maximum value)} \quad (27)$$

Figure 17B:
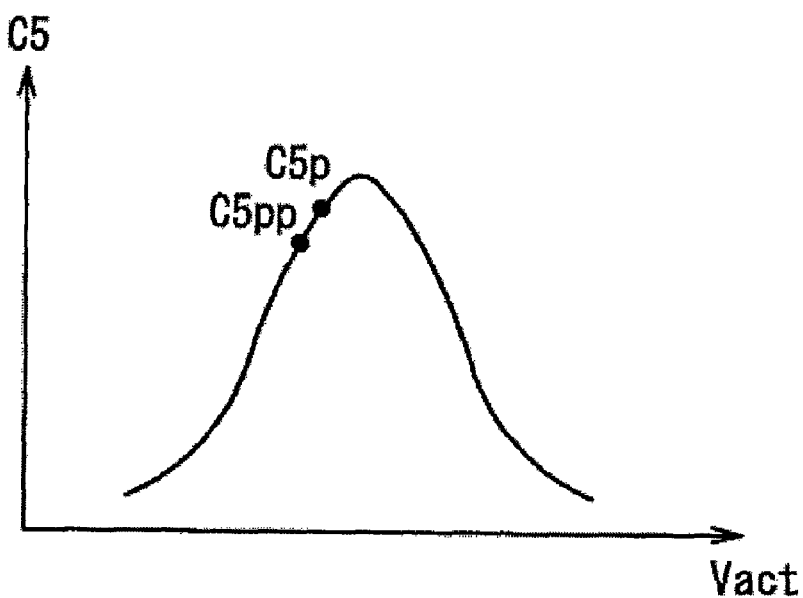
FIG. 17B is a drawing for describing the relationship between the actuator operation amount and the contrast evaluation value when the contrast evaluation value after a further positive correction is at a maximum in the case where this further positive correction is performed.

When C5p is the maximum value, the following operation is carried out, and then Step S175a is executed. FIG. 17B is a drawing for describing the relationship between the actuator operation amount and the contrast evaluation value when the contrast evaluation value after the further positive correction is at a maximum in the case where this further positive correction is performed in the camera module according to Embodiment 1 of the present invention. As shown in FIG. 17B, the actuator operation amount after the current positive correction Vactp or the actuator operation amount after a further positive correction Vact gives substantially the maximum value of the contrast evaluation value for automatic focusing control C5. Therefore, the actuator operation amount is corrected further toward the positive side, and a search is made for the maximum value. Incidentally, as in Equation (28) below, C5p serves as a previous value and is stored as C5pp.

$$C5pp=C5p \qquad (28)$$

In Step S176, the contrast evaluation value for automatic focusing at the time of the further negative correction is created and evaluated. Step S176 includes Step S176a, Step S176b, Step S176c, Step S176d and Step S176e. First, Step S176a is executed.

In Step S176a, an actuator operation amount at the time of negative correction Vact is obtained by subtracting dVact from the actuator operation amount (the voltage to be applied to the coil of the actuator fixing portion 114) after the previous negative correction Vactn as per Equation (29) below and stored in the memory as Vactn as per Equation (30) below. Next, Steps S176b, S176c and S176d are executed.

$$Vact=Vactn-dVact \qquad (29)$$

$$Vactn=Vact \qquad (30)$$

In Step S176b, the actuator is operated. In Step S176c, shooting is executed. In Step S176d, the contrast evaluation value for automatic focusing control is created. The operations similar to those in Step 172b, Step S172c and Step S172d are carried out. The contrast evaluation value C5 is given as a contrast evaluation value for automatic focusing after negative correction C5n as per Equation (31) below and written into the memory in the system control portion 131. Next, Step S176e is executed.

$$C5n=C5 \qquad (31)$$

In Step S176e, the contrast evaluation values for focusing control are evaluated. C5np and C5n are compared, and the operation is branched according to which has the maximum value.

Figure 18A:
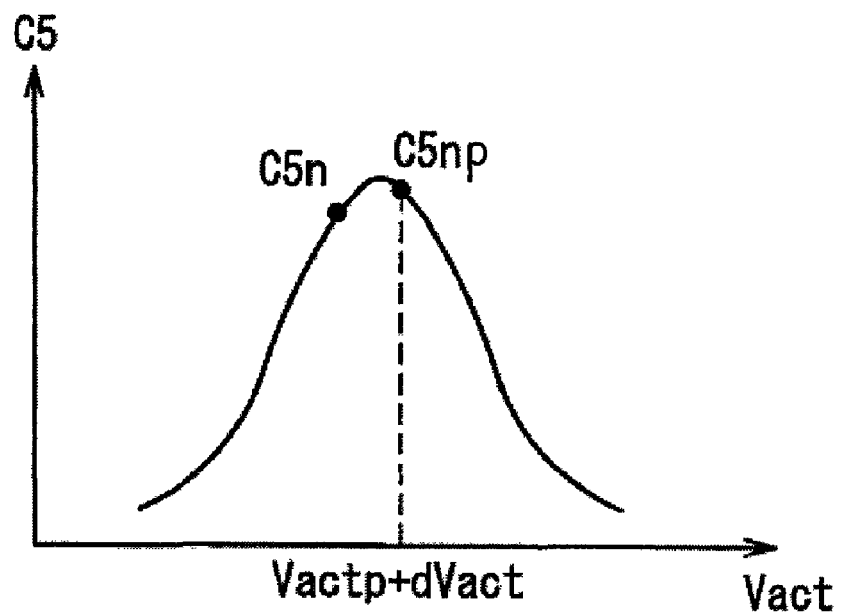
FIG. 18A is a drawing for describing the relationship between the actuator operation amount and the contrast evaluation value when the contrast evaluation value before the further negative correction is at a maximum in the case where this further negative correction is performed in the camera module according to Embodiment 1 of the present invention.

When C5np is the maximum value, the following operation is carried out, and then Step S181 is executed. FIG. 18A is a drawing for describing the relationship between the actuator operation amount and the contrast evaluation value when the contrast evaluation value before the further negative correction is at a maximum in the case where this further negative correction is performed in the camera module according to Embodiment 1 of the present invention. As shown in FIG. 18A, the actuator operation amount after the previous negative correction Vactn+dVact gives substantially the maximum value of the contrast value for automatic focusing control C5. Therefore, as in Equation (32) below, Vactn+dVact serves as the final actuator operation amount Vactf $$Vactf=Vactn+dVact(\text{when } C5np \text{ is the maximum value}) \qquad (32)$$

Figure 18B:
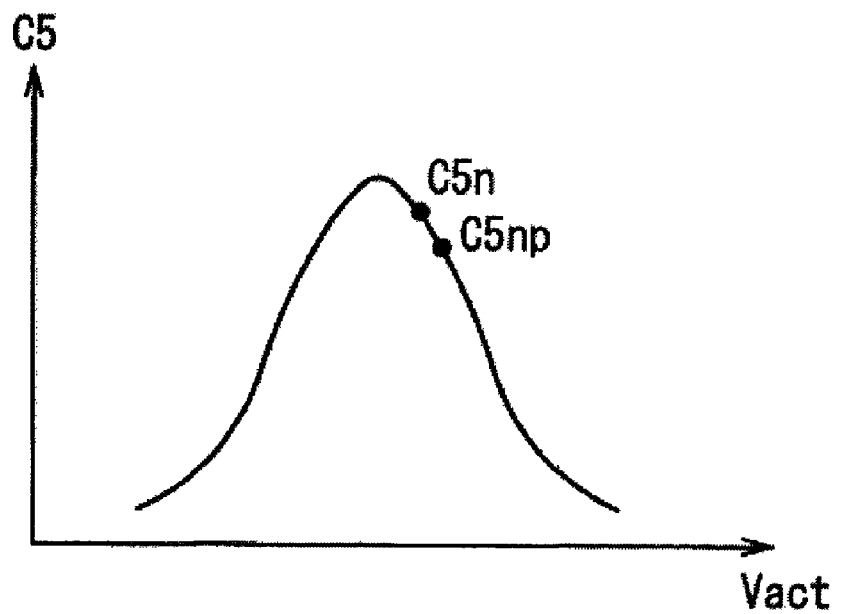
FIG. 18B is a drawing for describing the relationship between the actuator operation amount and the contrast evaluation value when the contrast evaluation value after the further negative correction is at a maximum in the case where this further negative correction is performed.

When C5n is the maximum value, the following operation is carried out, and then Step S176a is executed. FIG. 18B is a drawing for describing the relationship between the actuator operation amount and the contrast evaluation value when the contrast evaluation value after the further negative correction is at a maximum in the case where this further negative correction is performed in the camera module according to Embodiment 1 of the present invention. As shown in FIG. 18B, the actuator operation amount after the current negative correction Vactn or the actuator operation amount after a further negative correction Vact gives substantially the maximum value of the contrast evaluation value for automatic focusing control C5. Therefore, the actuator operation amount is corrected further toward the negative side, and a search is made for the maximum value. Incidentally, as in Equation (33) below, C5n serves as a previous value and is stored as C5np.

$$C5np=C5n \qquad (33)$$

In Steps S181, S182, S183, S184 and S185, a final shooting and an image output are performed.

In Step S181, as in Equation (34) below, the final actuator operation amount Vactf obtained above is set as the actuator operation amount Vact. Next, Step S182 is executed.

$$Vact=Vactf \qquad (34)$$

In S182, the actuator is operated. The operation in this step is similar to that in Step S164. Next, Step S183 is executed.

In Step S183, shooting is performed. The operation in this step is similar to that in Step S110. Next, Step S184 is executed.

In Step S184, a parallax correction is carried out for each block using the parallax value corresponding to this block, and then an image synthesis is performed. The operation in this step is similar to that in Step S151. Next, Step S185 is executed.

In Step S185, an image is outputted. The operation in this step is similar to that in S152. Next, Step S190 is executed.

In Step S190, the actuator operation amount function correcting portion 149 corrects an operation amount function based on a correction value for a contrast-based automatic focusing control. In other words, a coefficient kb of the operation amount function is corrected as per Equation (35) below so as to change a value written in the memory in the system control portion 131. This value is used at the time of the next shooting. Next, Step S199 is executed.

$$kb=kb+kc\cdot(Vactf-Vact0) \qquad (35)$$

In Step S199, the processing ends.

With the above-described configuration and operations, the following effects are achieved.

In the camera module according to Embodiment 1, as in Steps S161, S162, S163 and S164, the actuator positional instruction Xact is created based on the parallax value Δaf for automatic focusing control, the actuator operation amount Vact is computed, and a voltage is applied to the coil of the actuator fixing portion 114 so as to operate the actuator, thereby carrying out the automatic focusing control. In this manner, a focus is achieved by a single actuator operation, thus allowing a high-speed automatic focusing control.

Also, in the camera module according to Embodiment 1, first, in Steps S161, S162, S163 and S164, the actuator is operated based on the parallax so as to carry out the automatic focusing control. Subsequently, in Steps S171, S172, S173, S174, S175 and S176, the actuator is operated based on the contrast so as to carry out the automatic focusing control. The automatic focusing control based on the parallax is performed at a high speed, because the focus is achieved by a single actuator operation. On the other hand, the automatic focusing control based on the contrast is not susceptible to variations of the actuator and thus is highly accurate, because the focus achievement is judged directly from the image. Consequently, since a coarse adjustment is made by the high-speed automatic focusing control based on the parallax and a fine adjustment is made by the highly-accurate automatic focusing control based on the contrast, it is possible to achieve a high-speed and highly-accurate automatic focusing control.

Further, in the camera module according to Embodiment 1, in Step S190, learning is conducted so as to correct the coefficient kb of the operation amount function based on the actuator operation amount (Vactf−Vact0) corrected in the contrast-based automatic focusing control. This makes it possible to correct the operation amount function in a more accurate manner even when there are variations in the actuator, achieve a more accurate parallax-based automatic focusing control and reduce the number of the next fine adjustments by the contrast-based automatic focusing control, so that a higher-speed automatic focusing control can be achieved.

As in Equation (1), the relative positions of the four object images formed respectively by the first lens portion 113a, the second lens portion 113b, the third lens portion 113c and the fourth lens portion 113d vary according to the subject distance A. In other words, when the subject distance A decreases, the parallax Δ increases. Accordingly, when a plurality of subjects at different distances are shot at the same time, the parallaxes A for the individual subjects are different. In the camera module according to Embodiment 1, the entire image region is divided into blocks in Step S130, the parallax for each block is computed in Step S140, and the parallax correction is carried out by the image synthesis based on the parallax for each block so as to reduce the parallactic influence in Step S184. In this manner, even when a plurality of subjects at different distances are shot at the same time, it is possible to correct the parallaxes of the individual subjects suitably, thereby achieving a beautiful image with reduced parallactic influence over the entire image region.

Moreover, in the camera module according to Embodiment 1, the edges are detected in Steps S121 and S122, and the division into blocks is carried out in Step S130. This allows a suitable division into blocks, making it possible to achieve a beautiful image with reduced parallactic influence over the entire image region.

Incidentally, although the computed parallaxes are used as they are in the camera module according to Embodiment 1, they also may be limited suitably. Depending on the lens characteristics, the image becomes unclear when the subject distance A is smaller than a certain value. Accordingly, by setting this value as the minimum value of the subject distance A, the maximum value of the parallax Δ can be determined. A parallax larger than this value may be ignored as being an error. Also, in this case, a value with the second smallest parallax evaluation value may be adopted as the parallax.

Furthermore, in the camera module according to Embodiment 1, the parallax is computed from the first imaging signal I1 (mainly indicating green) and the fourth imaging signal I4 (mainly indicating green). However, the present invention is not limited to this. For example, in the case where a violet subject contains a smaller green component and larger blue and red components and thus the computation from the first imaging signal I1 (mainly indicating green) and the fourth imaging signal I4 (mainly indicating green) is not possible, the parallax also may be computed from the second imaging signal I2 (mainly indicating blue) and the third imaging signal I3 (mainly indicating red). Further, if the parallax cannot be computed from the first imaging signal I1 (mainly indicating green) and the fourth imaging signal I4 (mainly indicating green) and the parallax cannot be computed from the second imaging signal I2 (mainly indicating blue) and the third imaging signal I3 (mainly indicating red), it is appropriate to consider that no parallactic influence is present and there is no parallax.

Also, when the camera module according to Embodiment 1 is mounted on a camera, the first to fourth imaging devices 123a to 123d are arranged so that the second imaging device 123b is located on an upper side and the third imaging device 123c is located on a lower side, whereby the upper side is sensitive to blue and the lower side is sensitive to red. Consequently, it is possible to achieve a more natural color reproduction for landscape photographs.

Further, when the parallax evaluation value has two prominent maximum values, the parallax for the larger may be adopted. Two maximum values appear because such a block contains a subject and a background and the subject distance and the background distance are different. Since the subject distance is smaller than the background distance, the parallax of the subject is larger than that of the background. Here, by adopting the larger parallax, the parallactic influence of the subject, which affects an image quality directly, can be reduced, though the parallactic influence of the background cannot be reduced.

Also, the timing of the image output is not limited to the above, and a preview may be outputted suitably. For example, after shooting in Step S110, an image without parallax correction may be outputted. Further, in the block division in Step S130, when one block is divided, the result thereof may be reflected to update a preview screen.

Moreover, the camera module according to Embodiment 1 operates the actuator based on the parallax in S164 and then operates the actuator based on the contrast in S171, S172, S173, S175 and S182. However, the actuator may be operated only based on the parallax. The reason is that, in the case of using a lens with a large depth of focus, a slight error in the distance between the lens and the imaging device can be tolerated, and thus there is no need to operate the actuator based on the contrast so as to improve the accuracy.

Further, although the camera module according to Embodiment 1 corrects the correction amount function in S190, namely, conducts learning based on the operation amount at the time of operating the actuator based on the contrast, this step also may be omitted. Since the actuator of the camera module according to Embodiment 1 is of a voice coil type, the movement amount of the lens varies with changes in temperature and orientation, so that the accuracy improves considerably by learning. However, in the case of using a stepping motor, since the movement amount of the lens does not vary very much with changes in temperature and orientation, the learning may be omitted.

Moreover, there may be some cases where the focusing control by the parallax is performed but the actuator is not operated. For example, the relative distance between the lens and the imaging device is set in advance to the distance at which the focus is achieved at the time of shooting an infinity object. Then, when the parallax is small, it may be considered unnecessary to operate the actuator, thus choosing not to operate the actuator.

Furthermore, it also may be possible to add an operation of repeating the block division and updating the blocks suitably. For example, in Embodiment 1, after shooting in S183, it may be possible to update the blocks by conducting S121, S122 and S130 and then perform the parallax correction in Step S184.

Embodiment 2

A camera module according to Embodiment 2 of the present invention achieves a beautiful image with a reduced parallactic influence over an entire image region by detecting a parallax of an edge using contrasts of a plurality of images, computing a parallax of the entire image region based on that parallax, performing an image synthesis so as to reduce a parallactic influence based on this parallax and performing a parallax correction.

The camera module according to Embodiment 2 of the present invention will be described, with reference to the accompanying drawings.

Figure 19:
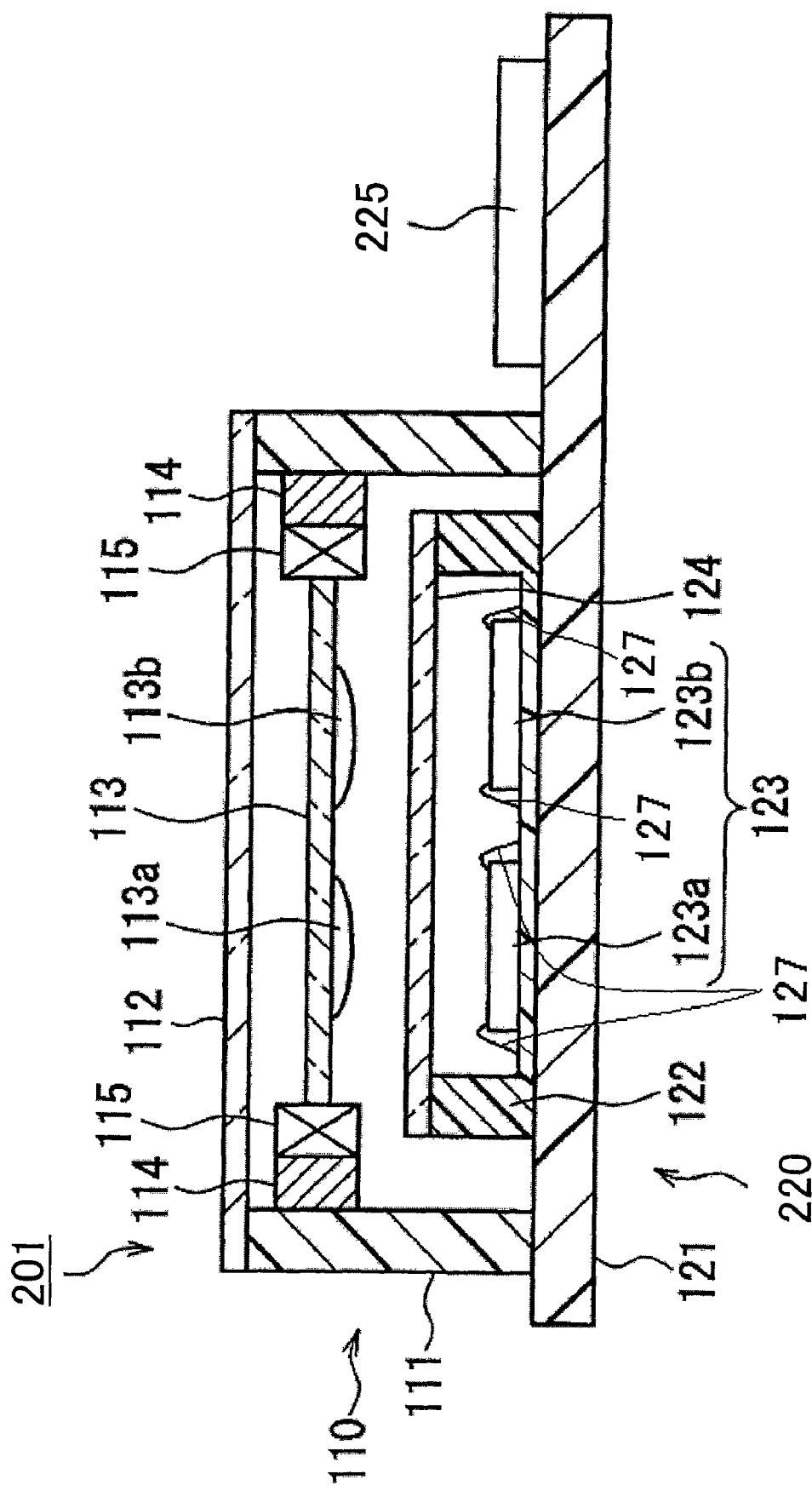
FIG. 19 is a sectional view showing a configuration of a camera module according to Embodiment 2 of the present invention.

FIG. 19 is a sectional view showing a configuration of the camera module according to Embodiment 2 of the present invention. The configuration is similar to that of Embodiment 1 except for an SLSI 225 of a circuit portion 220 of a camera module 201. Members similar to those in Embodiment 1 are assigned the same reference numerals, and the description thereof will be omitted.

Figure 20:
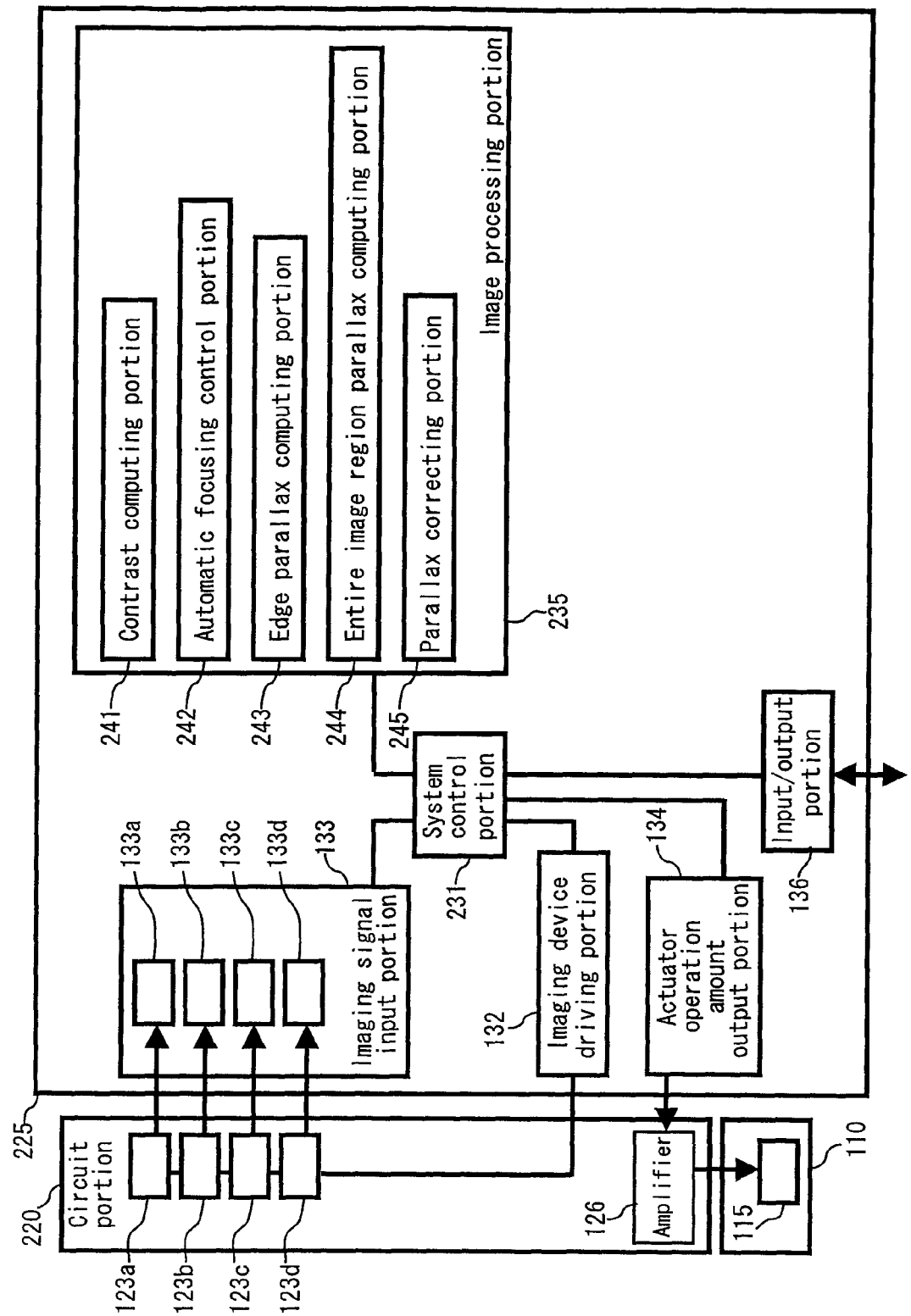
FIG. 20 is a block diagram showing the camera module according to Embodiment 2 of the present invention.

FIG. 20 is a block diagram showing the camera module according to Embodiment 2 of the present invention. The SLSI 225 includes a system control portion 231, an imaging device driving portion 132, an imaging signal input portion 133, an actuator operation amount output portion 134, an image processing portion 235 and an input/output portion 136. Also, the circuit portion 220 includes an amplifier 126 in addition to the configuration described above.

The system control portion 231 is configured by a CPU, a memory, etc. and controls the entire SLSI 225.

The image processing portion 235 is configured so as to include a logic circuit, a DSP or both of the logic circuit and the DSP and carries out various image processings utilizing memory information in the system control portion 231. The image processing portion 235 includes a contrast computing portion 241, an automatic focusing control portion 242, an edge parallax computing portion 243, an entire image region parallax computing portion 244 and a parallax correcting portion 245.

The imaging device driving portion 132, the imaging signal input portion 133, the actuator operation amount output portion 134, the input/output portion 136 and the amplifier 126 are similar to those in Embodiment 1, and the description thereof will be omitted.

Figure 21:
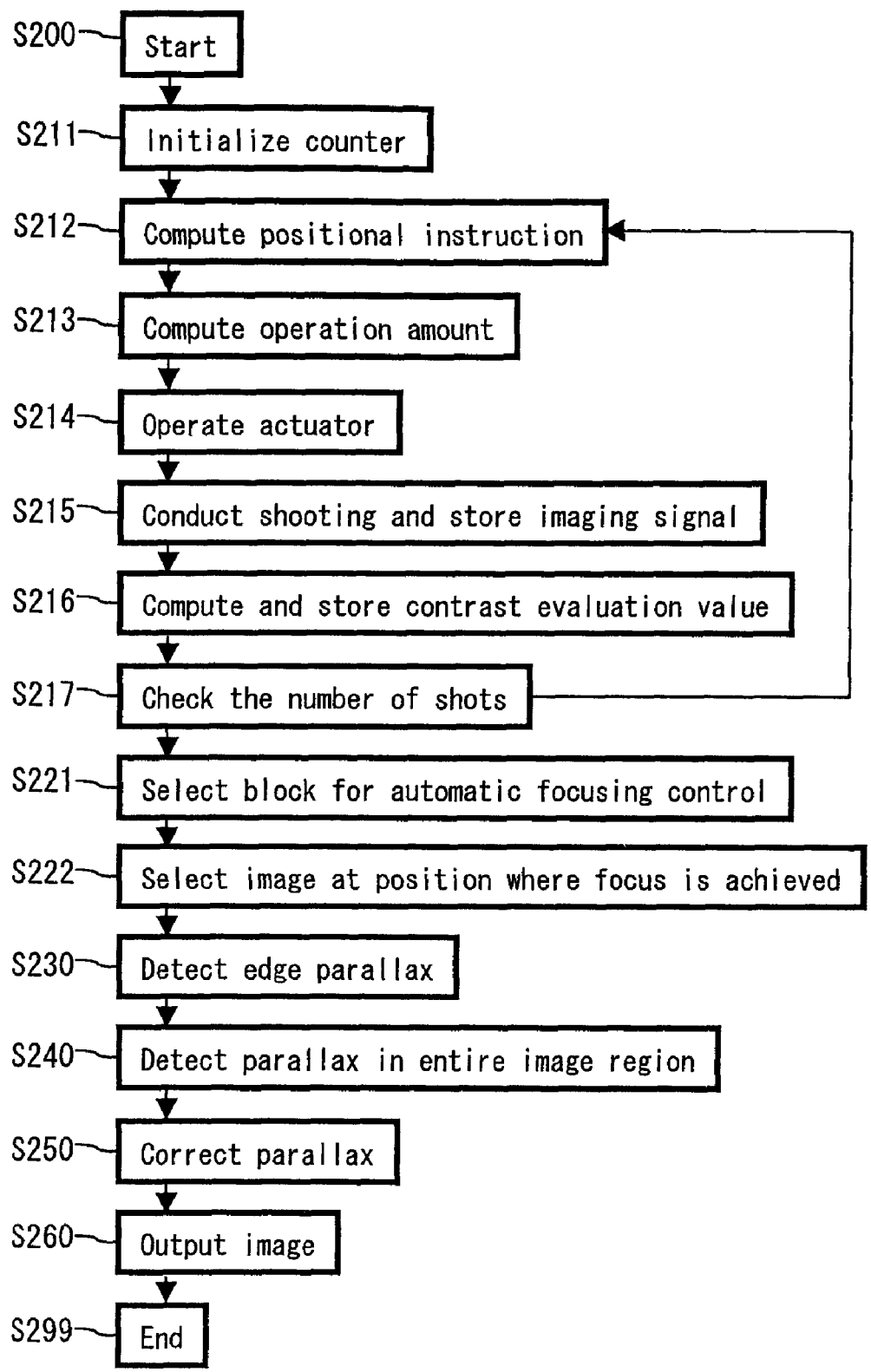
FIG. 21 is a flowchart showing an operation of the camera module according to Embodiment 2 of the present invention.

FIG. 21 is a flowchart showing an operation of the camera module according to Embodiment 2 of the present invention. The camera module 201 is operated as per this flowchart by the system control portion 231 of the SLSI 225.

In Step S200, the operation starts. For example, the main CPU (not shown) senses that a shutter button or the like is pressed down, and instructs the camera module to start operating via the input/output portion 136, whereby the camera module 201 starts operating. Next, Step S211 is executed.

In Steps S211, S212, S213, S214, S215, S216 and S217, shooting is conducted plural times, contrast evaluation values are computed, and imaging signals and the contrast evaluation values are stored.

In Step S211, a counter i is initialized as in Equation (36) below. Next, Step S212 is executed.

$$i=0 \tag{36}$$

In Step S212, an actuator positional instruction Xact is created. Incidentally, the positional instruction Xact indicates an instruction of a position in a direction toward the subject with respect to the position at which an infinity object is focused. Next, Step S213 is executed.

$$X\text{act}=kx2 \cdot i \tag{37}$$

In Step S213, an actuator control amount Vact is computed using a control amount function based on the actuator positional instruction Xact as per Equation (38) below. Next, Step S214 is executed.

$$V\text{act}=ka \cdot X\text{act}+kb \tag{38}$$

In Step S214, an actuator is operated. This operation is similar to that in Step S164 in Embodiment 1, and the description thereof will be omitted. Next, Step S215 is executed.

Figure 22:
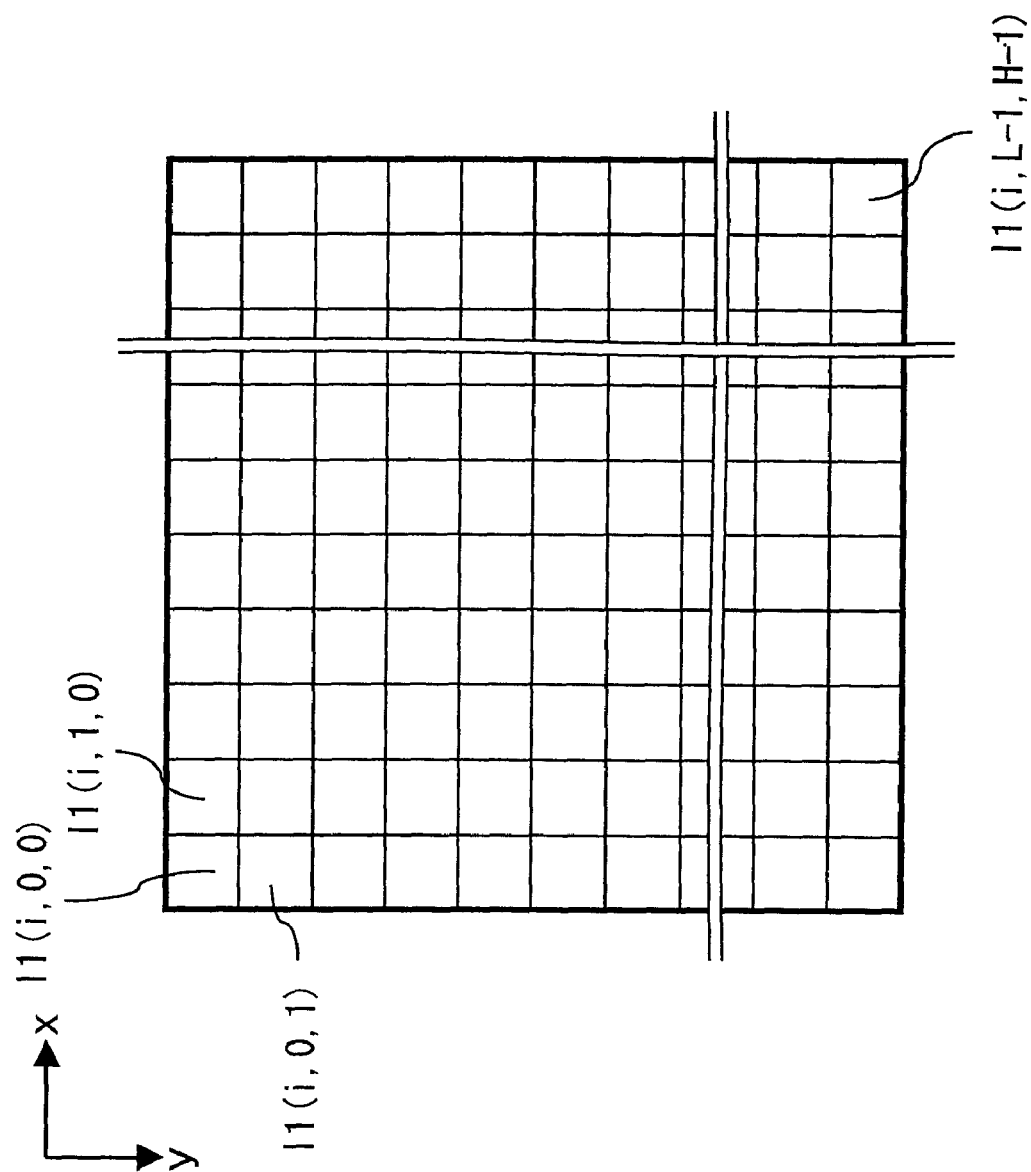
FIG. 22 is a drawing for describing coordinates of an imaging signal of the camera module according to Embodiment 2 of the present invention.

In Step S215, shooting is conducted, and an imaging signal is stored. On the instruction of the system control portion 231, the imaging device driving portion 132 outputs signals for an electronic shutter and transferring as necessary. The first imaging signal input portion 133$a$, the second imaging signal input portion 133$b$, the third imaging signal input portion 133$c$ and the fourth imaging signal input portion 133$d$ input imaging signals, which are analog signals of the images outputted respectively by the first imaging device 123$a$, the second imaging device 123$b$, the third imaging device 123$c$ and the fourth imaging device 123$d$, in synchronization with the signals generated by the imaging device driving portion 132, remove fixed noises with the CDS, adjust input gains automatically with the AGC, convert the analog signals into digital values with the ADC, and write the digital values into the memory at a predetermined address in the system control portion 231 as a first imaging signal $I1(i,x,y)$, a second imaging signal $I2(i,x,y)$, a third imaging signal $I3(i,x,y)$ and a fourth imaging signal $I4(i,x,y)$. FIG. 22 is a drawing for describing coordinates of the imaging signal of the camera module according to Embodiment 2 of the present invention. $I4(i,x,y)$ indicates the first imaging signal of the i-th shot, which is the x-th signal in a horizontal direction and the y-th signal in a vertical direction. In an image to be inputted, the number of pixels in the vertical direction is H, the number of pixels in the horizontal direction is L, and the total number of pixels is H×L. x varies from 0 to L−1, and y varies from 0 to H−1. Further, i is the counter indicating that it is an image of the "i+1"-th shot. This also holds true for the second imaging signal $I2(i,x,y)$, the third imaging signal $I3(i,x,y)$ and the fourth imaging signal $I4(i,x,y)$. In other words, $I2(i,x,y)$, $I3(i,x,y)$ and $I4(i,x,y)$ respectively indicate the second imaging signal, the third imaging signal and the fourth imaging signal of the "i+1"-th shot, each of which is the x-th signal in the horizontal direction and the y-th signal in the vertical direction. In an image to be inputted, the number of pixels in the vertical direction is H, the number of pixels in the horizontal direction is L, and the total number of pixels is H×L. x varies from 0 to L−1, and y varies from 0 to H−1. Further, i is the counter indicating that it is an image of the "i+1"-th shot. Next, Step S216 is executed.

In Step S216, the contrast computing portion 241 computes and stores a contrast evaluation value using data in the memory in the system control portion 231. This computation is performed only for the first imaging signal I1. Laplacian is computed as per Equation (39) below and further is subjected spatially to a LPF (low-pass filter) as per Equation (40) below, and the result is given as a contrast evaluation value $C2(i,x,y)$. Then, this is written into the memory in the system control portion 231. Next, Step S217 is executed.

$$C1(i,x,y) = I1(i,x-1,y) + I1(i,x+1,y) + \\ I1(i,x,y-1) + I1(i,x,y+1) - 4I1(i,x,y) \tag{39}$$

-continued $$C2(i, x, y) = \\ C1(i, x-1, y-1) + C1(i, x, y-1) + C1(i, x+1, y-1) + \\ C1(i, x-1, y) + C1(i, x, y) + C1(i, x+1, y) + \\ C1(i, x-1, y+1) + C1(i, x, y+1) + C1(i, x+1, y+1) \quad (40)$$

In Step S217, the number of shots is checked, and the operation is branched. First, as in Equation (41) below, the counter i is increased by 1. If the counter i is smaller than the number of shots Np, then Step S212 is executed. If the counter i is equal to the number of shots Np, then Step S221 is executed.

$$i=i+1 \quad (41)$$

In Step S221 and Step S222, the automatic focusing control portion 242 selects an image shot at a position where the focus is achieved by using data in the memory in the system control portion 231.

In Step S221, a block for automatic focusing is created. A rectangular block near the center of the image region serves as the block for automatic focusing. Incidentally, this block does not have to be the one near the center but may be the one created by reflecting an intention of a user operating the camera (for example, by detecting a viewpoint direction with a sensor). Next, Step S222 is executed.

In Step S222, the image shot at the position where the focus is achieved is selected. As described referring to FIG. 9, the image shot at the position where the focus is achieved has the maximum contrast. Using this principle, the image shot at the position where the focus is achieved is selected. First, as in Equation (42) below, an average of the contrast evaluation values $C2(i,x,y)$ for the individual shots in the block for automatic focusing serves as a contrast evaluation value for automatic focusing control C3. Incidentally, Σ represents a sum in the blocks for automatic focusing. Subsequently, i giving the maximum value of C3(i) is used as a focus achievement counter value ip, so that an image at the position where the focus is achieved is determined. Next, Step S230 is executed.

$$C3(i)=|\Sigma C2(i,x,y)|/N \quad (42)$$

ip: i giving the maximum value of C3(i) $\quad (43)$

In Step S230, the edge parallax computing portion 243 detects an edge using the data in the memory in the system control portion 231 and detects its parallax. Similarly to Step S122 in Embodiment 1, a zero crossing (a point at which a value changes from positive to negative and a point at which a value changes from negative to positive) of the contrast evaluation value $C2(ie,x,y)$ is sensed utilizing the image at the position where the focus is achieved.

Next, with respect to a point (xe,ye) on the edge, a rectangular block whose center is at (xe,ye) is set, and the sum of absolute values of the contrast evaluation values $C2(i,x,y)$ for all the shot images is given as $C4(i,xe,ye)$ as in Equation (44) below. Here, Σ represents the sum in the set rectangular block. Then, based on the principle described referring to FIG. 9, ipe(xe,ye) indicating the position where the focus is achieved at (xe,ye) on the edge serves as i giving the maximum value of $C4(i,xe,ye)$ as in Equation (45) below. Here, utilizing Equation (9) and Equation (37), the parallax Δ(xe,ye) at the point (xe,ye) on the edge is expressed by Equation (46) below. Next, Step S240 is executed.

$$C4(i,xe,ye)=\Sigma|C2(i,x,y)| \quad (44)$$

ipe(xe,ye): i giving the maximum value of C4(i,xe,ye) $\quad (45)$ $$\Delta(xe,ye)=(kx2/kx)ipe(xe,ye) \quad (46)$$

In Step S240, the entire image region parallax computing portion 244 computes the parallax Δ(x,y) in the entire image region from the parallax Δ(xe,ye) at the point (xe,ye) on the edge using the data in the memory in the system control portion 231. This parallax Δ(xe,ye) on the edge is adopted as a parallax Δ(x,y) of a region surrounded by substantially the same parallaxes Δ(xe,ye) on the edge. Next, Step S250 is executed.

In Step S250, the parallax correcting portion 245 utilizes data in the memory in the system control portion 231, carries out a parallax correction using the parallax Δ(x,y) in the entire region, and then performs an image synthesis. Then, the parallax correcting portion 245 writes the result into the memory in the system control portion 231. Since the first imaging device 123a and the fourth imaging device 123d mainly receive the green component of the object light, the first imaging signal I1 and the fourth imaging signal I4 are information signals of the green component of the object light. Also, since the second imaging signal 123b mainly receives the blue component of the object light, the second imaging signal I2 is an information signal of the blue component of the object light. Further, since the third imaging signal 123c mainly receives the red component of the object light, the third imaging signal I3 is an information signal of the red component of the object light. Since the parallax between the first imaging device 123a and the fourth imaging device 123d at (x,y) is calculated to be (Δ(x,y), Δ(x,y)), G(x,y) indicating the intensity of green at (x,y) is given by an average of the first imaging signal I1(ip,x,y) and the fourth imaging signal I4(ip, x−Δ(x,y),y−Δ(x,y)) as in Equation (47) below. Also, since the parallax between the first imaging device 123a and the second imaging device 123b at (x,y) is calculated to be (Δ(x,y), 0), B(x,y) indicating the intensity of blue at (x,y) is given by the second imaging signal I2(ip,x−Δ(x,y),y) as in Equation (48) below. Further, since the parallax between the first imaging device 123a and the third imaging device 123c at (x,y) is calculated to be (0,Δ(x,y)), R(x,y) indicating the intensity of red at (x,y) is given by the third imaging signal I3(ip,x,y−Δ(x,y)) as in Equation (49) below. Next, Step S260 is executed.

$$G(x,y)=[I1(ip,x,y)+I4(ip,x-\Delta(x,y),y-\Delta(x,y))]/2 \quad (47)$$

$$B(x,y)=I2(ip,x-\Delta(x,y),y) \quad (48)$$

$$R(x,y)=I3(ip,x,y-\Delta(x,y)) \quad (49)$$

In Step S260, an image is outputted. The operation in this step is similar to that in S152 in Embodiment 1. Next, Step S299 is executed.

In Step S299, the processing ends.

With the above-described configuration and operations, the following effects are achieved.

The parallax of the edge is detected using the contrasts of a plurality of images, the parallax of the entire image region is computed based on this parallax, and the image synthesis is performed based on this parallax so as to reduce the parallactic influence, thereby performing the parallax correction. This makes it possible to achieve a beautiful image with a reduced parallactic influence over the entire image region.

Incidentally, although the parallax of the edge is obtained using the contrast evaluation values of plural shots in the camera module according to Embodiment 2, the present invention is not limited to this. For example, it also may be appropriate to set a block whose center is at a point on the edge to be calculated, compute a parallax of this block by the method used in Embodiment 1 and adopt this parallax. Also, several points on the edge may be combined to form a line instead of a point for computing the parallax. Further, a linear edge may be divided at end points or branch points into a plurality of line segments so as to compute parallaxes thereof. Also, a block including the periphery of this line segment may be created so as to compute a parallax of this block by the method used in Embodiment 1. Moreover, the parallax obtained from the contrast evaluation value and the parallax obtained by the method used in Embodiment 1 may be combined. For example, it may be appropriate to use an average parallax or learn a coefficient of the actuator operation amount function.

In addition, although the division into blocks is carried out according to the edge information in Embodiment 1 and Embodiment 2, the present invention is not limited to this. For example, the unit of division may be a rectangular block.

Embodiment 3

A camera module according to Embodiment 3 of the present invention divides an imaging region into blocks, computes a parallax for each block and evaluates the parallax based on a contrast value computed for each block and a correlation of an image shifted by the parallax. When the correlation is high and the contrast is high, the computed parallax is judged to be appropriate, and a usual parallax correction is performed based on the parallax. When the correlation is low and the contrast is low, the computed parallax is judged not to be accurate, and a parallax correction for low contrast is performed. Further, when the correlation is low and the contrast is high, it is judged that the computed parallax is not appropriate because subjects at plural distances are contained, and the blocks are re-divided. In this way, a beautiful image over an entire image region is obtained.

In the following, the camera module according to Embodiment 3 of the present invention will be described, with reference to the accompanying drawings.

Figure 23:
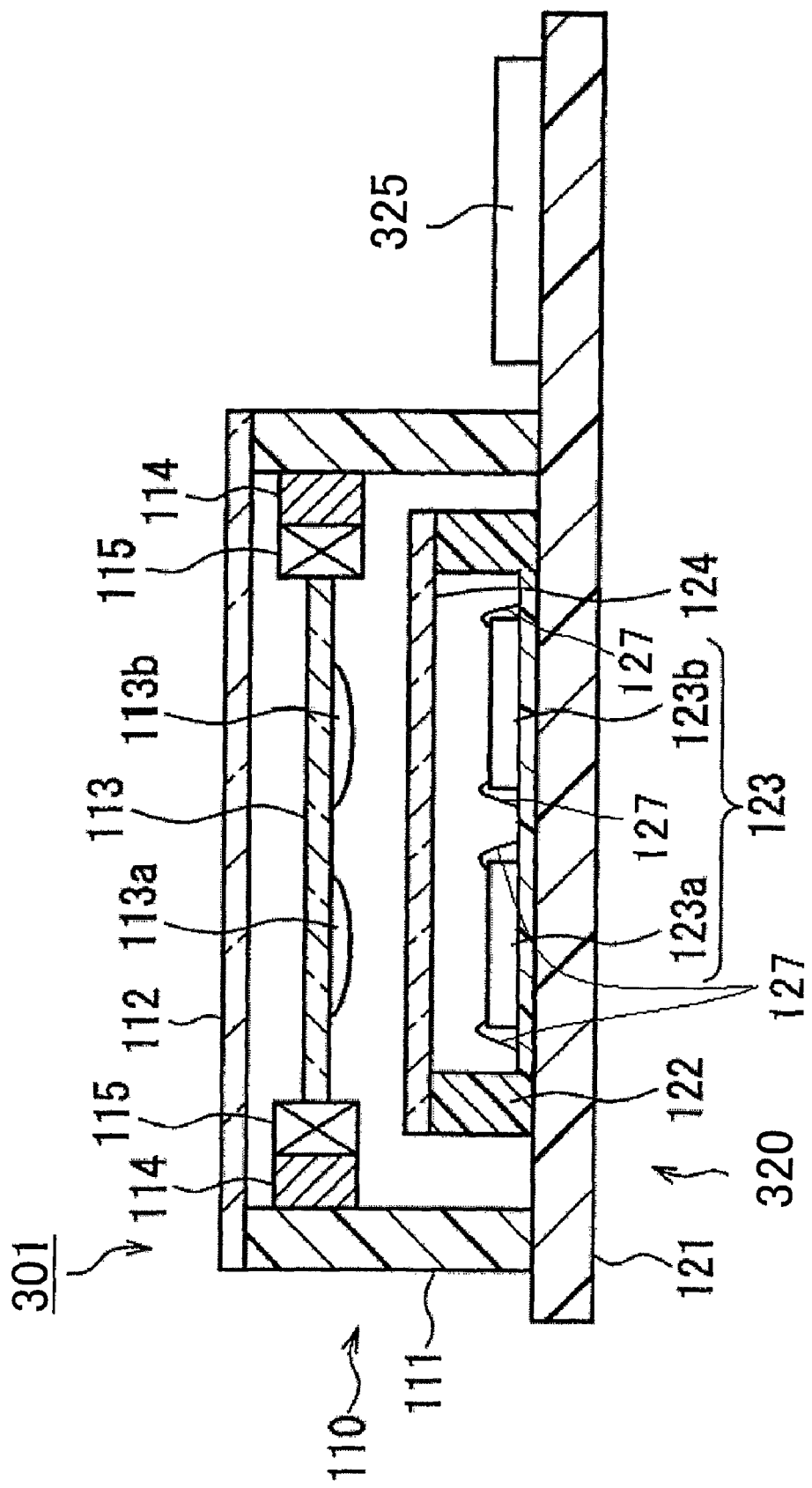
FIG. 23 is a sectional view showing a configuration of a camera module according to Embodiment 3 of the present invention.

FIG. 23 is a sectional view showing a configuration of the camera module according to Embodiment 3 of the present invention. The configuration is similar to that of Embodiment 1 except for an SLSI 325 of a circuit portion 320 of a camera module 301. Members similar to those in Embodiment 1 are assigned the same reference numerals, and the description thereof will be omitted.

Figure 24:
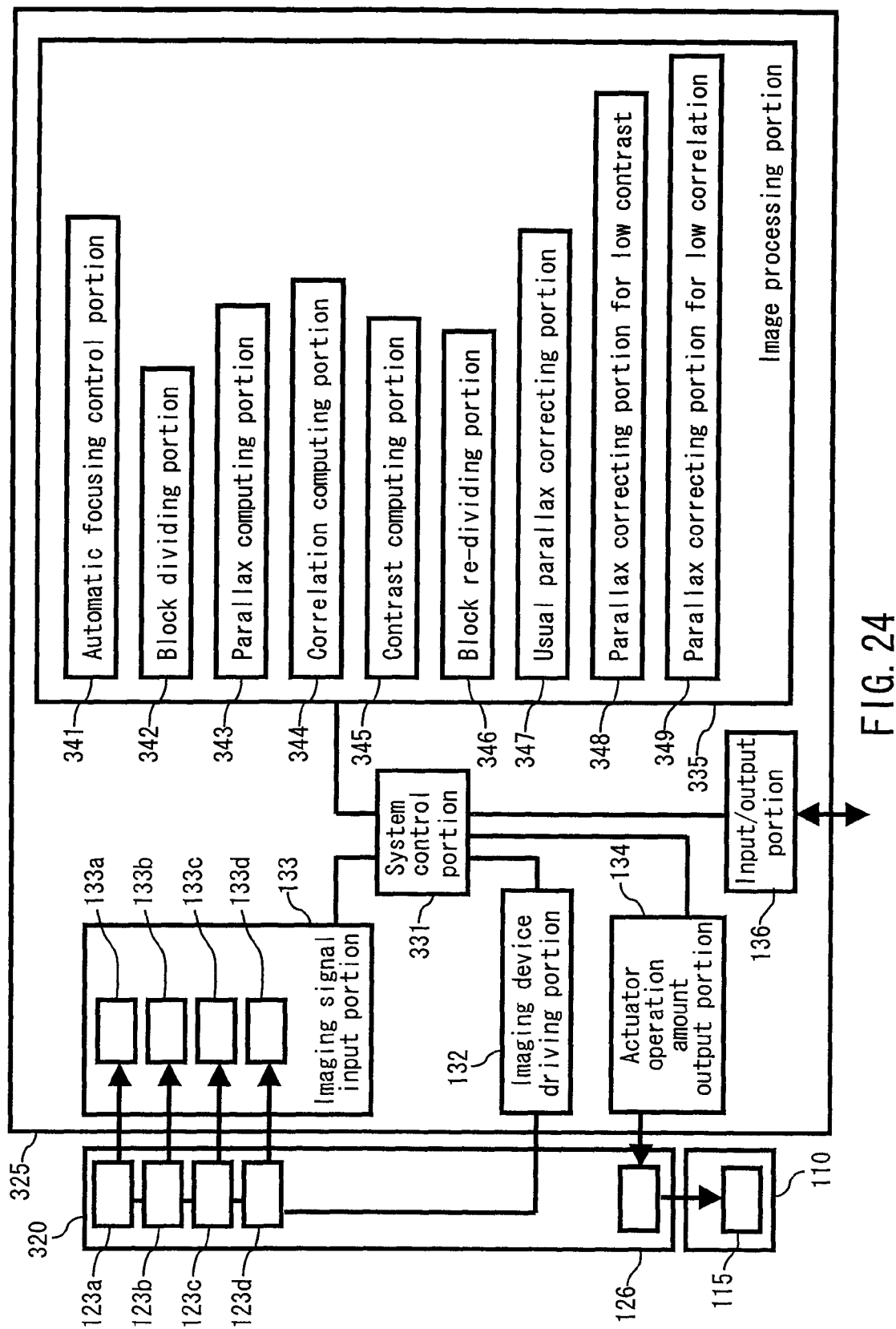
FIG. 24 is a block diagram showing the camera module according to Embodiment 3 of the present invention.

FIG. 24 is a block diagram showing the camera module according to Embodiment 3 of the present invention. The SLSI 325 includes a system control portion 331, an imaging device driving portion 132, an imaging signal input portion 133, an actuator operation amount output portion 134, an image processing portion 335 and an input/output portion 136. Also, the circuit portion 320 includes an amplifier 126 in addition to the configuration described above.

The image processing portion 335 is configured so as to include a logic circuit, a DSP (digital signal processor) or both of the logic circuit and the DSP and carries out various image processings utilizing memory information in the system control portion 331. The image processing portion 335 includes an automatic focusing control portion 341, a block division portion 342, a parallax computing portion 343, a correlation computing portion 344, a contrast computing portion 345, a block re-dividing portion 346, a usual parallax correcting portion 347, a parallax correcting portion for low contrast 348 and a parallax correcting portion for low correlation 349.

Figure 25:
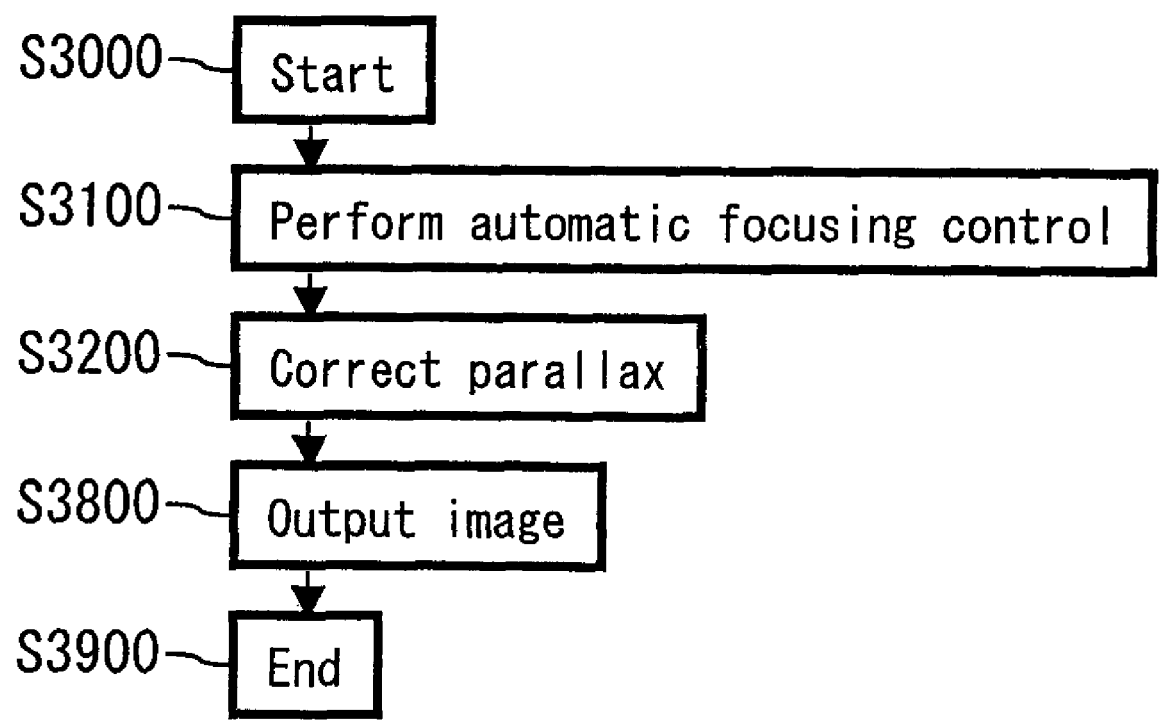
FIG. 25 is a flowchart showing an operation of the camera module according to Embodiment 3 of the present invention.

FIG. 25 is a flowchart showing the operation of the camera module according to Embodiment 3 of the present invention. The camera module 301 is operated as per this flowchart by the system control portion 331 of the SLSI 325.

In Step S3000, the operation starts. For example, the main CPU (not shown) senses that a shutter button (not shown) or the like is pressed down, and instructs the camera module 301 to start operating via the input/output portion 136, whereby the camera module 301 starts operating. Next, Step S3100 is executed.

Figure 26:
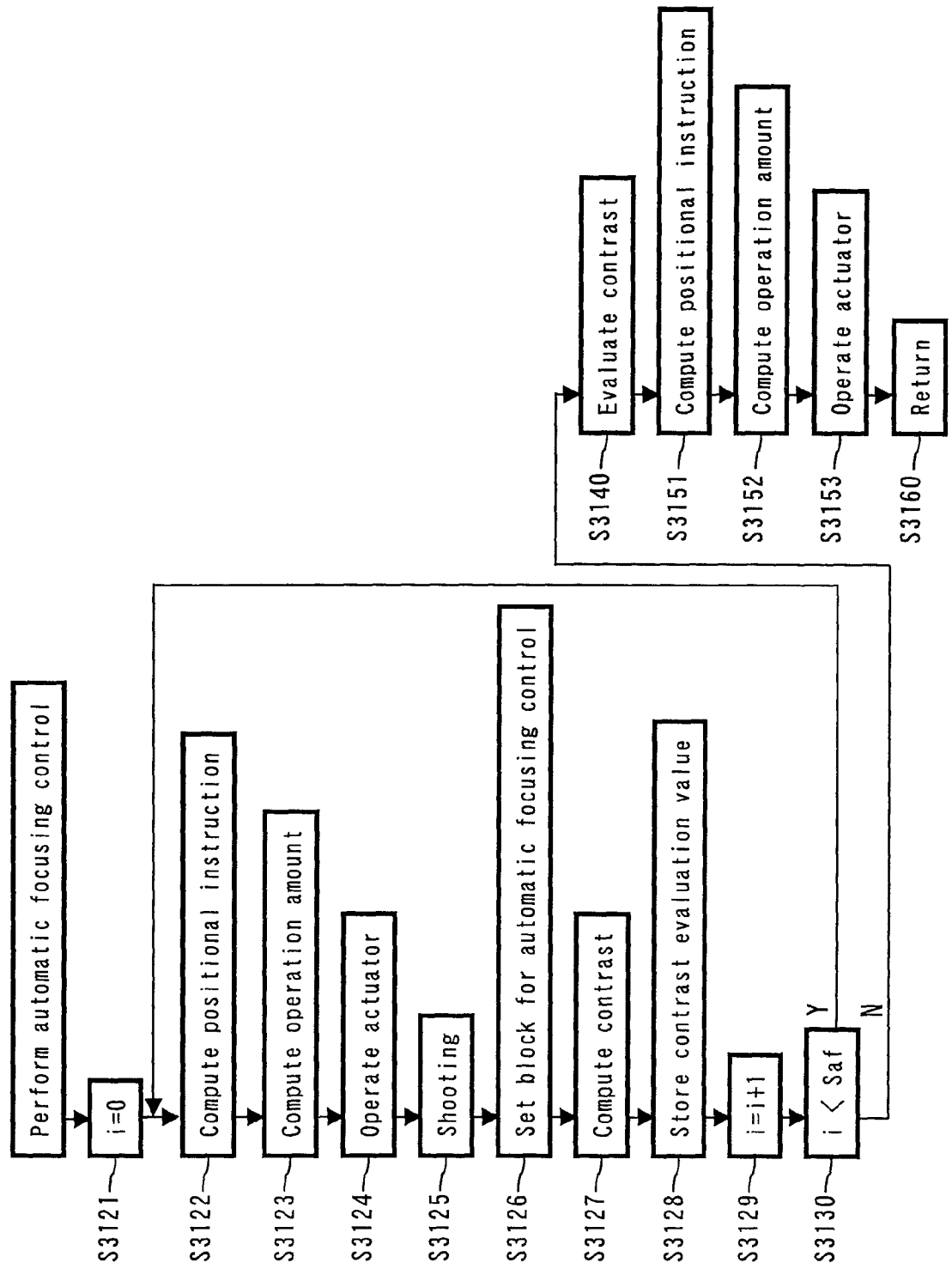
FIG. 26 is a flowchart showing an operation of an automatic focusing control according to Embodiment 3 of the present invention.

In Step S3100, the automatic focusing control portion 341 executes an automatic focusing control. FIG. 26 is a flowchart showing an operation of the automatic focusing control according to Embodiment 3 of the present invention. The flowchart of FIG. 26 shows the operation in Step S3100 in detail.

In the automatic focusing control in Step S3100, Step S3121 is executed first.

In Step S3121, a counter i is initialized to 0. Next, Step S3122 is executed.

In Step S3122, an actuator positional instruction is computed. As per Equation (50) below, an actuator positional instruction Xact is computed using the counter i. Incidentally, the positional instruction Xact indicates an instruction of a position at which a direction toward the subject is positive with respect to the position at which an infinity object is focused. Here, kx is a set value. Next, Step S3123 is executed.

$$Xact = kx \cdot i \quad (50)$$

In Step S3123, an actuator operation amount (a voltage to be applied to the coil of the actuator movable portion 115) Vact is computed using an operation amount function expressed by Equation (51) below. Here, ka and kb respectively are set values. Next, Step S3124 is executed.

$$Vact = ka \cdot Xact + kb \quad (51)$$

In Step S3124, an actuator is operated. The actuator operation amount output portion 134 changes a voltage signal to be outputted so that the voltage to be applied to the coil (not shown) of the actuator movable portion 115 via the amplifier 126 is Vact. Next, Step S3125 is executed.

In Step S3125, shooting is executed. On the instruction of the system control portion 331, the imaging device driving portion 132 outputs signals for an electronic shutter and transferring as necessary. The first imaging signal input portion 133a, the second imaging signal input portion 133b, the third imaging signal input portion 133c and the fourth imaging signal input portion 133d input imaging signals, which are analog signals of the images outputted respectively by the first imaging device 123a, the second imaging device 123b, the third imaging device 123c and the fourth imaging device 123d, in synchronization with the signals generated by the imaging device driving portion 132, remove fixed noises with the CDS, adjust input gains automatically with the AGC, convert the analog signals into digital values with the ADC, and write the digital values into the memory at a predetermined address in the system control portion 331 as a first imaging signal $I1(x,y)$, a second imaging signal $I2(x,y)$, a third imaging signal $I3(x,y)$ and a fourth imaging signal $I4(x,y)$. FIG. 12 is a drawing for describing coordinates of the imaging signal of the camera module according to Embodiment 1 of the present invention. $I1(x,y)$ indicates the first imaging signal, which is the x-th signal in a horizontal direction and the y-th signal in a vertical direction. In an image to be inputted, the number of pixels in the vertical direction is H, the number of pixels in the horizontal direction is L, and the total number of pixels is H×L. x varies from 0 to L−1, and y varies from 0 to H−1. This also holds true for the second imaging signal $I2(x,y)$, the third imaging signal $I3(x,y)$ and the fourth imaging signal $I4(x,y)$. In other words, $I2(x,y)$, $I3(x,y)$ and $I4(x,y)$ respectively indicate the second imaging signal, the third imaging signal and the fourth imaging signal, each of which is the x-th signal in the horizontal direction and the y-th signal in the vertical direction. In an image to be inputted, the number of pixels in the vertical direction is H, the number of pixels in the horizontal direction is L, and the total number of pixels is H×L. x varies from 0 to L−1, and y varies from 0 to H−1. Next, Step S3126 is executed.

In Step S3126, a block for automatic focusing control is set. A rectangular region near the center of the image region serves as the block for automatic focusing control. Incidentally, this block does not have to be the one near the center but may be the one set by reflecting an intention of a user operating the camera (for example, by detecting a viewpoint direction with a sensor). Incidentally, it also may be possible to select plural blocks instead of a single block and use an average of contrast evaluation values for automatic focusing control described later in these plural blocks. Alternatively, it also may be possible to compute contrast evaluation values for automatic focusing control described later in plural blocks and select at least one block thereafter as a block for automatic focusing control. Next, Step S3127 is executed.

In Step S3127, the contrast value for automatic focusing control is created using the data in the memory in the system control portion 331. This computation is performed for pixels in the block for automatic focusing control of the first imaging signal I1. An absolute value of Laplacian, which is a sum of second order differentials in the x and y directions, is computed as per Equation (52) below and further is subjected spatially to a LPF (low-pass filter) as per Equation (53) below, and the result is averaged in the block for automatic focusing control as per Equation (54) below, thereby obtaining a contrast evaluation value for automatic focusing C3. Here, Naf represents the number of pixels in the block for automatic focusing control. Next, Step S3128 is executed.

$$C1(x, y) = \\ |I1(x-1, y) + I1(x+1, y) + I1(x, y-1) + I1(x, y+1) - 4I1(x, y)| \quad (52)$$

$$C2(x, y) = C1(x-1, y-1) + C1(x, y-1) + \\ C1(x+1, y-1) + C1(x-1, y) + C1(x, y) + C1(x+1, y) + \\ C1(x-1, y+1) + C1(x, y+1) + C1(x+1, y+1) \quad (53)$$

$$C3 = \Sigma C2(x, y)/Naf \quad (54)$$

In Step S3128, the contrast evaluation value C3 is given as C3(i) as in Equation (55) below and written into the memory in the system control portion 331. Next, Step S3129 is executed.

$$C3(i)=C3 \quad (55)$$

In Step S3129, 1 is added to the counter i as per Equation (56) below. Next, Step S3130 is executed.

$$i=i+1 \quad (56)$$

In Step S3130, the counter i is compared with a threshold Saf, and the operation is branched according to the result. When the counter i is smaller than the threshold Saf (the result of comparison in Step S3130 is Y), then Step S3122 is executed. On the other hand, when the counter i is equal to or larger than the threshold Saf (the result of comparison in Step S3130 is N), then Step S3140 is executed. In this manner, by initializing the counter i to 0 in Step S3121, adding 1 to the counter i in Step S3129 and branching the operation according to the counter i in Step S3130, the processings from S3122 to S3128 are repeated Saf times.

In Step S3140, the contrast evaluation value C3 is evaluated. As illustrated in FIG. 9, the contrast evaluation value C3 becomes maximum at the position where the focus is achieved. As in Equation (57) below, the counter value i giving this maximum value is given as a counter value iaf giving the contrast maximum value. Next, Step S3151 is executed.

$$iaf=i \text{ giving the maximum value of } C3 \quad (57)$$

In Step S3151, an actuator positional instruction is computed. As per Equation (58) below, an actuator positional instruction Xact is computed using the counter value iaf giving the contrast maximum value. Incidentally, the positional instruction Xact indicates an instruction of a position at which a direction toward the subject is positive with respect to the position at which an infinity object is focused. Next, Step S3152 is executed.

$$Xact=kx\cdot iaf \quad (58)$$

In Step S3152, an actuator operation amount (a voltage to be applied to the coil of the actuator movable portion 115) Vact is computed using an operation amount function. This operation is similar to that in Step S3123, and the description thereof will be omitted. Next, Step S3153 is executed.

In Step S3153, an actuator is operated. This operation is similar to that in Step S3124, and the description thereof will be omitted. Next, Step S3160 is executed.

In Step S3160, the automatic focusing control is ended, thus returning to a main routine. Accordingly, Step S3200 in FIG. 25 is executed next.

Figure 27:
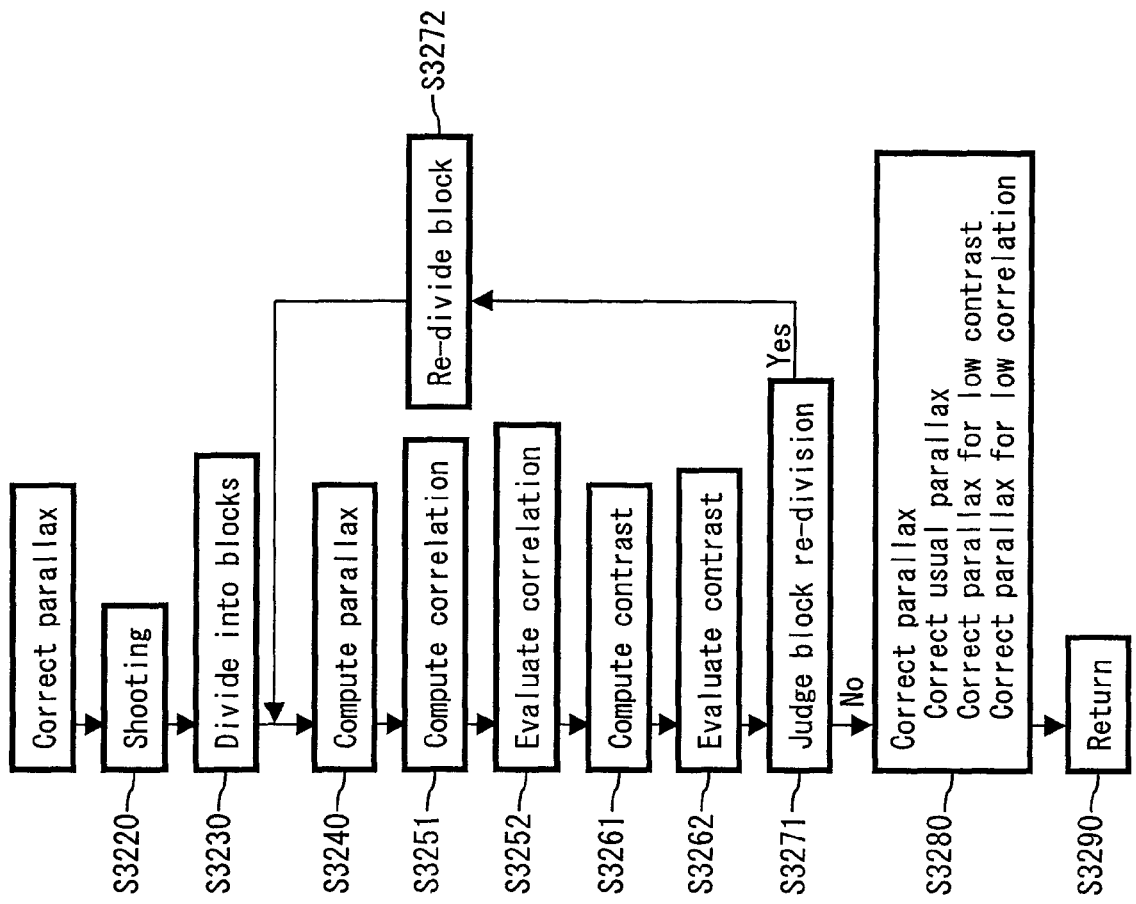
FIG. 27 is a flowchart showing an operation of a parallax correction according to Embodiment 3 of the present invention.

In Step S3200, the parallax correction is executed. FIG. 27 is a flowchart showing an operation of the parallax correction according to Embodiment 3 of the present invention. The flowchart of FIG. 27 shows the operation in Step S3200 in detail.

In the parallax correction in Step S3200, Step S3220 is executed first.

In Step S3220, shooting is executed. On the instruction of the system control portion 331, the imaging device driving portion 132 outputs signals for an electronic shutter and transferring as necessary. The first imaging signal input portion 133a, the second imaging signal input portion 133b, the third imaging signal input portion 133c and the fourth imaging signal input portion 133d input imaging signals, which are analog signals of the images outputted respectively by the first imaging device 123a, the second imaging device 123b, the third imaging device 123c and the fourth imaging device 123d, in synchronization with the signals generated by the imaging device driving portion 132, remove fixed noises with the CDS, adjust input gains automatically with the AGC, convert the analog signals into digital values with the ADC, and write the digital values into the memory at a predetermined address in the system control portion 331 as a first imaging signal I1(x,y), a second imaging signal I2(x,y), a third imaging signal I3(x,y) and a fourth imaging signal I4(x, y). FIG. 12 is a drawing for describing coordinates of the imaging signal of the camera module according to Embodiment 1 of the present invention. I1(x,y) indicates the first imaging signal, which is the x-th signal in a horizontal direction and the y-th signal in a vertical direction. In an image to be inputted, the number of pixels in the vertical direction is H, the number of pixels in the horizontal direction is L, and the total number of pixels is H×L. x varies from 0 to L−1, and y varies from 0 to H−1. This also holds true for the second imaging signal I2(x,y), the third imaging signal I3(x,y) and the fourth imaging signal I4(x,y). In other words, I2(x,y), I3(x,y) and I4(x,y) respectively indicate the second imaging signal, the third imaging signal and the fourth imaging signal, each of which is the x-th signal in the horizontal direction and the y-th signal in the vertical direction. In an image to be inputted, the number of pixels in the vertical direction is H, the number of pixels in the horizontal direction is L, and the total number of pixels is H×L. x varies from 0 to L−1, and y varies from 0 to H−1. Next, Step S3230 is executed.

Figure 28:
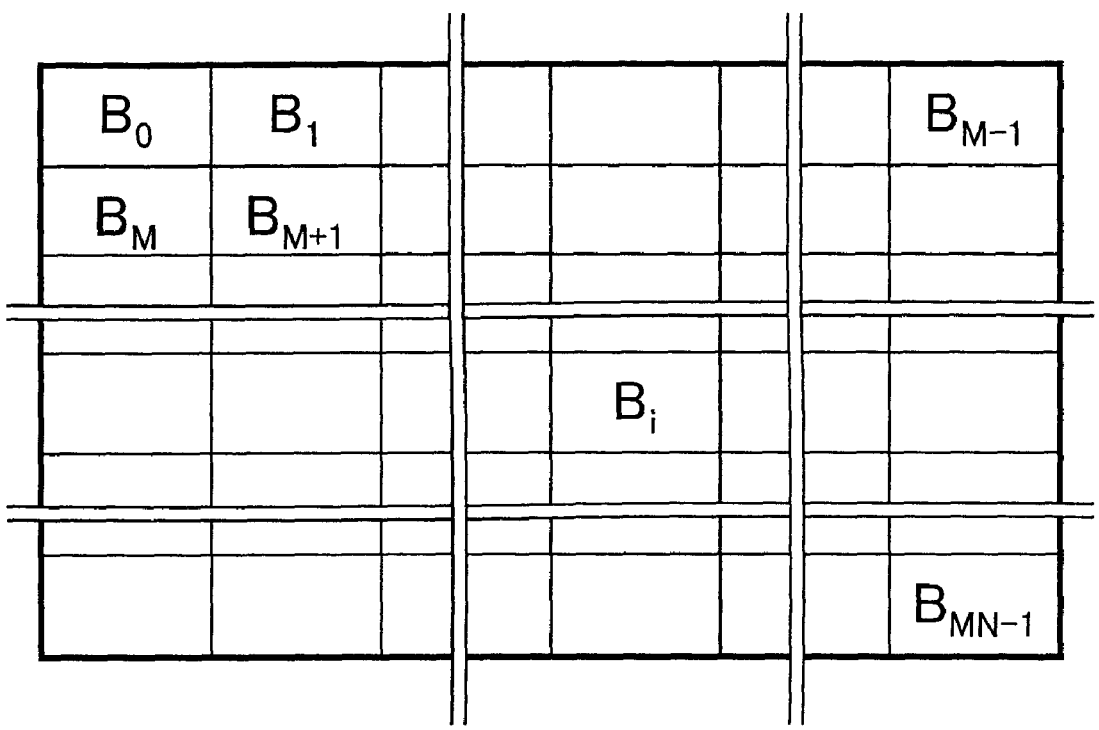
FIG. 28 is a drawing for describing a block division in the camera module according to Embodiment 3 of the present invention.

In Step S3230, the block division portion 342 utilizes data in the memory in the system control portion 331 and carries out a division into blocks. Then, the block division portion 342 writes the result into the memory in the system control portion 331. FIG. 28 is a drawing for describing the block division in the camera module according to Embodiment 3 of the present invention. As shown in FIG. 28, the first imaging signal I1 is divided into M blocks in the horizontal direction and N blocks in the vertical direction, namely, M×N blocks in total, and each block is expressed by Bi. Here, i varies from 0 to M×N−1. Next, Step S3240 is executed.

Figure 29:
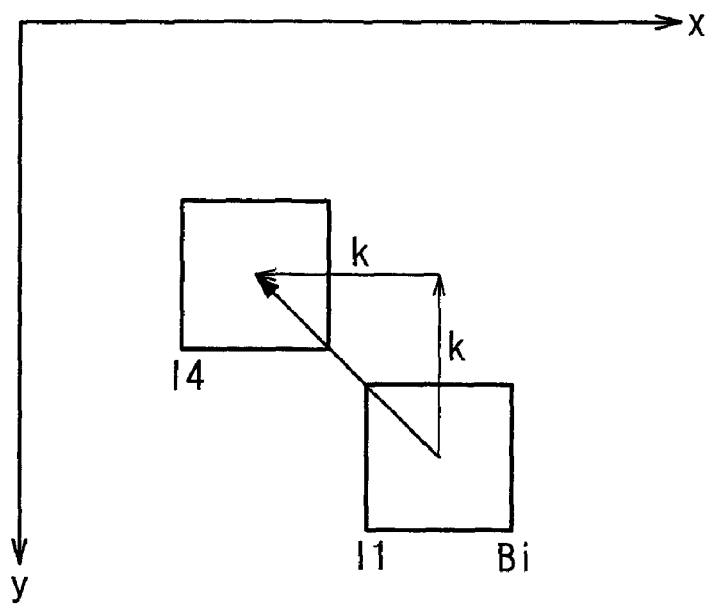
FIG. 29 is a drawing for describing computation regions of a parallax evaluation value in the camera module according to Embodiment 3 of the present invention.

In Step S3240, the parallax computing portion 343 utilizes data in the memory in the system control portion 331 and computes a parallax value for each block. Then, the parallax computing portion 343 writes it into the memory in the system control portion 331. First, for each block (B0, B1, Bi, . . . , BMN−1), a parallax evaluation value (R0(k), R1(k), . . . , Ri(k), . . . , RMN−1(k); k=0, 1, . . . , kmax) is computed. FIG. 29 is a drawing for describing computation regions of the parallax evaluation value in the camera module according to Embodiment 3 of the present invention. A region indicated by Bi (also indicated by I1) is the i-th block obtained from the first imaging signal I1 in Step S3230. A region indicated by I4 is a region obtained by moving from Bi by k in the x direction and k in the y direction. Then, for all image signals I1($x,y$) and I4($x−k,y−k$) in these regions, the sum of absolute difference expressed by Equation (59) below is computed as a parallax evaluation value Ri(k).

$$Ri(k)=\Sigma\Sigma|I1(x,y)-I4(x-k,y-k)| \qquad (59)$$

This parallax evaluation value Ri(k) indicates how much the first image signal I1 of the i-th block Bi and the fourth image signal I4 in the region shifted therefrom by (k, k) respectively in the x and y directions are correlated. The smaller the parallax evaluation value Ri(k) is, the higher the correlation is (the higher the degree of similarity is). As shown in FIG. 15, the parallax evaluation value Ri(k) varies with the value of k and is at a minimum when k=Δi. This indicates that the image signal obtained by moving the i-th block Bi of the fourth image signal I4 by (−Δi, −Δi) respectively in the x and y directions has the highest correlation with (the highest degree of similarity to) the first image signal I1. Accordingly, it is understood that the parallax in the x and y directions between the first imaging signal I1 and the fourth imaging signal I4 for the i-th block Bi is (Δi, Δi). In the following, this Δ(i,j) is referred to as a parallax value Δ(i,j) of the i-th block B(i,j). In this manner, the parallax values Δi of Bi from i=0 to i=M×N−1 are obtained. Next, Step S3251 is executed.

Figure 30:
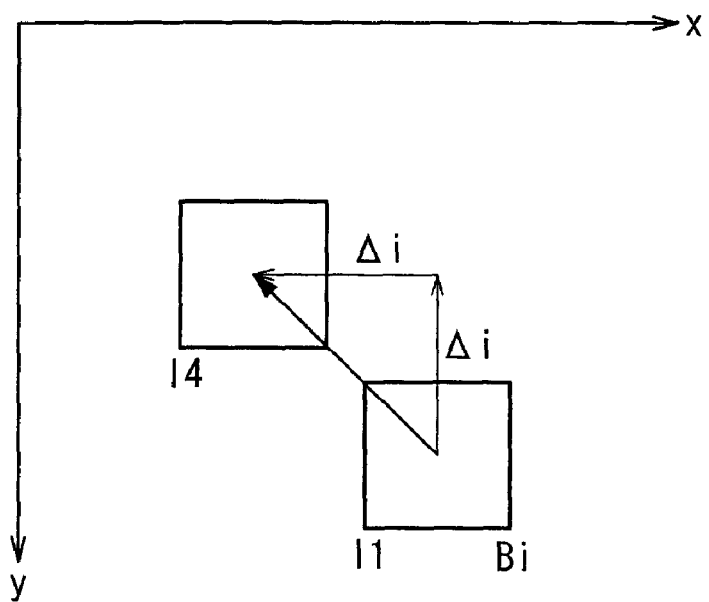
FIG. 30 is a drawing for describing computation regions of a correlation value for parallax accuracy evaluation in the camera module according to Embodiment 3 of the present invention.

In Step S3251, the correlation computing portion 344 computes a correlation value for parallax accuracy evaluation for each block utilizing the data in the memory in the system control portion 331. Then, the correlation computing portion 344 writes the result into the memory in the system control portion 331. FIG. 30 is a drawing for describing computation regions of the correlation value for parallax accuracy evaluation in the camera module according to Embodiment 3 of the present invention. A region indicated by Bi (also indicated by I1) is the i-th block obtained from the first imaging signal I1 in Step S3230. A region indicated by I4 is a region obtained by moving Bi by Δi in the x direction and Δi in the y direction. Then, for all image signals I1($x,y$) and I4($x−Δi,y−Δi$) in these regions, correlation values for parallax accuracy evaluation R2i are given as in Equation (60) below. Here, ΣΣ represents a sum in the block Bi, and avg represents an average in the block Bi. Next, Step S3252 is executed.

$$R2i = \Sigma\Sigma\{I1(x,y) - \text{avg}(I1(x,y))\} \times \qquad (60)$$
$$\{I4(x-\Delta i, y-\Delta i) - \text{avg}(I4(x-\Delta i, y-\Delta i))\} \Big/$$
$$\sqrt{\Sigma\Sigma\{I1(x,y) - \text{avg}(I1(x,y))\}^2} \Big/$$
$$\sqrt{\Sigma\Sigma\{I4(x-\Delta i, y-\Delta i) - \text{avg}(I4(x-\Delta i, y-\Delta i))\}^2}$$

In Step S3252, a parallax correction mode for each block Bi is selected based on the correlation value for parallax accuracy evaluation R2i. When the correlation value for parallax accuracy evaluation R2i is larger than a threshold R20 as in Equation (61) below, 1 indicating a usual parallax correction is substituted into a parallax correction mode flag Fi and stored in the memory of the system control portion 331. Next, Step S3261 is executed.

$$Fi=1(R2i>R20) \qquad (61)$$

In Step S3261, the contrast computing portion 345 computes the contrast value for parallax accuracy evaluation for each block using the data in the memory in the system control portion 331. Then, the contrast computing portion 345 writes it into the memory in the system control portion 331. An absolute value of Laplacian, which is a sum of second order differentials in the x and y directions, is computed as per Equation (62) below and further is subjected spatially to a LPF (low-pass filter) as per Equation (63) below, and the result is averaged in each block Bi as per Equation (64) below, thereby obtaining a contrast evaluation value for parallax accuracy evaluation C6i, which is to be written into the memory in the system control portion 331. Here, NBi represents the number of pixels in the block Bi. It should be noted that the contrast evaluation value is not limited to Equations (62) to (64) and may be any value as long as it can express the contrast. For example, in Equation (62), a first derivation may be used instead of Laplacian, or a sum of absolute second order differentials in the x and y directions, respectively, may be used instead of the absolute value of Laplacian. Also, LPFs other than Equation (63) also may be used. Further, the result of Equation (64) also may be normalized by division by an average of the intensity of I1. Next, Step S3262 is executed.

$$C4(x,y) = \qquad (62)$$
$$|I1(x-1, y) + I1(x+1, y) + I1(x, y-1) + I1(x, y+1) - 4I1(x, y)|$$

$$C5(x, y) = C4(x-1, y-1) + C4(x, y-1) + \qquad (63)$$
$$C4(x+1, y-1) + C4(x-1, y) + C4(x, y) + C4(x+1, y) +$$
$$C4(x-1, y+1) + C4(x, y+1) + C4(x+1, y+1)$$

$$C6i = \Sigma C5(x, y)/NBi \qquad (64)$$

In Step S3262, a parallax correction mode for each block Bi is selected based on the contrast evaluation value for parallax accuracy evaluation C6i. Here, in Step S3262, only the block in which 1 is not substituted into the parallax correction mode flag Fi in Step S3252 is evaluated. Accordingly, in Step S3261, in the block Bi with the parallax correction mode flag Fi=1, the computation of the contrast value for parallax accuracy evaluation C6i may be omitted. When the contrast evaluation value for parallax accuracy evaluation C6i is smaller than a threshold C60 as in Equation (65) below, 2 indicating a parallax correction for low contrast is substituted into the parallax correction mode flag Fi and stored in the memory of the system control portion 331. Also, when the contrast evaluation value for parallax accuracy evaluation C6i is equal to or larger than the threshold C60 as in Equation (66) below, 3 indicating a parallax correction for low correlation is substituted into the parallax correction mode flag Fi and stored in the memory of the system control portion 331. Next, Step S3271 is executed.

$$Fi=2(C6i<C60 \text{ and } Fi\neq 1) \tag{65}$$

$$Fi=3(C6i\geq C60 \text{ and } Fi\neq 1) \tag{66}$$

In Step S3271, whether or not a block re-division is necessary is judged based on the parallax correction mode flag and a block size, and the operation is branched according to the result. When the parallax correction mode flag Fi of at least one block is 3 and the number of pixels of the smallest block among all the blocks Bi is larger than S0, the block re-division is judged to be necessary (the result of judgment in Step S3271 is Yes), and then Step S3272 is executed. When the parallax correction mode flags Fi of all the blocks are 1 or 2 or the number of pixels of the smallest block among all the blocks Bi is equal to or smaller than S0, the block re-division is judged to be unnecessary (the result of judgment in Step S3271 is No), and then Step S3280 is executed.

In Step S3272, the block re-dividing portion 346 re-divides the block using the data in the memory in the system control portion 331. FIG. 31A is a drawing for describing the state before the block re-division in the camera module according to Embodiment 3 of the present invention, and FIG. 31B is a drawing for describing the state after the block re-division in the camera module according to Embodiment 3 of the present invention. For the sake of simplicity, FIG. 31 illustrates an example in which there are four blocks and a block B2 where 3 indicating the parallax correction for low correlation is substituted into the parallax correction mode flag Fi (see FIG. 31A) is divided into four blocks B2, B4, B5 and B6 (see FIG. 31B). The numbers indicating the blocks after re-dividing the block B2 are the number of the divided block (i.e., 2) and unassigned numbers (i.e., 4, 5 and 6). Next, S3240 is executed.

The above-described operations of re-dividing the block with low correlation (Fi=3) (Step S3272), computing the parallax for the re-divided block (Step S3240), computing and evaluating the correlation (Step S3251 and Step S3252), computing and evaluating the contrast (Step S3261 and Step S3262), judging whether or not the block is to be re-divided (Step S3271) and further re-dividing the block with low correlation (Fi=3) (Step S3272) are repeated until the size of the smallest block among all the blocks reaches S0 or until the parallax correction mode flags Fi of all the blocks become 1 or 2. Incidentally, since the block size and block number are changed with the block re-division in Steps S3240 to S3272, the operations in these steps are modified suitably.

By the above processes, when the judgment result in Step S3271 described above becomes N (namely, when the execution of Step S3280 is started), 1 indicating the usual parallax correction, 2 indicating the parallax correction for low contrast or 3 indicating the parallax correction for low correlation is substituted in the parallax correction mode flags Fi of all the blocks Bi including the block divided in Step S3272. In Step S3280, the usual parallax correcting portion 347, the parallax correcting portion for low contrast 348 and the parallax correcting portion for low correlation 349 utilize the data in the memory in the system control portion 331, perform the parallax correction according to the value of the parallax correction mode flags Fi for each block so as to perform an image synthesis, and write the result into the memory of the system control portion 331.

Figure 32:
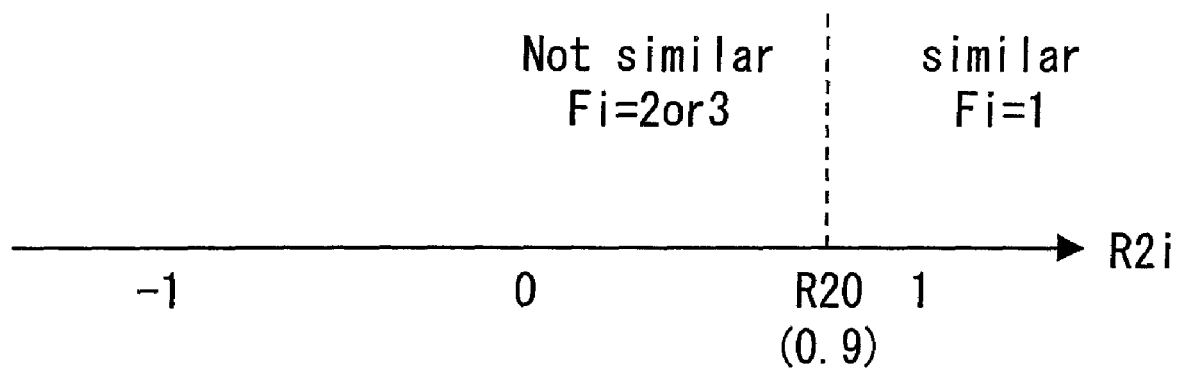
FIG. 32 is a drawing for describing the relationship between the correlation value for parallax accuracy evaluation and a parallax correction mode flag in the camera module according to Embodiment 3 of the present invention.

In Step S3280, in the block with the parallax correction mode flag Fi=1, the correlation value for parallax accuracy evaluation R2i is large. FIG. 32 is a drawing for describing the relationship between the correlation value for parallax accuracy evaluation R2i and the parallax correction mode flag Fi in the camera module according to Embodiment 3 of the present invention. The correlation value for parallax accuracy evaluation R2i obtained in Step S3251 is 1 when the first imaging signal I1(x,y) and the fourth imaging signal I4(x−Δi, y−Δi) shifted therefrom by the parallax Δi in the x and y directions in the i-th block Bi match with each other, 0 when they differ randomly as in a random noise and −1 when they are in an inverse relationship or the like. As described above, the correlation value for parallax accuracy evaluation R2i is large and close to 1 when these imaging signals are similar, and small and away from 1 when they are not similar. Here, the threshold R20 is set to a value close to 1 (for example, 0.9) as shown in FIG. 32, and when the correlation value for parallax accuracy evaluation R2i is larger than the threshold R20, it can be judged that the first imaging signal I1(x,y) and the fourth imaging signal I4(x−Δi,y−Δi) shifted therefrom by the parallax Δi in the i-th block Bi are similar. This indicates that the accuracy of the parallax Δi is high and there are only the subjects at the same distance between the first imaging signal I1(x,y) and the fourth imaging signal I4 (x−Δi,y−Δi) shifted therefrom by the parallax Δi in the i-th block Bi. Thus, by shifting the fourth imaging signal I4 by Δi in the x direction and by Δi in the y direction, it is possible to reproduce an imaging signal in the i-th block Bi. Now, the second imaging signal I2 has a parallactic influence only in the x direction, and the third imaging signal I3 has a parallactic influence only in the y direction. Therefore, by shifting the second imaging signal I2 by Δi in the x direction, it is possible to reproduce a blue imaging signal in the block Bi. By shifting the third imaging signal I3 by Δi in the y direction, it is possible to reproduce a red imaging signal in the block Bi.

Accordingly, in the block with the parallax correction mode flag Fi=1, the normal parallax correcting portion 347 utilizes data in the memory in the system control portion 331, carries out a parallax correction for each block using the parallax value corresponding to this block, and then performs an image synthesis. Then, the usual parallax correcting portion 347 writes the result into the memory in the system control portion 331. Since the first imaging device 123a and the fourth imaging device 123d mainly receive the green component of the object light, the first imaging signal I1 and the fourth imaging signal I4 are information signals of the green component of the object light. Also, since the second imaging signal 123b mainly receives the blue component of the object light, the second imaging signal I2 is an information signal of the blue component of the object light. Further, since the third imaging signal 123c mainly receives the red component of the object light, the third imaging signal I3 is an information signal of the red component of the object light. Since the parallax between the first imaging device 123a and the fourth imaging device 123d is calculated to be (Δi, Δi) in the i-th block Bi, G(x,y) indicating the intensity of green at the pixel coordinates (x,y) is given by an average of the first imaging signal I1(x,y) and the fourth imaging signal I4(x−Δi, y−Δi) as in Equation (67) below. By taking an average as above, the influence of random noise can be reduced. Also, since the parallax between the first imaging device 123a and the second imaging device 123b is calculated to be (Δi, 0), B(x,y) indicating the intensity of blue at the pixel coordinates (x,y) is given by the second imaging signal I2(x−Δi,y) as in Equation (68) below. Further, since the parallax between the first imaging device 123a and the third imaging device 123c is calculated to be (0,Δi), R(x,y) indicating the intensity of red at (x,y) is given by the third imaging signal I3(x,y−Δi) as in Equation (69) below.

$$G(x,y)=[I1(x,y)+I4(x-\Delta i,y-\Delta i)]/2 \quad (67)$$

$$B(x,y)=I2(x-\Delta i,y) \quad (68)$$

$$R(x,y)=I3(x,y-\Delta i) \quad (69)$$

Figure 33:
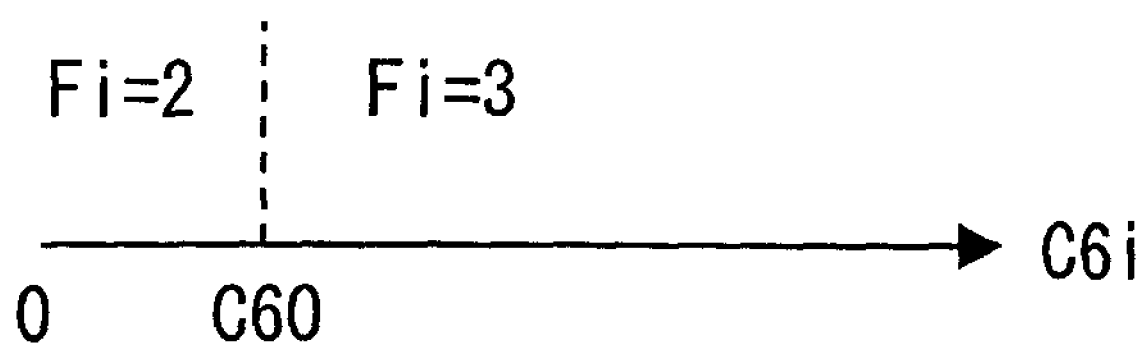
FIG. 33 is a drawing for describing the relationship between a contrast evaluation value for parallax accuracy evaluation and the parallax correction mode flag in the camera module according to Embodiment 3 of the present invention.

In Step S3280, in the block with the parallax correction mode flag Fi=2, the correlation value for parallax accuracy evaluation R2i is small, and the contrast evaluation value for parallax accuracy evaluation C6i is small. FIG. 33 is a drawing for describing the relationship between the contrast evaluation value for parallax accuracy evaluation and the parallax correction mode flag in the camera module according to Embodiment 3 of the present invention. The contrast evaluation value for parallax accuracy evaluation C6 obtained in Step S3261 increases when the first imaging signal I1(x,y) in the i-th block Bi shows a clear image, i.e., an image with a large variation in light and dark and becomes close to 0 when it shows a blurred image, i.e., an image with a small variation in light and dark. Here, the threshold C60 is set as shown in FIG. 33, and when the contrast evaluation value for parallax accuracy evaluation is smaller than the threshold C60, an image shown by the first imaging signal I1(x,y) in the i-th block Bi is an image with a small variation in light and dark. Thus, it can be judged that a noise component increases with respect to a signal component, resulting in a poor accuracy of the parallax Δi. Also, because of the small variation in light and dark, there is no practical problem if the image to be reproduced may contain some error. Accordingly, colors are reproduced mainly based on information of the first imaging signal I1(x,y). It should be noted that colors also may be reproduced based on information of the second imaging signal I2(x,y), the third imaging signal I3(x,y) or the fourth imaging signal I4(x,y). However, since the visibility is the highest for green compared with red and blue, it is preferable that the colors are reproduced based on the first imaging signal I1(x,y) or the fourth imaging signal I4(x,y) having information of the green component of object light. Further, because of a poor accuracy of the parallax Δi, it is preferable to use the first imaging signal I1(x,y) or the fourth imaging signal I4(x,y) alone.

Accordingly, in the block with the parallax correction mode flag Fi=2, the parallax correcting portion for low contrast 348 utilizes data in the memory in the system control portion 331, carries out a parallax correction for each block using the parallax value corresponding to this block, and then performs an image synthesis. Then, the parallax correcting portion for low contrast 348 writes the result into the memory in the system control portion 331. Since the first imaging device 123a and the fourth imaging device 123d mainly receive the green component of the object light, the first imaging signal I1 and the fourth imaging signal I4 are information signals of the green component of the object light. Also, since the second imaging signal 123b mainly receives the blue component of the object light, the second imaging signal I2 is an information signal of the blue component of the object light. Further, since the third imaging signal 123c mainly receives the red component of the object light, the third imaging signal I3 is an information signal of the red component of the object light. Since the parallax between the first imaging device 123a and the fourth imaging device 123d is calculated to be (Δi, Δi) in the i-th block Bi but there probably is a large error, G(x,y) indicating the intensity of green at the pixel coordinates (x,y) is given by the first imaging signal I1(x,y) as in Equation (70) below. Also, B(x,y) indicating the intensity of blue is given by multiplying the first imaging signal I1(x,y) by a factor of proportionality kB as in Equation (71) below. Here, the factor of proportionality kB is a constant. Incidentally, the factor of proportionality kB may be changed for each block Bi and may be the ratio of a value at the center of the block Bi of the second imaging signal I2(x,y) with respect to that of the first imaging signal I1(x,y), the ratio of a value at the center of the block Bi of the second imaging signal I2(x−Δi,y) shifted from the first imaging signal I1(x,y) by the parallax Δi in the x direction with respect to that of the first imaging signal I1(x,y), the ratio of an average of the second imaging signal I2(x,y) with respect to that of the first imaging signal I1(x,y) in the block Bi or the ratio of an average of the second imaging signal I2(x−Δi,y) shifted from the first imaging signal I1(x,y) by the parallax Δi in the x direction with respect to that of the first imaging signal I1(x,y) in the block Bi. Further, R(x,y) indicating the intensity of red is given by multiplying the first imaging signal I1(x,y) by a factor of proportionality kR as in Equation (72) below. Here, the factor of proportionality kR is a constant. Incidentally, the factor of proportionality kR may be changed for each block Bi and may be the ratio of a value at the center of the block Bi of the third imaging signal I3(x,y) with respect to that of the first imaging signal I1(x,y), the ratio of a value at the center of the block Bi of the third imaging signal I3(x,y−Δi) shifted from the first imaging signal I1(x,y) by the parallax Δi in the y direction with respect to that of the first imaging signal I1(x,y), the ratio of an average of the third imaging signal I3(x,y) with respect to that of the first imaging signal I1(x,y) in the block Bi or the ratio of an average of the third imaging signal I3(x,y−Δi) shifted from the first imaging signal I1(x,y) by the parallax Δi in the y direction with respect to that of the first imaging signal I1(x,y) in the block Bi. Incidentally, considering that some errors would not be noticeable because of the small variation in light and dark, similarly to the case of the parallax correction mode flag Fi=1, since the parallax between the first imaging device 123a and the second imaging device 123b is calculated to be (Δi, 0), B(x,y) indicating the intensity of blue at the pixel coordinates (x,y) may be given by the second imaging signal I2(x−Δi,y) as in Equation (68). Further, since the parallax between the first imaging device 123a and the third imaging device 123c is calculated to be (0,Δi), R(x,y) indicating the intensity of red at (x,y) may be given by the third imaging signal I3(x,y−Δi) as in Equation (69).

$$G(x,y)=I1(x,y) \quad (70)$$

$$B(x,y)=I1(x,y)*kB \quad (71)$$

$$R(x,y)=I1(x,y)*kR \quad (72)$$

In Step S3280, in the block with the parallax correction mode flag Fi=3, the correlation value for parallax accuracy evaluation R2i is small, and the contrast evaluation value for parallax accuracy evaluation C6i is large. Now, the threshold R20 is set to a value close to 1 (for example, 0.9) as shown in FIG. 32, and when the correlation value for parallax accuracy evaluation R2i is smaller than the threshold R20, it can be judged that the first imaging signal I1(x,y) and the fourth imaging signal I4 (x−Δi,y−Δi) shifted therefrom by the parallax Δi in the i-th block Bi are not similar. This indicates that there are a plurality of subjects at different subject distances in the i-th block Bi and the parallax Δi cannot deal with all of the subjects.

Figure 34:
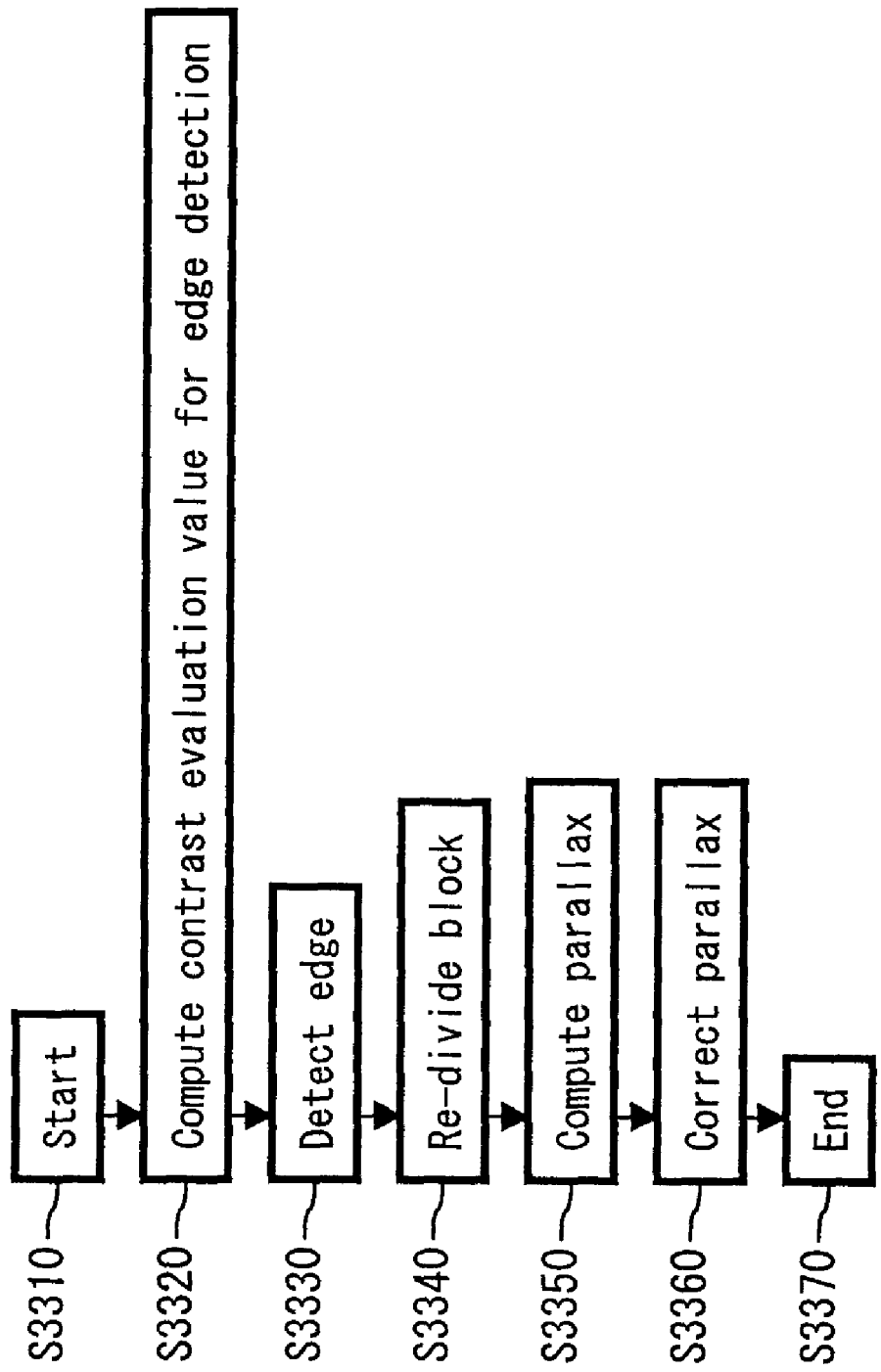
FIG. 34 is a flowchart showing an operation of a parallax correcting portion for low correlation according to Embodiment 3 of the present invention.

Accordingly, in the block with the parallax correction mode flag Fi=3, the parallax correcting portion for low correlation 349 utilizes data in the memory in the system control portion 331, re-divides the block further into plural blocks using edges, carries out a parallax correction, and then performs an image synthesis. Then, the parallax correcting portion for low correlation 349 writes the result into the memory in the system control portion 331. FIG. 34 is a flowchart showing an operation of the parallax correcting portion for low correlation 349 according to Embodiment 3 of the present invention.

In Step S3310, the operation of the parallax correcting portion for low correlation 349 is started. Next, Step S3320 is executed.

Figure 35A:
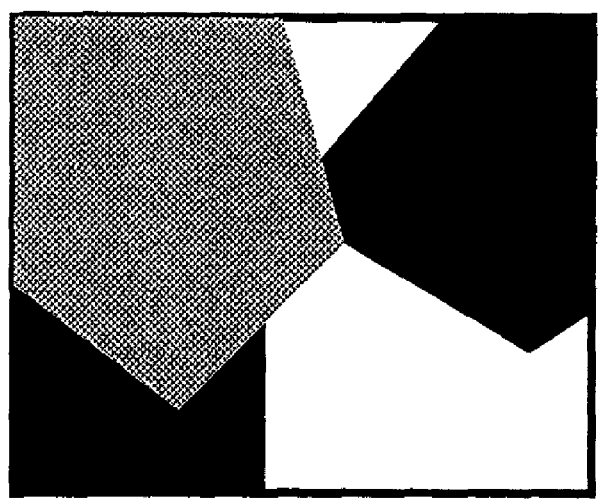
FIG. 35A shows an original image for describing an edge detection of the parallax correcting portion for low correlation of the camera module according to Embodiment 3 of the present invention.
Figure 35B:
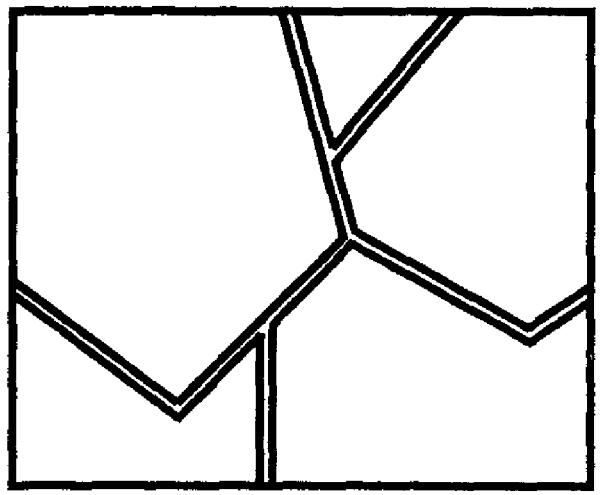
FIG. 35B shows an image of a contrast evaluation value for edge detection for describing the edge detection of the parallax correcting portion for low correlation of the camera module according to Embodiment 3 of the present invention.

In Step S3320, a contrast evaluation value for edge detection is computed. This computation is performed only for the first imaging signal I1. Laplacian is computed as per Equation (73) below and further is subjected spatially to a LPF (low-pass filter) as per Equation (74) below, and the result is given as a contrast evaluation value for edge detection C8$(x,y)$. FIG. 35A shows an original image for describing the edge detection of the parallax correcting portion for low correlation 349 of the camera module according to Embodiment 3 of the present invention, and FIG. 35B shows an image of the contrast evaluation value for edge detection for describing the edge detection of the parallax correcting portion for low correlation 349 of the camera module according to Embodiment 3 of the present invention. From Equations (73) and (74), the contrast evaluation value for edge detection C8$(x,y)$ of the original image in FIG. 35A is calculated, which is shown in FIG. 35B. It should be noted that black in FIG. 35B indicates where an absolute value of Equation (74) is large. Next, Step S3330 is executed.

$$C7(x, y) = \\ I1(x-1, y) + I1(x+1, y) + I1(x, y-1) + I1(x, y+1) - 4I1(x, y) \quad (73)$$

$$C8(x, y) = C7(x-1, y-1) + C7(x, y-1) + \\ C7(x+1, y-1) + C7(x-1, y) + C7(x, y) + C7(x+1, y) + \\ C7(x-1, y+1) + C7(x, y+1) + C7(x+1, y+1) \quad (74)$$

Figure 35C:
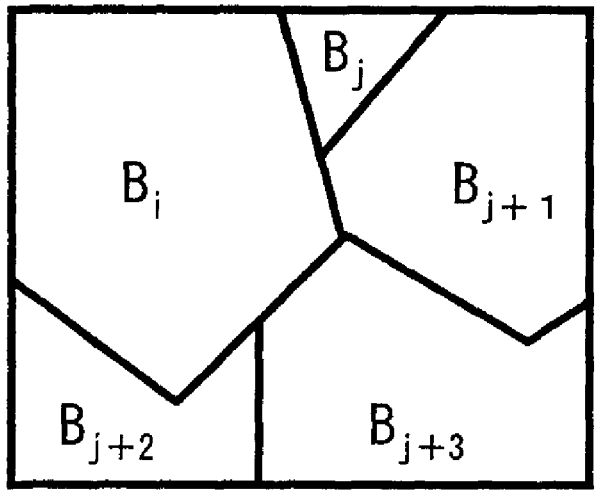
FIG. 35C shows an image of edges for describing the edge detection of the parallax correcting portion for low correlation of the camera module according to Embodiment 3 of the present invention.

In Step S3330, the edges are detected. FIG. 35C shows an image of the edges for describing the edge detection of the parallax correcting portion for low correlation 349 of the camera module according to Embodiment 3 of the present invention. By sensing a zero crossing (a point at which a value changes from positive to negative and a point at which a value changes from negative to positive) of the contrast evaluation value for edge detection C8$(x,y)$ in FIG. 35B, it is possible to detect the edges as shown in FIG. 35C. Next, Step S3340 is executed.

In Step S3340, the block is re-divided. As shown in FIG. 35C, numbers such as Bi, Bj, Bj+1, . . . , Bj+n are assigned to regions surrounded by the edges. It should be noted that j, j+1, . . . , j+n are unassigned numbers for indicating blocks. Here, for the sake of simplicity, FIG. 35 illustrates an example in which the block Bi is re-divided into 5 blocks and n=3. Incidentally, in order to prevent erroneous detection and loss of the edges due to noise or the like, the edges also may be corrected using a dilation algorithm or an erosion algorithm. Next, Step S3350 is executed.

In Step S3350, a parallax value is computed for each block. This operation is similar to that in Step S3240, and the description thereof will be omitted. Next, Step S3360 is executed.

In Step S3360, a parallax is corrected, and an image synthesis is performed. This operation is similar to that of the usual parallax correcting portion 347, and the description thereof will be omitted. Next, Step S3370 is executed.

In Step S3370, the operation of parallax correction for low correlation is ended.

Step S3280 is operated as described above, and then Step S3290 is executed.

In Step S3290, the parallax correction is ended, thus returning to a main routine. In other words, Step S3800 shown in FIG. 25 is executed next.

In Step S3800, an image is outputted. The input/output portion 136 outputs G(x,y), B(x,y) and R(x,y), which are data in the memory in the system control portion 331, to the main CPU (not shown) and the external display (not shown). It should be noted that a luminance signal or a color difference signal, for example, may be outputted instead of G(x,y), B(x,y) and R(x,y). Also, values after the image processings such as a white-balance correction and a γ correction may be outputted. Further, reversibly compressed data or irreversibly compressed data such as JPEG may be outputted. Moreover, a plurality of them may be outputted. Next, S3900 is executed.

In Step S3900, the operation ends.

With the above-described configuration and operations, the following effects are achieved.

As in Equation (1), the relative positions of the four object images formed respectively by the first lens portion 113a, the second lens portion 113b, the third lens portion 113c and the fourth lens portion 113d vary according to the subject distance A. In other words, when the subject distance A decreases, the parallax Δ increases. Accordingly, when a plurality of subjects at different distances are shot at the same time, the parallaxes A for the individual subjects are different. In the camera module according to Embodiment 3, the entire image region is divided into blocks in Step S3230, the parallax for each block is computed in Step S3240, and the parallax correction is carried out by the image synthesis based on the parallax for each block so as to reduce the parallactic influence in Step S3280. In this manner, even when a plurality of subjects at different distances are shot at the same time, it is possible to correct the parallaxes of the individual subjects suitably, thereby achieving a beautiful image with reduced parallactic influence over the entire image region.

In the camera module according to Embodiment 3, the entire image region is divided into rectangular blocks in Step S3230, the parallax for each block is computed in Step S3240, and the parallax correction is carried out by the image synthesis based on the parallax for each block so as to reduce the parallactic influence in Step S3280. In this manner, even when a plurality of subjects at different distances are shot at the same time, it is possible to correct the parallaxes of the individual subjects suitably, thereby achieving a beautiful image with reduced parallactic influence over the entire image region.

Also, the block divided in Step S3230 sometimes contains a plurality of objects at different subject distances. In this case, the parallaxes for the individual objects are different. In the camera module according to Embodiment 3, the correlation value for parallax accuracy evaluation R2$i$ is computed in Step S3251, the correlation value for parallax accuracy evaluation R2$i$ is evaluated so as to evaluate the accuracy of the parallax Δi in Step S3252, the contrast evaluation value for parallax accuracy evaluation C6*i* is computed in Step S3261, the contrast evaluation value for parallax accuracy evaluation C6*i* is evaluated so as to evaluate the accuracy of the parallax Δi, and the parallax correction mode flag Fi is set, thus determining the mode of parallax correction in Step S3262. In this manner, it is possible to correct an image by an optimal correction method for each block, thereby achieving a beautiful image with further reduced parallactic influence over the entire image region.

Moreover, in the camera module according to Embodiment 3, the contrast evaluation value for parallax accuracy evaluation C6*i* is computed in Step S3261, the accuracy of the parallax Δi computed for each block is judged according to the degree of contrast of the contrast evaluation value for parallax accuracy evaluation C6*i* for each block in Step S3262. When the contrast is large, the parallax correction mode flag Fi is set to 1, followed by the normal parallax correction in Step S3280. When the contrast is small, the parallax correction mode flag Fi is set to 2, followed by the parallax correction for low contrast in Step S3280. In this manner, it is possible to correct an image by an optimal correction method for each block, thereby achieving a beautiful image with further reduced parallactic influence over the entire image region.

Moreover, in the camera module according to Embodiment 3, the correlation value for parallax accuracy evaluation R2*i* is computed in Step S3251. The correlation value for parallax accuracy evaluation R2*i* is one of parallax accuracy evaluation values indicating the accuracy of the parallax computed for each block and a value indicating how much an image shifted by the parallax is correlated with the original image. When the correlation value for parallax accuracy evaluation R2*i* is large in Step S3252, the usual parallax correction is carried out in Step S3280. When the correlation value for parallax accuracy evaluation R2*i* is small, the parallax correction for low correlation is carried out in Step S3280. In this manner, it is possible to correct an image by an optimal correction method for each block, thereby achieving a beautiful image with further reduced parallactic influence over the entire image region.

Furthermore, in the camera module according to Embodiment 3, the correlation value for parallax accuracy evaluation R2*i* is computed in Step S3251. The correlation value for parallax accuracy evaluation R2*i* is one of parallax accuracy evaluation values indicating how accurate the parallax computed for each block is and a value indicating how much an image shifted by the parallax is correlated with the original image. When the correlation value for parallax accuracy evaluation R2*i* is large, the usual parallax correction is carried out in Step S3280. When the correlation value for parallax accuracy evaluation R2*i* is small, the parallax correcting portion for low correlation 349 re-divides the block and carries out the parallax correction for each of the re-divided blocks in Steps S3272 and S3340. In other words, the block that is judged to have a low correlation is re-divided. In this manner, it is possible to correct an image by an optimal correction method for each block, thereby achieving a beautiful image with further reduced parallactic influence over the entire image region.

Additionally, in the camera module according to Embodiment 3, the correlation value for parallax accuracy evaluation R2*i* is computed in Step S3251. The correlation value for parallax accuracy evaluation R2*i* is one of parallax accuracy evaluation values indicating how accurate the parallax computed for each block is and a value indicating how much an image shifted by the parallax is correlated with the original image. In Step S3261, the contrast evaluation value for parallax accuracy evaluation C6*i* is computed. The contrast evaluation value for parallax accuracy evaluation C6*i* is one of parallax accuracy evaluation values indicating how accurate the computed parallax is and a value indicating how high the contrast is. When the correlation value for parallax accuracy evaluation R2*i* is large and the contrast evaluation value for parallax accuracy evaluation C6*i* is large, the usual parallax correction is carried out in Step S3280. When the correlation value for parallax accuracy evaluation R2*i* is small and the contrast evaluation value for parallax accuracy evaluation C6*i* is small, the parallax correction for low contrast is carried out in Step S3280. When the correlation value for parallax accuracy evaluation R2*i* is small and the contrast evaluation value for parallax accuracy evaluation C6*i* is large, the parallax correcting portion for low correlation 349 re-divides the block and carries out the parallax correction for each of the re-divided blocks in Steps S3272 and S3340. In other words, the block that is judged to have a low correlation and a high contrast is re-divided. In this manner, it is possible to correct an image by an optimal correction method for each block, thereby achieving a beautiful image with further reduced parallactic influence over the entire image region.

Incidentally, in Embodiment 3, the timing of the image output is not limited to the above, and a preview may be outputted suitably. For example, in Embodiment 3, during the automatic focusing control in Step S3100, an image without parallax correction may be outputted. Further, it also may be possible to update a preview screen by carrying out the parallax correction for only the blocks whose parallax can be corrected after Step S3271 without correcting parallaxes for the other blocks.

Also, in Embodiment 3, the contrast evaluation value for edge detection $C8(x,y)$ is computed as per Equation (74) in Step S3320, and the edges are detected from zero crossing in Step S3330. However, there is no limitation to the above. For example, it also may be possible to create a histogram in the block and use the minimum value as the threshold so as to perform the block division by binarization. Here, the number of the thresholds may be more than one. In addition, the edges may be detected using an absolute value of first order differentials.

Embodiment 4

In the case of an interlaced reading, Embodiment 4 of the present invention computes parallaxes for individual fields so as to synthesize images and synthesizes the images synthesized for the individual fields, thus obtaining a final image. By computing the parallaxes for the individual fields in this manner, even in the case where the images of the individual fields are different because shooting times for the individual fields are different when shooting a moving subject, it is possible to compute the parallaxes for the individual fields properly and synthesize the images using these parallaxes, so that a beautiful image with further reduced parallactic influence can be achieved over an entire image region.

In the following, a camera module according to Embodiment 4 of the present invention will be described, with reference to the accompanying drawings.

Figure 36:
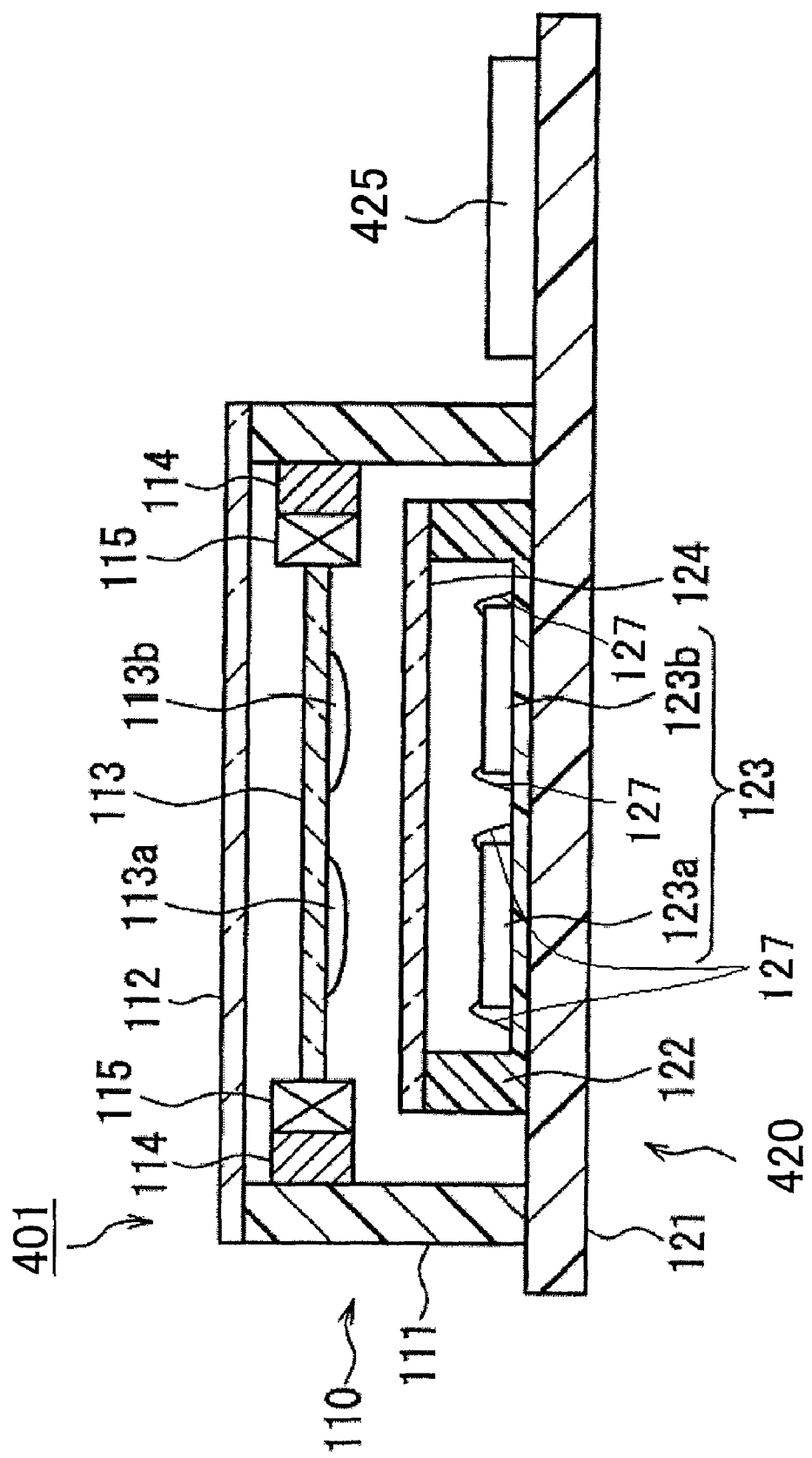
FIG. 36 is a sectional view showing a configuration of a camera module according to Embodiment 4 of the present invention.

FIG. 36 is a sectional view showing a configuration of the camera module according to Embodiment 4 of the present invention. The configuration is similar to that of Embodiment 1 except for an SLSI 425 of a circuit portion 420 of a camera module 401. Members similar to those in Embodiment 1 are assigned the same reference numerals, and the description thereof will be omitted.

Figure 37:
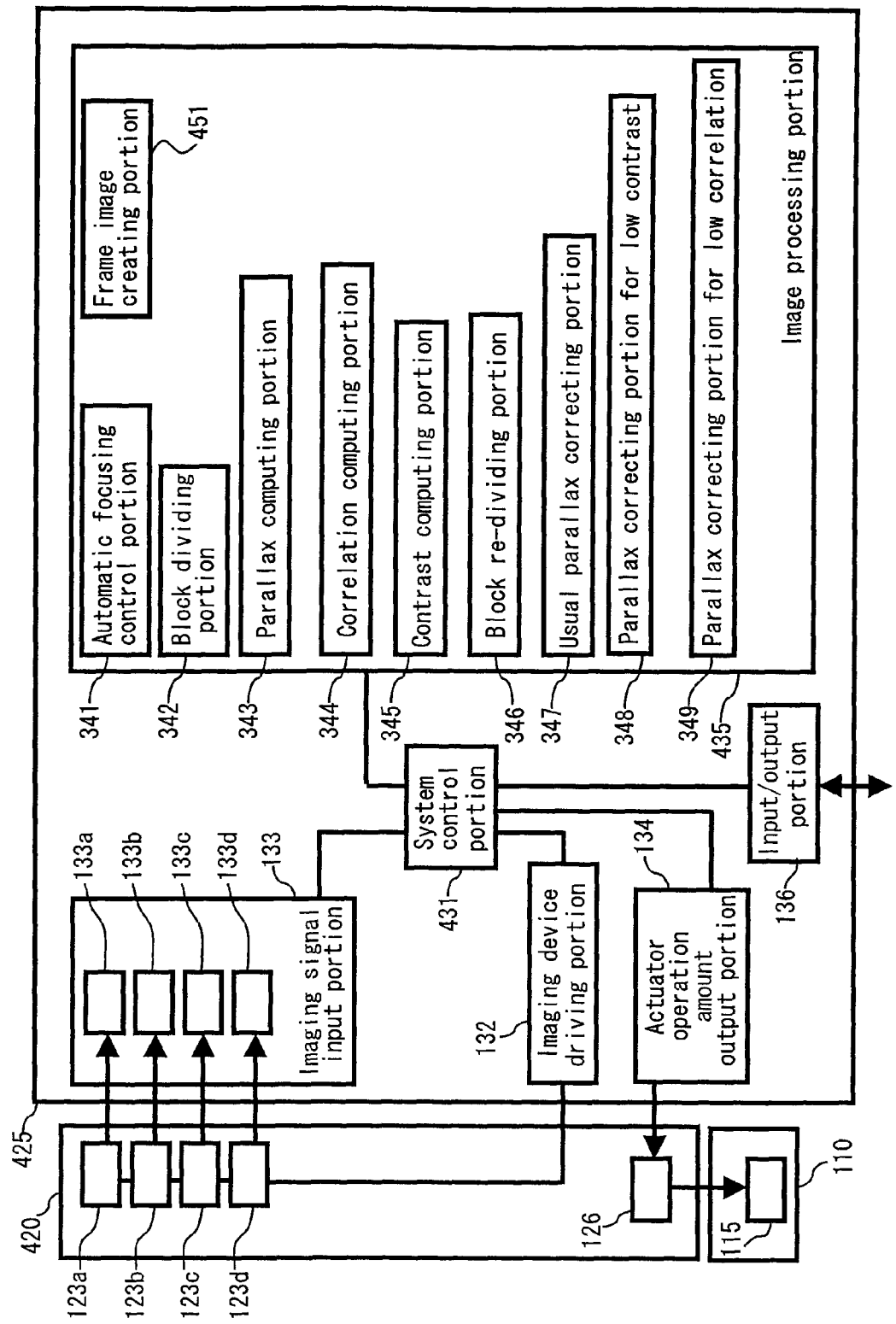
FIG. 37 is a block diagram showing the camera module according to Embodiment 4 of the present invention.

FIG. 37 is a block diagram showing the camera module according to Embodiment 4 of the present invention. The SLSI 425 includes a system control portion 431, an imaging device driving portion 132, an imaging signal input portion 133, an actuator operation amount output portion 134, an image processing portion 435 and an input/output portion 136. Also, the circuit portion 420 includes an amplifier 126 in addition to the configuration described above.

The image processing portion 435 is configured so as to include a logic circuit, a DSP (digital signal processor) or both of the logic circuit and the DSP and carries out various image processings utilizing memory information in the system control portion 431. The image processing portion 435 includes an automatic focusing control portion 341, a block division portion 342, a parallax computing portion 343, a correlation computing portion 344, a contrast computing portion 345, a block re-dividing portion 346, a usual parallax correcting portion 347, a parallax correcting portion for low contrast 348, a parallax correcting portion for low correlation 349 and a frame image creating portion 451.

FIGS. 38A to 38D are drawings for describing field images of the camera module according to Embodiment 4 of the present invention. As shown in FIG. 38A, in the entire image, first field images and second field images are arranged alternately. First, an imaging signal composing the first field image is transferred, and then an imaging signal composing the second field image is transferred. For a usual black-and-white image, each line of these field images is arranged alternately, thereby reproducing the entire image. When L indicates the width of the entire image (frame image) and H indicates the height thereof as in FIG. 38B, the first field image and the second field image respectively have a width of L and a height of H/2 as shown in FIG. 38C and FIG. 38D.

Figure 39:
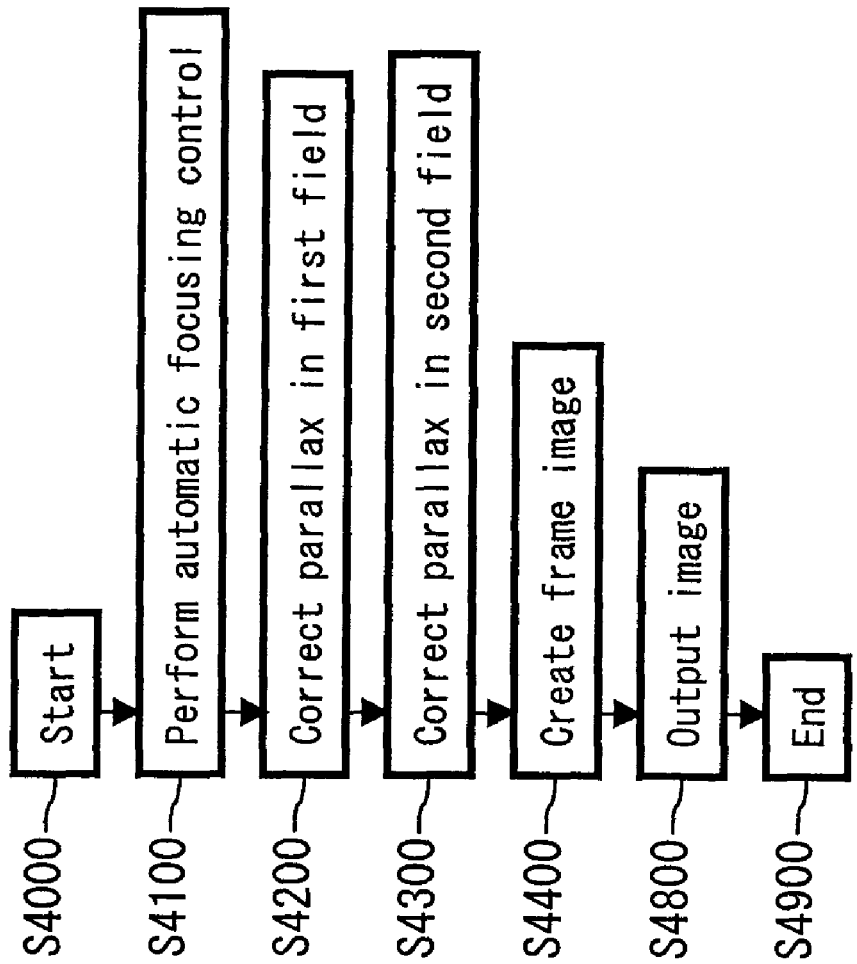
FIG. 39 is a flowchart showing an operation of the camera module according to Embodiment 4 of the present invention.
Figure 40:
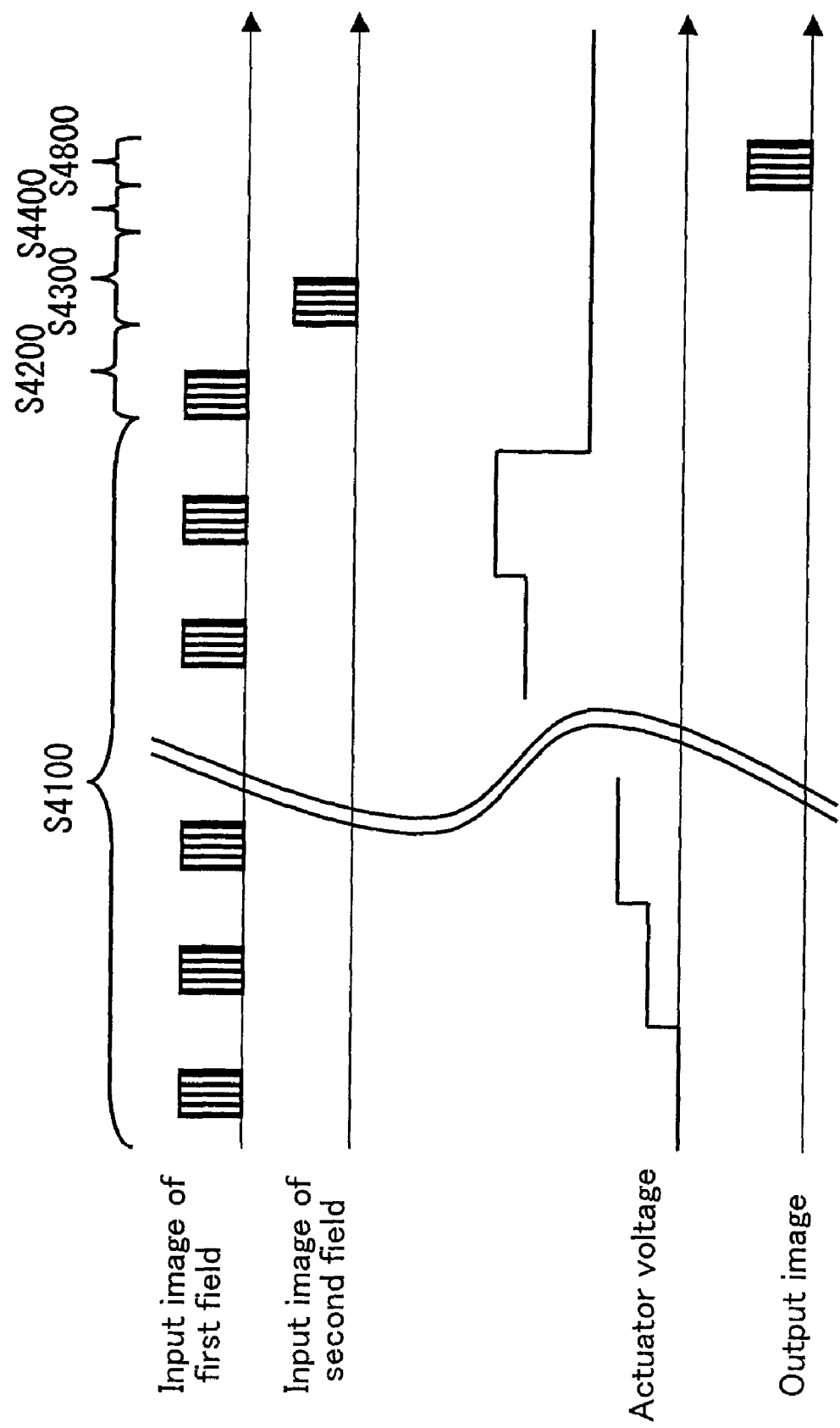
FIG. 40 is a timing chart showing the operation of the camera module according to Embodiment 4 of the present invention.

FIG. 39 is a flowchart showing an operation of the camera module according to Embodiment 4 of the present invention, and FIG. 40 is a timing chart showing the operation of the camera module according to Embodiment 4 of the present invention. The camera module 401 is operated as per these flowchart and timing chart by the system control portion 431 of the SLSI 425.

In Step S4000, the operation starts. For example, the main CPU (not shown) senses that a shutter button (not shown) or the like is pressed down, and instructs the camera module 401 to start operating via the input/output portion 136, whereby the camera module 401 starts operating. Next, Step S4100 is executed.

In Step S4100, the automatic focusing control portion 341 executes an automatic focusing control. This operation is similar to that in Step S3100 in Embodiment 3, and the description thereof will be omitted. However, since only the first field is transferred and only the first field image is used as shown in FIG. 40, modifications are made suitably. Thus, the time needed for transferring is reduced substantially by half compared with the case of transferring the entire image (the first fields and the second fields), so that the time for automatic focusing control can be shortened accordingly. Next, Step S4200 is executed.

In Step S4200, a parallax correction of the first field is executed. This operation is similar to that in Step S3200 in Embodiment 3, and the description thereof will be omitted. However, modifications are made suitably so that only the first field is transferred and only the first field image is used as shown in FIG. 40, thus creating $Rf1(x,y)$ indicating the intensity of red, $Gf1(x,y)$ indicating the intensity of green and $Bf1(x,y)$ indicating the intensity of blue of the first field. Next, Step S4300 is executed.

In Step S4300, a parallax correction of the second field is executed. This operation is similar to that in Step S3200 in Embodiment 3, and the description thereof will be omitted. However, modifications are made suitably so that only the second field is transferred and only the second field image is used as shown in FIG. 40, thus creating $Rf2(x,y)$ indicating the intensity of red, $Gf2(x,y)$ indicating the intensity of green and $Bf2(x,y)$ indicating the intensity of blue of the second field. Next, Step S4400 is executed.

In Step S4400, a frame image (entire image) is created. $Rf1(x,y)$ indicating the intensity of red in the first frame serves as $R(x,2*y)$ indicating the intensity of red in even-numbered lines of the frame image as in Equation (75) below, and $Rf2(x,y)$ indicating the intensity of red in the second frame serves as $R(x,2*y+1)$ indicating the intensity of red in odd-numbered lines of the frame image as in Equation (76) below. Also, $Gf1(x,y)$ indicating the intensity of green in the first frame serves as $G(x,2*y)$ indicating the intensity of green in even-numbered lines of the frame image as in Equation (77) below, and $Gf2(x,y)$ indicating the intensity of green in the second frame serves as $G(x,2*y+1)$ indicating the intensity of green in odd-numbered lines of the frame image as in Equation (78) below. Further, $Bf1(x,y)$ indicating the intensity of blue in the first frame serves as $B(x,2*y)$ indicating the intensity of blue in even-numbered lines of the frame image as in Equation (79) below, and $Bf2(x,y)$ indicating the intensity of blue in the second frame serves as $B(x,2*y+1)$ indicating the intensity of blue in odd-numbered lines of the frame image as in Equation (80) below. Here, x is varied from 0 to L−1, and y is varied from 0 to H/2−1. Next, Step S4800 is executed.

$$R(x,2*y)=Rf1(x,y) \tag{75}$$

$$R(x,2*y+1)=Rf2(x,y) \tag{76}$$

$$G(x,2*y)=Gf1(x,y) \tag{77}$$

$$G(x,2*y+1)=Gf2(x,y) \tag{78}$$

$$B(x,2*y)=Bf1(x,y) \tag{79}$$

$$B(x,2*y+1)=Bf2(x,y) \tag{80}$$

In Step S4800, an image is outputted. This operation is similar to that in Embodiment 3, and the description thereof will be omitted. Next, S4900 is executed.

In Step S4900, the operation ends.

With the above-described configuration and operations, the camera module according to Embodiment 4 has the effects similar to Embodiment 3.

In the camera module according to Embodiment 4, in the case of the interlaced reading, the parallax of the first field is computed in Step S4200, and the parallax correction is carried out based on the computed parallax, thus creating the image (Rf1, Gf1, Bf1). Also, the parallax of the second field is computed in Step S4300, and the parallax correction is carried out based on the computed parallax, thus creating the image (Rf2, Gf2, Bf2). Further, the images synthesized for the individual fields are synthesized in Step S4400, thus obtaining the final image. By computing the parallaxes for individual fields in this manner, even in the case where the images of the individual fields are different because shooting times for the individual fields are different when shooting a moving subject, it is possible to compute the parallaxes for the individual fields properly. This allows the image synthesis using these parallaxes, so that a beautiful image with further reduced parallactic influence can be achieved over an entire image region.

Although the number of fields is 2 in the camera module according to Embodiment 4, there is no limitation to this. There may be more fields (for example, 3 fields or 4 fields).

Although the images for the individual fields are created in the camera module according to Embodiment 4, a region in the frame image may be prepared in advance so as to allow a direct substitution. Also, it also may be possible to retain parallax information for the individual fields and create the frame image directly without creating any field image.

Figure 41A:
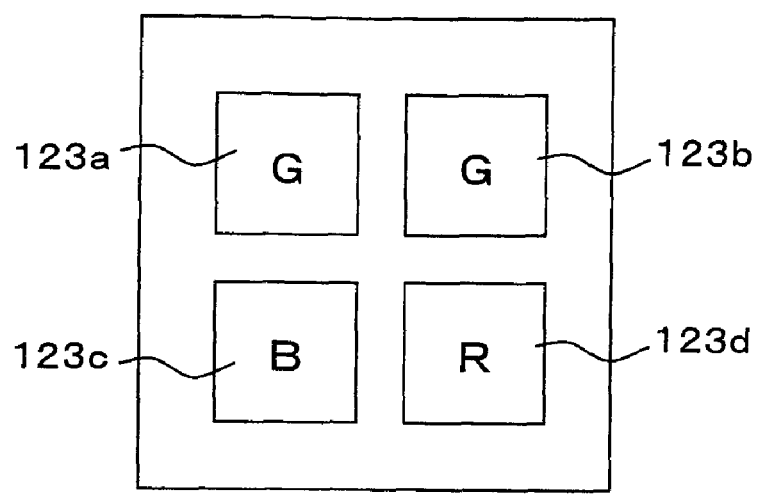
FIGS. 41A to 41C are plan views schematically showing preferable arrangement examples of color filters in the camera module according to Embodiment 4 of the present invention.
Figure 41B:
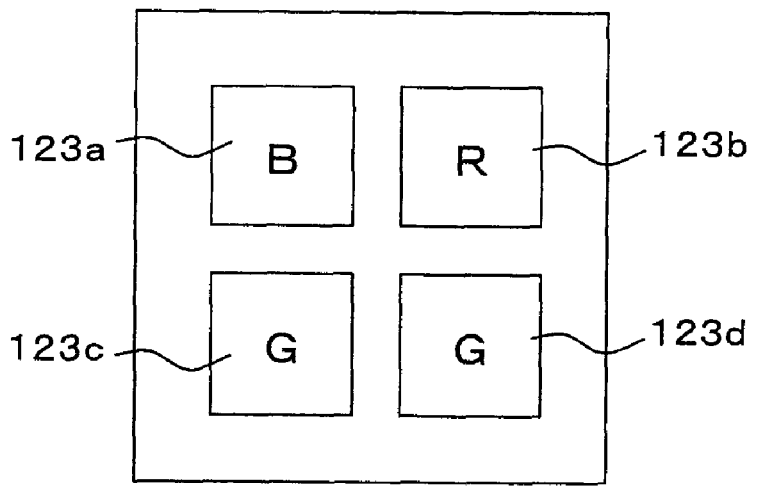

Moreover, in the camera module according to Embodiment 4, two color filters adjacent to each other in the X direction among the first color filter 124a, the second color filter 124b, the third color filter 124c and the fourth color filter 124d may have spectral transmittance characteristics mainly transmitting green as shown respectively in FIGS. 41A and 41B. Incidentally, in FIGS. 41A to 41C, signs R, G and B indicate the colors transmitted by the respective color filters. With the configuration of FIG. 41A or 41B, two imaging devices adjacent to each other in the X direction in the imaging device 123 (namely, the first imaging device 123a and the second imaging device 123b, or the third imaging device 123c and the fourth imaging device 123d) receive a green component in the object light.

Figure 41C:
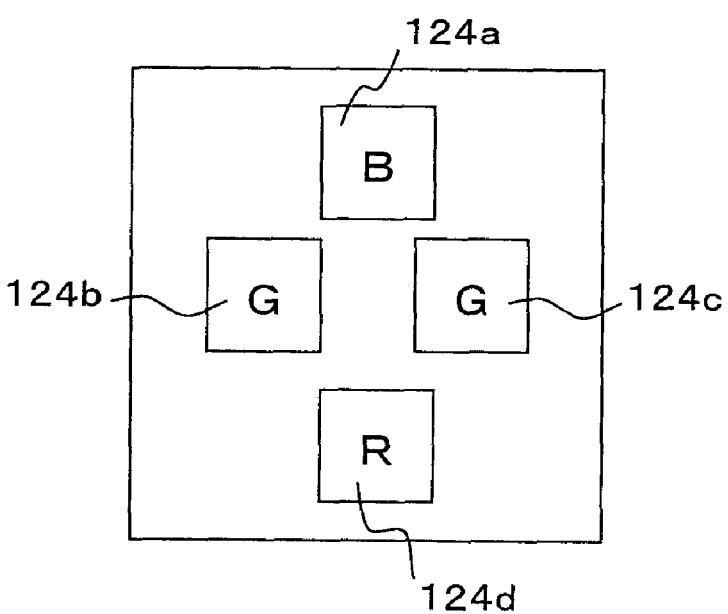

Alternatively, the first color filter 124a, the second color filter 124b, the third color filter 124c and the fourth color filter 124d may be arranged as shown in FIG. 41C, and two color filters adjacent to each other in the X direction (in this example, the second color filter 124b and the third color filter 124c) may have spectral transmittance characteristics mainly transmitting green. Incidentally, in the case where four color filters are arranged as shown in FIG. 41C, the first lens portion 113a, the second lens portion 113b, the third lens portion 113c and the fourth lens portion 113d in the lens portion 113 are arranged so that their optical axes match with the centers of these color filters. Similarly, the first imaging device 123a, the second imaging device 123b, the third imaging device 123c and the fourth imaging device 123d in the imaging device 123 also are arranged according to the arrangement of the individual lens portions in the lens portion 113. Here, modifications are made suitably so that the parallax is computed from the first imaging signal I1 and the second imaging signal I2.

By adopting the arrangement of the color filters as shown in FIGS. 41A to 41C, the camera module 401 according to the present embodiment has the following advantage. Since the parallax is computed by comparing the first imaging signal I1 and the second imaging signal I2, the parallax is generated only in the x direction and does not extend over the fields. Thus, a more accurate parallax can be computed.

It should be noted that FIGS. 41A to 41C only illustrate examples of preferable arrangements of the color filters, and the embodiment of the present invention is not limited to them. For example, the positions of the color filters indicated by B and R may be reversed.

Embodiment 5

Embodiment 5 of the present invention recognizes a block with a small parallax, namely, a large subject distance as a background and replaces it with another image such as a background image that is stored in advance. By combining the image corrected based on the parallax and another image in this manner, it becomes possible to extract an image in a part with a large parallax properly from the corrected image, so that these images can be combined beautifully.

In the following, a camera module according to Embodiment 5 of the present invention will be described, with reference to the accompanying drawings.

Figure 42:
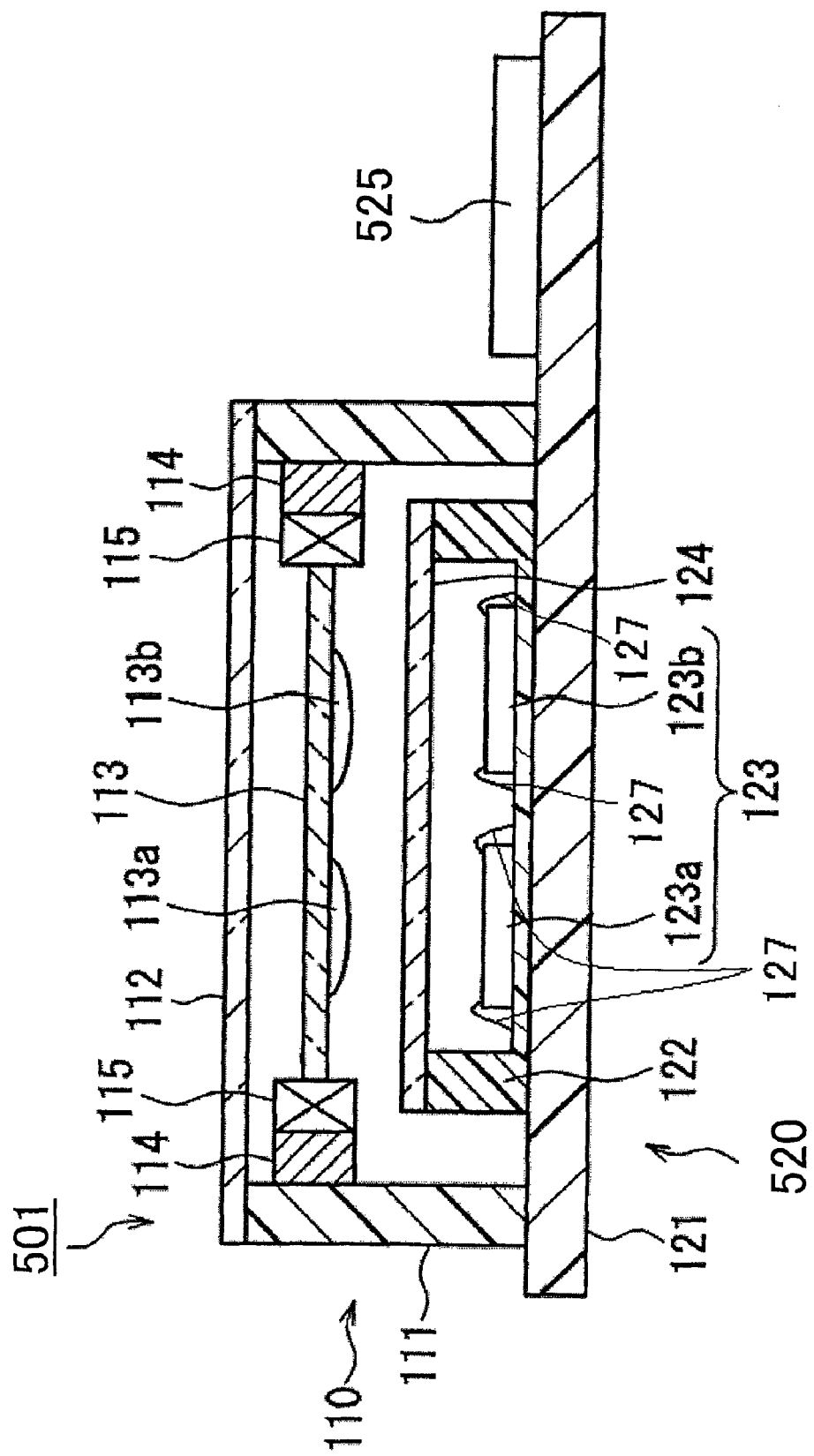
FIG. 42 is a sectional view showing a configuration of a camera module according to Embodiment 5 of the present invention.

FIG. 42 is a sectional view showing a configuration of the camera module according to Embodiment 5 of the present invention. The configuration is similar to that of Embodiment 1 except for an SLSI 525 of a circuit portion 520 of a camera module 501. Members similar to those in Embodiment 1 are assigned the same reference numerals, and the description thereof will be omitted.

Figure 43:
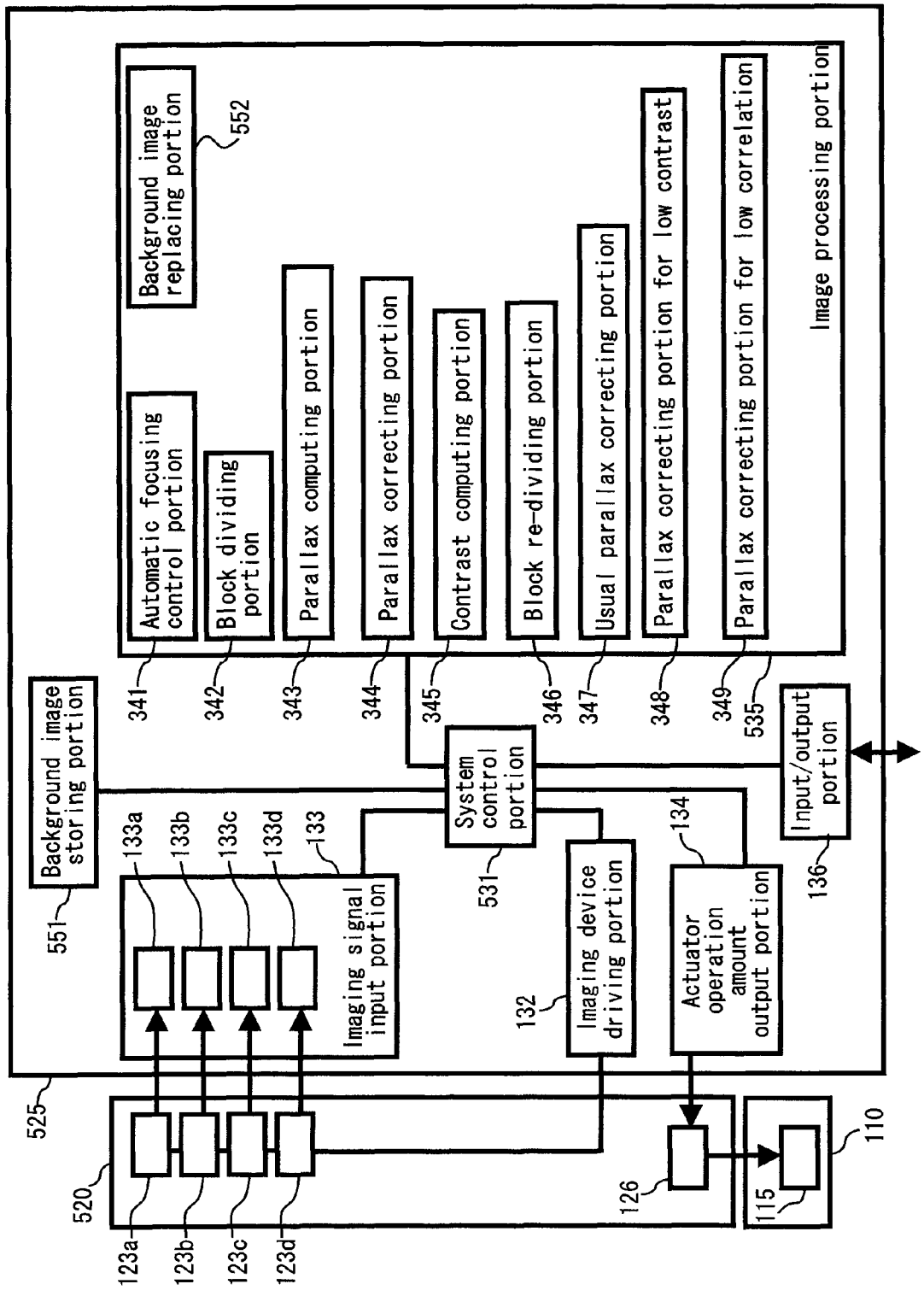
FIG. 43 is a block diagram showing the camera module according to Embodiment 5 of the present invention.

FIG. 43 is a block diagram showing the camera module according to Embodiment 5 of the present invention. The SLSI 525 includes a system control portion 531, an imaging device driving portion 132, an imaging signal input portion 133, an actuator operation amount output portion 134, an image processing portion 535, an input/output portion 136 and a background image storing portion 551. Also, the circuit portion 520 includes an amplifier 126 in addition to the configuration described above.

The image processing portion 535 is configured so as to include a logic circuit, a DSP (digital signal processor) or both of the logic circuit and the DSP and carries out various image processings utilizing memory information in the system control portion 531. The image processing portion 535 includes an automatic focusing control portion 341, a block division portion 342, a parallax computing portion 343, a correlation computing portion 344, a contrast computing portion 345, a block re-dividing portion 346, a usual parallax correcting portion 347, a parallax correcting portion for low contrast 348, a parallax correcting portion for low correlation 349 and a background image replacing portion 552.

The background image storing portion 551 is configured by a rewritable memory such as a RAM or a flash memory, stores image information and is rewritten suitably from an external part via the input/output portion 136 and the system control portion 531.

Figure 44:
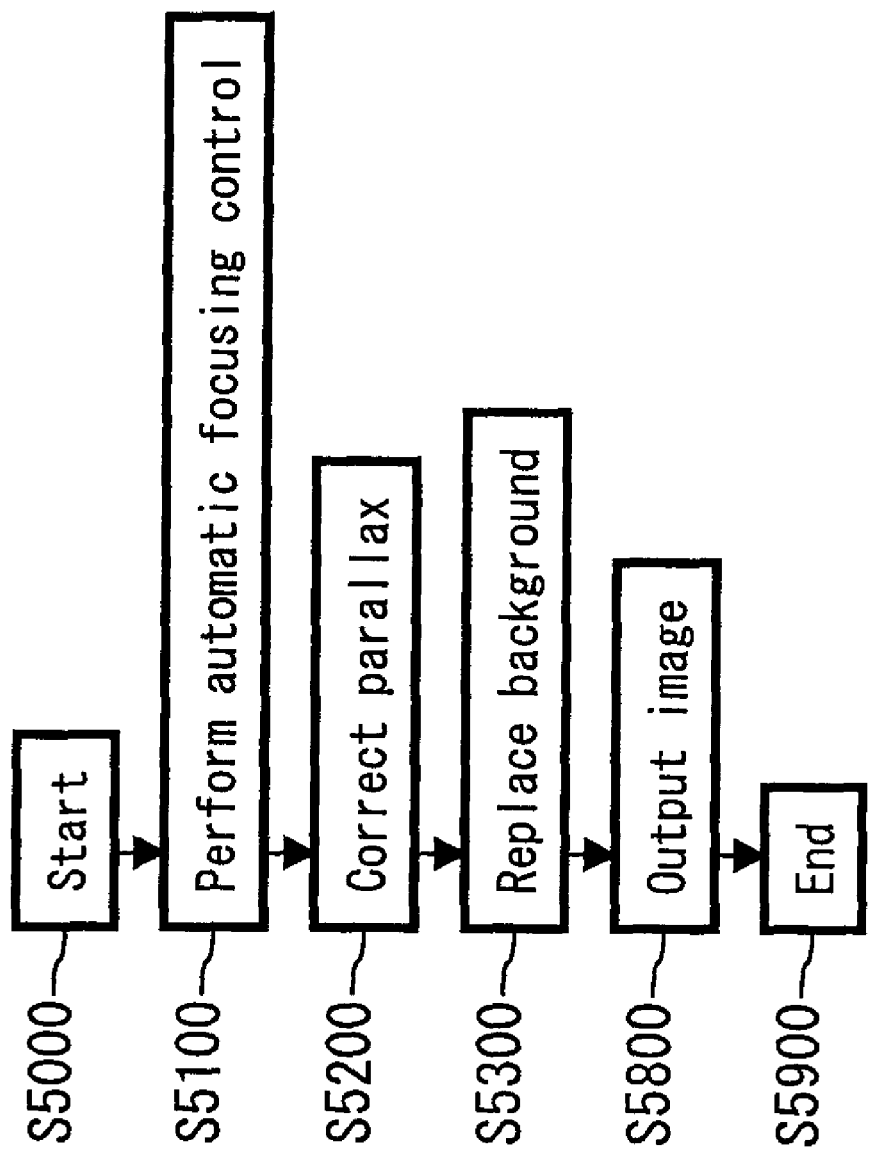
FIG. 44 is a flowchart showing an operation of the camera module according to Embodiment 5 of the present invention.

FIG. 44 is a flowchart showing an operation of the camera module according to Embodiment 5 of the present invention. The camera module 501 is operated as per this flowchart by the system control portion 531 of the SLSI 525.

In Step S5000, the operation starts. For example, the main CPU (not shown) senses that a shutter button (not shown) or the like is pressed down, and instructs the camera module 501 to start operating via the input/output portion 136, whereby the camera module 501 starts operating. Next, Step S5100 is executed.

In Step S5100, the automatic focusing control portion 341 executes an automatic focusing control. This operation is similar to that in Step S3100 in Embodiment 3, and the description thereof will be omitted. Next, Step S5200 is executed.

In Step S5200, a parallax correction is executed. This operation is similar to that in Step S3200 in Embodiment 3, and the description thereof will be omitted. Next, Step S5300 is executed.

In Step S5300, a background is replaced. The image is not changed for pixels whose parallax $\Delta i$ is larger than a threshold $\Delta sh$ as in Equations (81), (82) and (83) below. On the other hand, the image is replaced with an image (Rback, Gback, Bback) stored in the background image storing portion 551 for pixels whose parallax $\Delta i$ is equal to or smaller than the threshold $\Delta sh$ as in Equations (84), (85) and (86) below. Incidentally, $\Delta i$ indicates a parallax of the block Bi computed in Step S5200. Next, Step S5800 is executed.

$$R(x,y)=R(x,y)(\Delta i > \Delta sh) \quad (81)$$

$$G(x,y)=G(x,y)(\Delta i > \Delta sh) \quad (82)$$

$$B(x,y)=B(x,y)(\Delta i>\Delta sh) \qquad (83)$$

$$R(x,y)=R\text{back}(x,y)(\Delta i<\Delta sh) \qquad (84)$$

$$G(x,y)=G\text{back}(x,y)(\Delta i<\Delta sh) \qquad (85)$$

$$B(x,y)=B\text{back}(x,y)(\Delta i<\Delta sh) \qquad (86)$$

In Step S5800, an image is outputted. This operation is similar to that in Embodiment 3, and the description thereof will be omitted. Next, S5900 is executed.

In Step S5900, the operation ends.

With the above-described configuration and operations, the camera module according to Embodiment 5 has the effects similar to Embodiment 3.

Figure 45A:
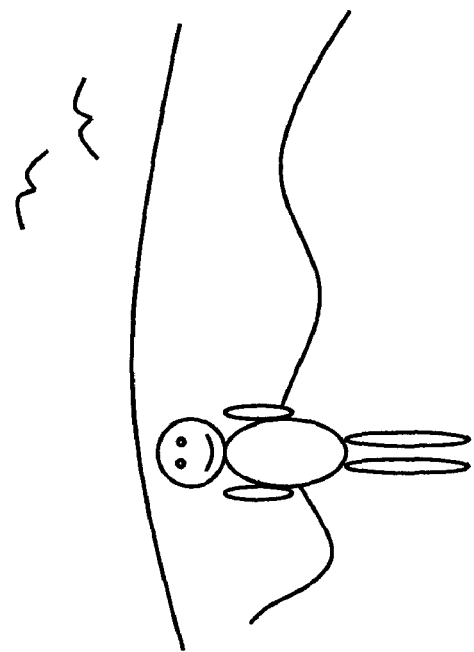
FIGS. 45A to 45C are drawings for describing a background replacement in the camera module according to Embodiment 5 of the present invention.
Figure 45B:
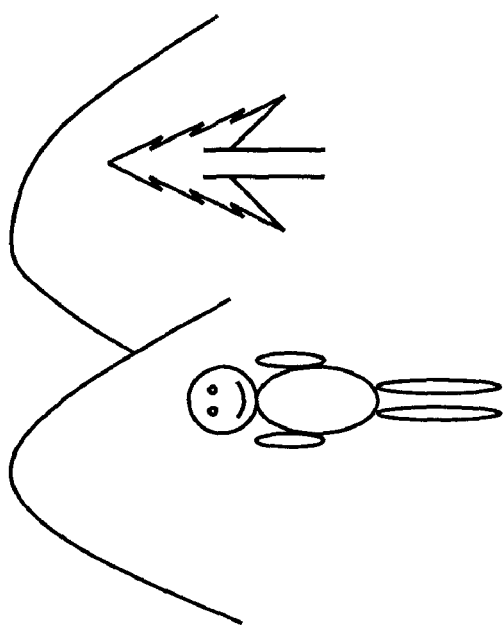
Figure 45C:
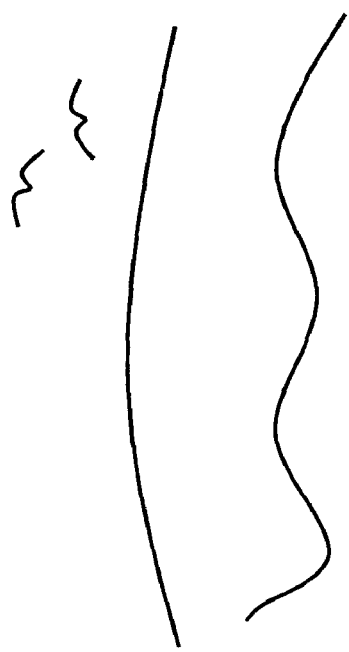

Embodiment 5 of the present invention recognizes the block Bi with a small parallax Δi, namely, a large subject distance as the background and replaces it with the background image (Rback,Gback,Bback) that is stored in advance in Step S5300. By combining the image corrected based on the parallax and another image in this manner, it becomes possible to extract an image in a part with a large parallax properly from the corrected image, so that these images can be combined beautifully. FIGS. 45A to 45C are drawings for describing the background replacement in the camera module according to Embodiment 5 of the present invention. In accordance with Embodiment 5, in the case of shooting a human figure with a background of a mountain as shown in FIG. 45A, for example, the parallax Δi of the human figure is large and the parallax Δi of the mountain in the background is small. Here, if the threshold Δsh of the parallax is set between the parallax of the human figure and that of the mountain, an image of the human figure with a background of the sea as shown in FIG. 45C can be created by replacing pixels of the mountain in the background with a background image of the sea stored in the background image storing portion (see FIG. 45B; (Rback,Gback,Bback)).

Embodiment 6

Figure 46A:
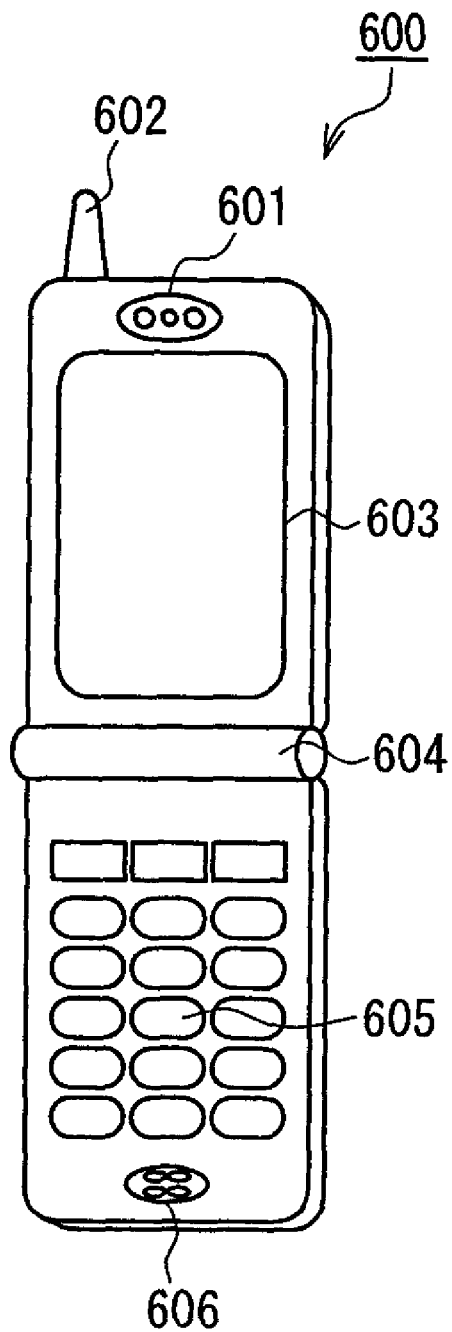
FIGS. 46A and 46B illustrate an example of an electronic apparatus according to Embodiment 6 of the present invention.
Figure 46B:
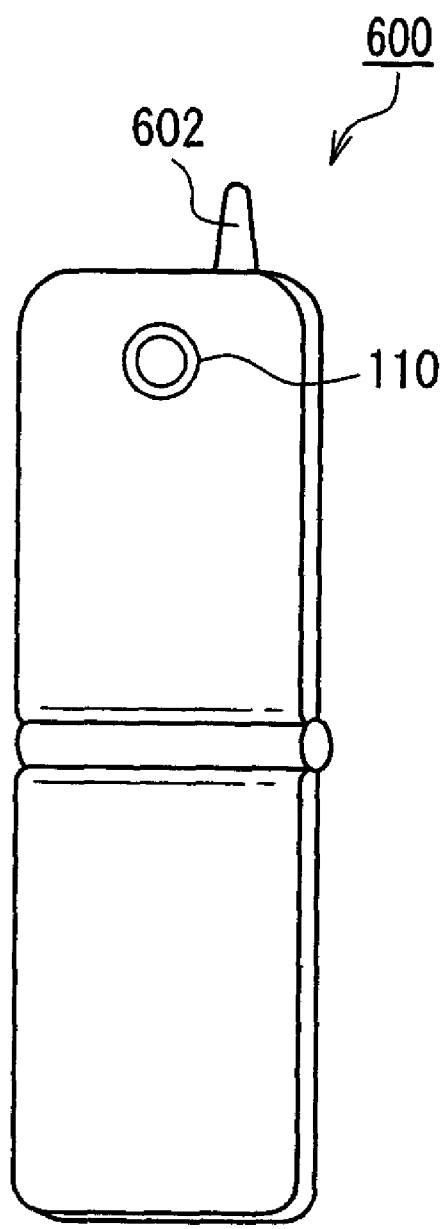
Figure 47:
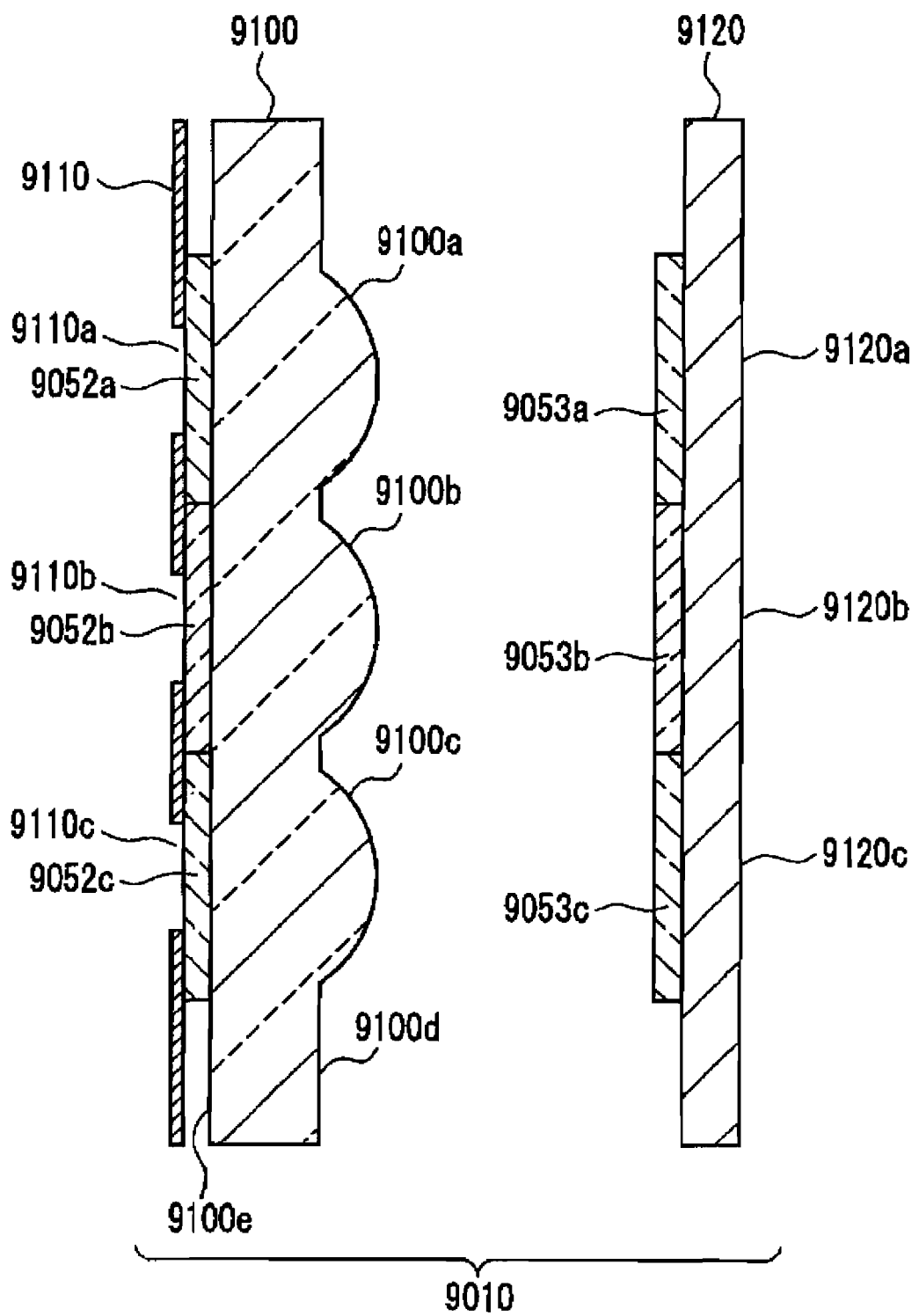
FIG. 47 is a sectional view showing a configuration of a conventional camera module (described in JP 2001-78213 A).
Figure 48:
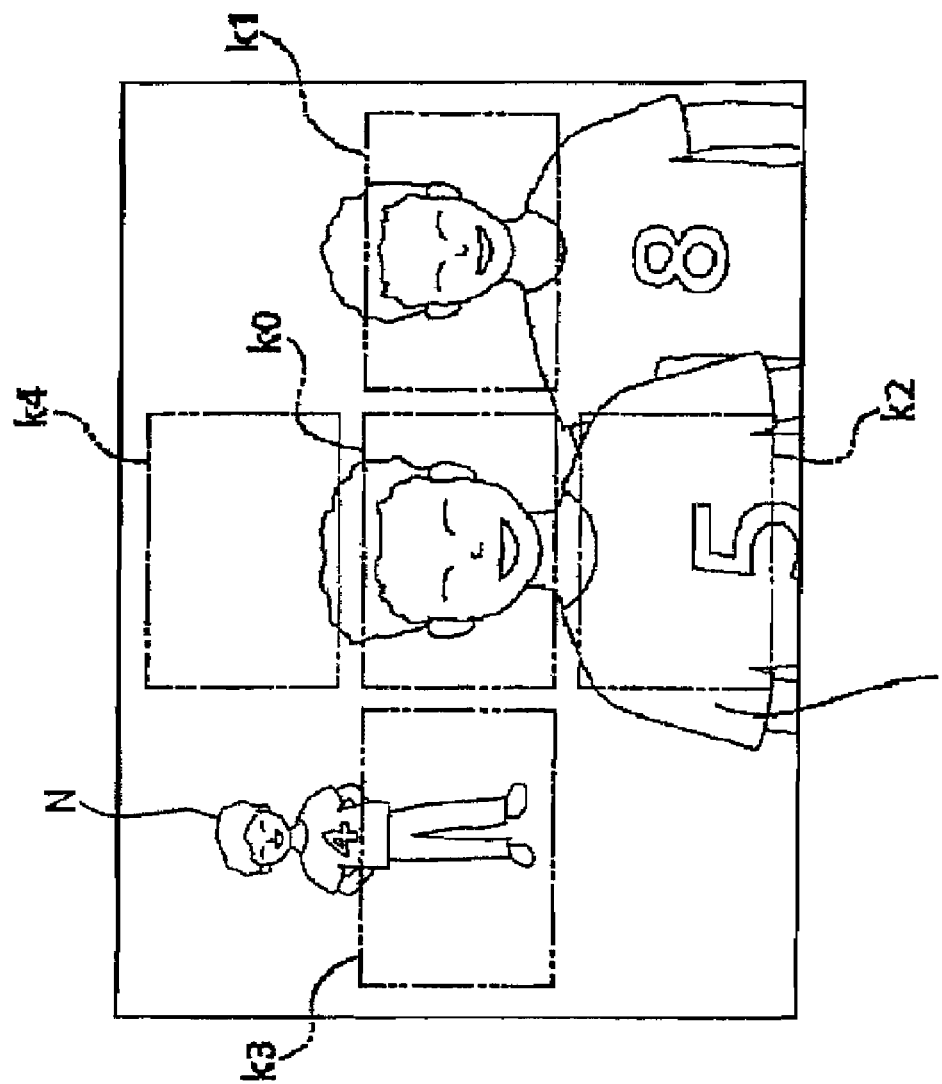
FIG. 48 illustrates an example of an image taken by a conventional camera module (described in JP 2002-330332 A).

FIGS. 46A and 46B illustrate an embodiment of an electronic apparatus according to the present invention. As shown in FIGS. 46A and 46B, a camera-equipped mobile phone 600 as an embodiment of the electronic apparatus according to the present invention includes a speaker 601, an antenna 602, a liquid crystal display 603, a key portion 605 and a microphone 606, and can be folded on a hinge portion 604. Also, a lens module 110 is built into a back side of the liquid crystal display 603 in the mobile phone 600 as shown in FIG. 46B, thus allowing shooting of still pictures and moving pictures.

It should be noted that the electronic apparatus according to the present invention can be embodied not only as the mobile phone but also as a vehicle-mounted camera, a digital camera or a camera-equipped PDA.

Although several embodiments of the present invention have been illustrated above, they are just examples. When putting the present invention into practice, various modifications can be made as follows.

For example, although the computed parallaxes are used as they are in the camera module according to Embodiments 1 to 5, they also may be limited suitably. Depending on lens characteristics, the image becomes unclear when the subject distance A is smaller than a certain value. Accordingly, by setting this value as the minimum value of the subject distance A, the maximum value of the parallax Δ can be determined. A parallax larger than this value may be ignored as being an error. Also, in this case, a value with the second smallest parallax evaluation value may be adopted as the parallax.

Furthermore, in the camera module according to Embodiments 1 to 5, the parallax is computed from the first imaging signal I1 (mainly indicating green) and the fourth imaging signal I4 (mainly indicating green). However, the present invention is not limited to this. For example, because a violet subject contains a smaller green component and larger blue and red components, the computation from the first imaging signal I1 (mainly indicating green) and the fourth imaging signal I4 (mainly indicating green) sometimes is not possible. In this case, the parallax also may be computed from the second imaging signal I2 (mainly indicating blue) and the third imaging signal I3 (mainly indicating red). Further, if the parallax cannot be computed from the first parallax signal I1 (mainly indicating green) and the fourth imaging signal I4 (mainly indicating green) and the parallax cannot be computed from the second imaging signal I2 (mainly indicating blue) and the third imaging signal I3 (mainly indicating red), then it is appropriate to consider that no parallactic influence is present and there is no parallax.

Also, when the camera module according to Embodiments 1 to 5 is mounted on a camera, the first to fourth imaging devices 123a to 123d are arranged so that the second imaging device 123a is located on an upper side at the time of shooting and the third imaging device 123c is located on a lower side, whereby the upper side becomes sensitive to blue and the lower side becomes sensitive to red. Consequently, it is possible to achieve a more natural color reproduction for landscape photographs.

Further, when the parallax evaluation value has two prominent maximum values, the parallax for the larger may be adopted. Two maximum values appear because such a block contains a subject and a background and the subject distance and the background distance are different. Since the subject distance is smaller than the background distance, the parallax of the subject is larger than that of the background. Here, by adopting the larger parallax, the parallactic influence of the subject, which affects an image quality directly, can be reduced, though the parallactic influence of the background cannot be reduced.

Also, in Embodiments 1 to 5, the imaging device 123 is constituted by the first imaging device 123a, the second imaging device 123b, the third imaging device 123c and the fourth imaging device 123d, and the imaging signal input portion 133 is constituted by the first imaging signal input portion 133a, the second imaging signal input portion 133b, the third imaging signal input portion 133c and the fourth imaging signal input portion 133d. However, it also may be possible to constitute the imaging device 123 by a single imaging device and form four images by the first to fourth lens portions 113a to 113d at different positions on the light-receiving surface of this imaging device. Further, the imaging signal input portion 133 also may be constituted by a single imaging signal input portion to which a signal from the single imaging device 123 is inputted. In this case, it is appropriate to select suitably regions from the data in the memory in the system control portions 131, 231, 331, 431 and 531 and use them as the first imaging signal I1, the second imaging signal I2, the third imaging signal I3 and the fourth imaging signal I4.

Moreover, although the sums of absolute difference such as Equations (4) and (59) are used as the parallax evaluation value Ri(k) in Embodiments 1 to 5, there is no limitation to this. For example, it also is possible to use the sum of the square of differences, the sum of the square of differences between a value obtained by subtracting an average in a block from the first imaging signal I1 and a value obtained by subtracting the average in the block from the fourth imaging signal I4, or a value obtained by dividing the sum of the square of differences between a value obtained by subtracting an average in a block from the first imaging signal I1 and a value obtained by subtracting the average in the block from the fourth imaging signal I4 by the square root of the sum of the square of the value obtained by subtracting the average in the block from the first imaging signal I1 and further by the square root of the sum of the square of the value obtained by subtracting the average in the block from the fourth imaging signal I4.

As the parallax evaluation value Ri(k), it also may be possible to use Equation (60) or the sum of results of multiplication of a difference between the first imaging signal I1 and the average in the block and a difference between the fourth imaging signal I4 and the average in the block. However, since the parallax evaluation value Ri(k) in Embodiments 1 to 5 decreases with an increase in the correlation (similarity), k giving the minimum value gives the parallax Δi as shown in FIG. 15. However, when using Equation (60) or the like, the value increases with an increase in the correlation (similarity), thus making it necessary to make suitable modifications such as using k giving the maximum value as the parallax Δi.

Also, in Embodiments 1 to 5, the first lens portion 113a, the second lens portion 113b, the third lens portion 113c and the fourth lens portion 113d are arranged so that a rectangle formed by connecting the centers of their optical axes is a square. However, there is no limitation to this. This rectangle also may have sides with different lengths in the x and y directions. In this case, suitable modifications are necessary, for example, when the parallax is computed in Steps S140 and S3240 and when the parallax correction is performed in Steps S151, S184, S250 and S3280. In other words, instead of using the same k for the x and y directions, k is changed so as to maintain the ratio between the lengths of the sides in the x and y directions of the above-mentioned rectangle.

Further, although the parallax is computed as an integer in Embodiments 1 to 5, there is no limitation to this. It also may be possible to compute the parallax to decimal places by a linear interpolation in Steps S140, S240 and S3240 and correct the respective parallax utilizing the linear interpolation in Steps S184, S250 and S3280.

Moreover, in Embodiments 1 to 5, it also may be possible to carry out the block division and the parallax correction while omitting the focusing control and including no actuator in the configuration. In the case of using a lens with a very large depth of focus, a slight error in the distance between the lens and the imaging device can be tolerated to a great extent. Thus, there is no need to operate the actuator.

Furthermore, in Embodiments 1 to 5, the first imaging signal I1 mainly indicates a green component, the second imaging signal I2 mainly indicates a blue component, the third imaging signal I3 mainly indicates a red component, the fourth imaging signal I4 mainly indicates a green component, and the parallax is sensed by comparing the first imaging signal I1 and the fourth imaging signal I4, thus carrying out the parallax correction. However, there is no limitation to this. For example, the designs of the lens and the color filters may be modified so that the first imaging signal I1 mainly indicates a green component, the second imaging signal I2 mainly indicates a green component, the third imaging signal I3 mainly indicates a blue component and the fourth imaging signal I4 mainly indicates a red component. In this case, it is necessary to modify the parallax evaluation function as per Equation (87) below so as to perform the parallax correction as per Equations (88), (89) and (90) below.

$$Ri(k)=\Sigma\Sigma|I1(x,y)-I2(x-k,y)| \tag{87}$$

$$G(x,y)=[I1(x,y)+I2(x-\Delta i,y)]/2 \tag{88}$$

$$B(x,y)=I3(x,y-\Delta i) \tag{89}$$

$$R(x,y)=I4(x-\Delta i,y-\Delta i) \tag{90}$$

It also may be possible to make modifications so that the first imaging signal I1 mainly indicates a green component, the second imaging signal I2 mainly indicates a blue component, the third imaging signal I3 mainly indicates a green component and the fourth imaging signal I4 mainly indicates a red component. In this case, it is necessary to modify the parallax evaluation function as per Equation (91) below so as to perform the parallax correction as per Equations (92), (93) and (94) below.

$$Ri(k)=\Sigma\Sigma|I1(x,y)-I3(x,y-k) \tag{91}$$

$$G(x,y)=[I1(x,y)+I3(x,y-\Delta i)]/2 \tag{92}$$

$$B(x,y)=I2(x-\Delta i,y) \tag{93}$$

$$R(x,y)=I4(x-\Delta i,y-\Delta i) \tag{94}$$

Further, although the four imaging regions are provided in a lattice pattern in Embodiments 1 to 5, there is no limitation to this. For example, modifications may be made so that the first to fourth imaging devices are aligned along a straight line, the first imaging signal I1 mainly indicates blue, the second imaging signal I2 mainly indicates green, the third imaging signal I3 mainly indicates green and the fourth imaging signal I4 mainly indicates red. In this case, it is necessary to modify the parallax evaluation function as per Equation (95) below so as to perform the parallax correction as per Equations (96), (97) and (98) below.

$$Ri(k)=|I2(x,y)-I3(x-k,y)| \tag{95}$$

$$G(x,y)=[I2(x,y)+I3(x-\Delta i,y)]/2 \tag{96}$$

$$B(x,y)=I1(x+\Delta i,y) \tag{97}$$

$$R(x,y)=I4(x-2*\Delta i,y) \tag{98}$$

Further, although the four imaging regions are provided in Embodiments 1 to 5, there is no limitation to this. For example, modifications may be made so that three imaging regions are provided, the first to third imaging devices are aligned along a straight line, the first imaging signal I1 mainly indicates blue, the second imaging signal I2 mainly indicates green and the third imaging signal I3 mainly indicates red. In this case, it is necessary to modify the parallax evaluation function as per Equations (99) and (100) below, create a green component G as per Equation (101) below, create a blue component B as per Equation (102) below by utilizing the parallax Δi computed using Equation (99) and create a red component R as per Equation (103) below by utilizing the parallax Δi computed using Equation (100) so as to perform the parallax correction. In addition, Equation (60) may be used instead of Equations (99) and (100).

$$Ri(k)=\Sigma\Sigma|I2(x,y)-I1(x+k,y) \tag{99}$$

$$Ri(k)=\Sigma\Sigma|I2(x,y)-I3(x-k,y)| \tag{100}$$

$$G(x,y)=I2(x,y) \tag{101}$$

$$B(x,y)=I1(x+\Delta i,y) \tag{102}$$

$$R(x,y)=I3(x-*\Delta i,y) \tag{103}$$

Alternatively, modifications may be made so that three imaging regions are provided, the second imaging device is arranged to the right of (at a position positive in the x axis with respect to) the first imaging device, the third imaging device is arranged below (at a position positive in the y axis with respect to) the first imaging device, the first imaging signal I1 mainly indicates green, the second imaging signal I2 mainly indicates blue and the third imaging signal I3 mainly indicates red. In this case, it is necessary to modify the parallax evaluation function as per Equations (104) and (105) below, create a green component G as per Equation (106) below, create a blue component B as per Equation (107) below by utilizing the parallax Δi computed using Equation (104) and create a red component R as per Equation (108) below by utilizing the parallax Δi computed using Equation (105) so as to perform the parallax correction. In addition, Equation (60) may be used instead of Equations (104) and (105).

$$Ri(k)=\Sigma\Sigma|I1(x,y)-I1(x-k,y)| \quad (104)$$

$$Ri(k)=\Sigma\Sigma|I1(x,y)-I3(x,y-k)| \quad (105)$$

$$G(x,y)=I1(x,y) \quad (106)$$

$$B(x,y)=I2(x-\Delta i,y) \quad (107)$$

$$R(x,y)=I3(x,y-\Delta i) \quad (108)$$

In the camera module according to Embodiment 1, Embodiments 3 to 5, the parallax correction is performed using the parallax Δi in the block. However, it also may be possible to determine a parallax Δ(x,y) for each pixel using the parallax Δi for each block and perform the parallax correction using this parallax Δ(x,y) for each pixel.

INDUSTRIAL APPLICABILITY

The camera module according to the present invention is a camera module that can be made smaller and thinner and has an automatic focusing function, and therefore, is useful for a mobile phone with a camera function, a digital still camera, a vehicle-mounted camera, a surveillance camera and the like.

The invention claimed is:

1. A camera module comprising:
a plurality of lens portions, each comprising at least one lens;
a plurality of imaging regions, provided in one-to-one correspondence with the plurality of lens portions, each comprising a light-receiving surface that is substantially orthogonal to an optical axis direction of its corresponding lens portion;
an imaging signal input portion to which a plurality of imaging signals outputted respectively from the plurality of imaging regions are inputted;
a block division portion for dividing at least one imaging signal of the plurality of imaging signals into a plurality of blocks;
a parallax computing portion for computing for each of the blocks a parallax between images formed respectively by the plurality of lens portions using the imaging signal;
a parallax correcting portion for correcting the plurality of imaging signals in each of the blocks based on the parallax of the respective blocks and performing an image synthesis of the corrected plurality of imaging signals; and
a parallax evaluation computing portion for computing for each of the plurality of blocks at least one parallax accuracy evaluation value indicating an accuracy of the parallax based on the imaging signal,
the parallax correcting portion determines for each of the plurality of blocks whether or not the block is to be divided into at least two based on the parallax accuracy evaluation value, divides a block determined to be divided, and corrects for each of the plurality of blocks the plurality of imaging signals based on the parallax and the parallax accuracy evaluation value and performs the image synthesis.

2. The camera module according to claim 1, wherein the block division portion divides the at least one imaging signal into the plurality of blocks by detecting outlines of a plurality of image regions from the at least one imaging signal and dividing the at least one imaging signal into the plurality of image regions by the outlines.

3. The camera module according to claim 2, wherein an outline parallax computing portion is added for computing an outline parallax, which is a parallax between the outlines, based on the imaging signal, and
the parallax computing portion computes for each of the blocks the parallax between the images formed respectively by the plurality of lens portions based on the outline parallax.

4. The camera module according to claim 1, wherein the block division portion divides the at least one imaging signal into a plurality of rectangular blocks.

5. The camera module according to claim 1, wherein the parallax evaluation value computing portion computes a first parallax accuracy evaluation value indicating how high a contrast is for each of the plurality of blocks based on at least one imaging signal of the plurality of imaging signals.

6. The camera module according to claim 1, wherein the parallax evaluation value computing portion computes a second parallax accuracy evaluation value indicating how much images formed respectively by at least two of the lens portions and images shifted therefrom by the parallax are correlated for each of the plurality of blocks using the imaging signal divided into the plurality of blocks.

7. The camera module according to claim 6, wherein, for each of the plurality of blocks, the parallax correcting portion divides this block into at least two when the second parallax accuracy evaluation value is small, and performs the image synthesis based on the parallax between the divided blocks in the block that has been divided.

8. The camera module according to claim 1, wherein the parallax evaluation value computing portion computes
a first parallax accuracy evaluation value indicating how high a contrast is for each of the plurality of blocks based on at least one imaging signal of the plurality of imaging signals, and
a second parallax accuracy evaluation value indicating how much images formed respectively by at least two of the lens portions and images shifted therefrom by the parallax are correlated for each of the plurality of blocks using the imaging signal divided into the plurality of blocks, and
for each of the plurality of blocks, the parallax correcting portion divides this block into at least two when the first parallax accuracy evaluation value is large and the second parallax accuracy evaluation value is small, and performs the image synthesis based on the parallax between the divided blocks in the block that has been divided.

9. The camera module according to claim 1, wherein the imaging signal input portion inputs the plurality of imaging signals for each of a plurality of fields, and
the parallax computing portion computes the parallax for each of the blocks in each of the plurality of fields.

10. The camera module according to claim 9, further comprising color filters that are provided in one-to-one correspondence with the plurality of lens portions and have filters of plural colors, wherein the filters of the same color are provided so as to correspond to at least two of the plurality of lens portions arranged in parallel with a scanning direction of the fields.

11. The camera module according to claim 1, further comprising another image storing portion for storing another image different from a taken image, wherein the parallax correcting portion combines the another image and an image obtained by correcting the imaging signal based on the parallax.

12. The camera module according to claim 11, wherein the parallax correcting portion performs combining so that a ratio of the image obtained by correcting the imaging signal increases and that of the another image decreases with an increase in the parallax.

13. An electronic apparatus comprising the camera module according to claim 1.

* * * * *